US006944513B1

(12) United States Patent
Tomomitsu et al.

(10) Patent No.: US 6,944,513 B1
(45) Date of Patent: Sep. 13, 2005

(54) CAD SYSTEM, CAD COOPERATIVE SYSTEM, CAD DATA MANAGING METHOD, AND STORAGE MEDIUM

(75) Inventors: Noboru Tomomitsu, Kawasaki (JP); Kazuo Tanaguchi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 812 days.

(21) Appl. No.: 09/658,692

(22) Filed: Sep. 8, 2000

(30) Foreign Application Priority Data

Sep. 14, 1999 (JP) .................................. 11-261208

(51) Int. Cl.$^7$ ............................................. G06F 19/00
(52) U.S. Cl. ...................... 700/98; 700/118; 700/182; 345/418
(58) Field of Search .............................. 700/90, 95, 96, 700/98, 182, 118, 163; 345/418–420

(56) References Cited

U.S. PATENT DOCUMENTS 5,701,403 A * 12/1997 Watanabe et al. ........... 345/419

FOREIGN PATENT DOCUMENTS

| JP | 04-195474 A | | 7/1992 | ........... G06F 15/60 |
| JP | 06348789 A | * | 12/1994 | |
| JP | 7-334534 | | 12/1995 | |
| JP | 10011490 A | * | 1/1998 | |

* cited by examiner

*Primary Examiner*—Jayprakash N. Gandhi
(74) *Attorney, Agent, or Firm*—Staas & Halsey LLP

(57) ABSTRACT

A CAD system and a CAD cooperative system maintain correspondence between a two-dimensional design plane and a three-dimensional design space (hereinafter referred to as a model), and between models for the same target. The correspondence between models is managed by an intra-model correspondence management unit, and the reference between models is managed by an inter-model reference management unit. Thus, there can be an interlocking operation between a two-dimensional design plane and a three-dimensional design space. furthermore, a three-dimensional reference can be automatically set for a three-dimensional design space to another model.

25 Claims, 48 Drawing Sheets

MODEL INFORMATION

MODEL REFERENCE INFORMATION

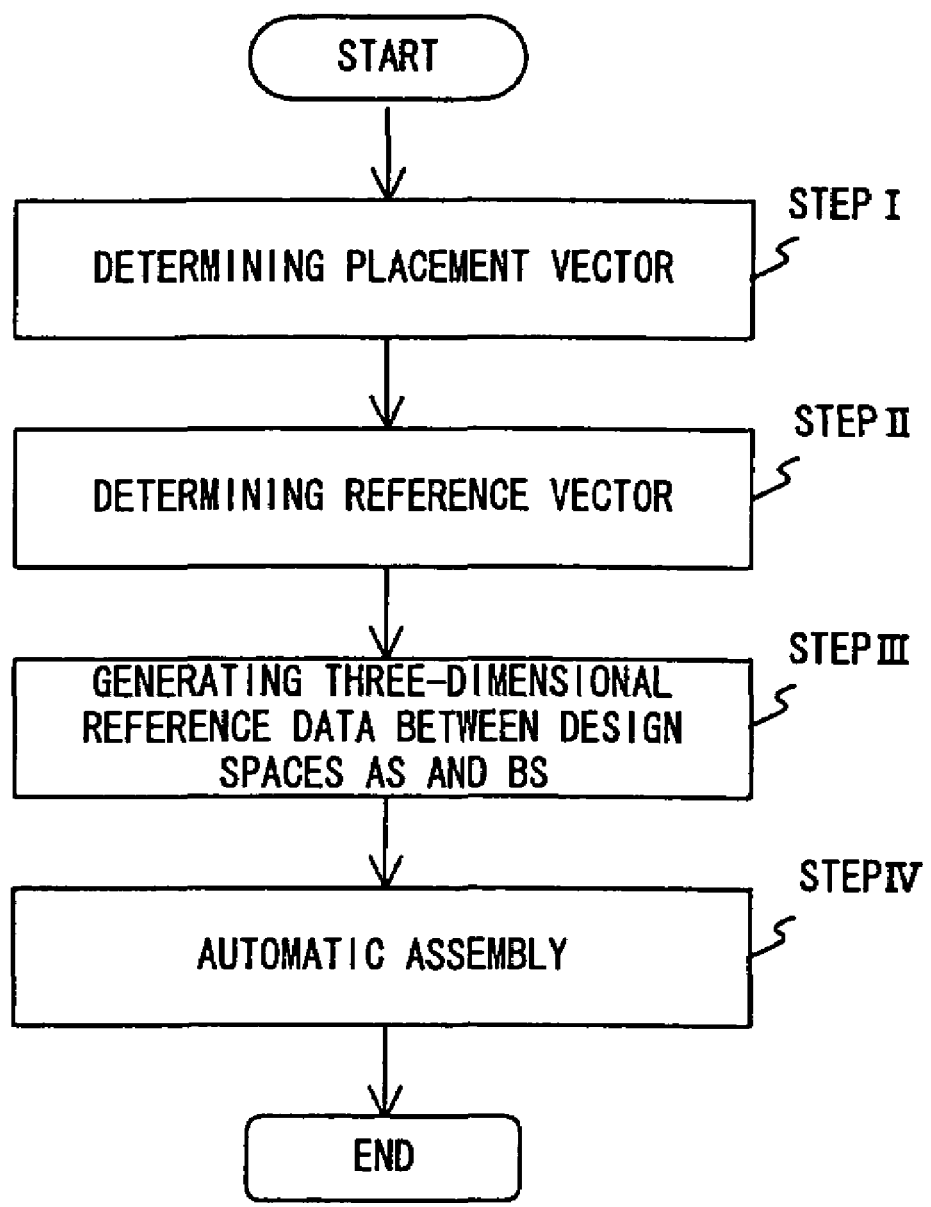
F I G. 7

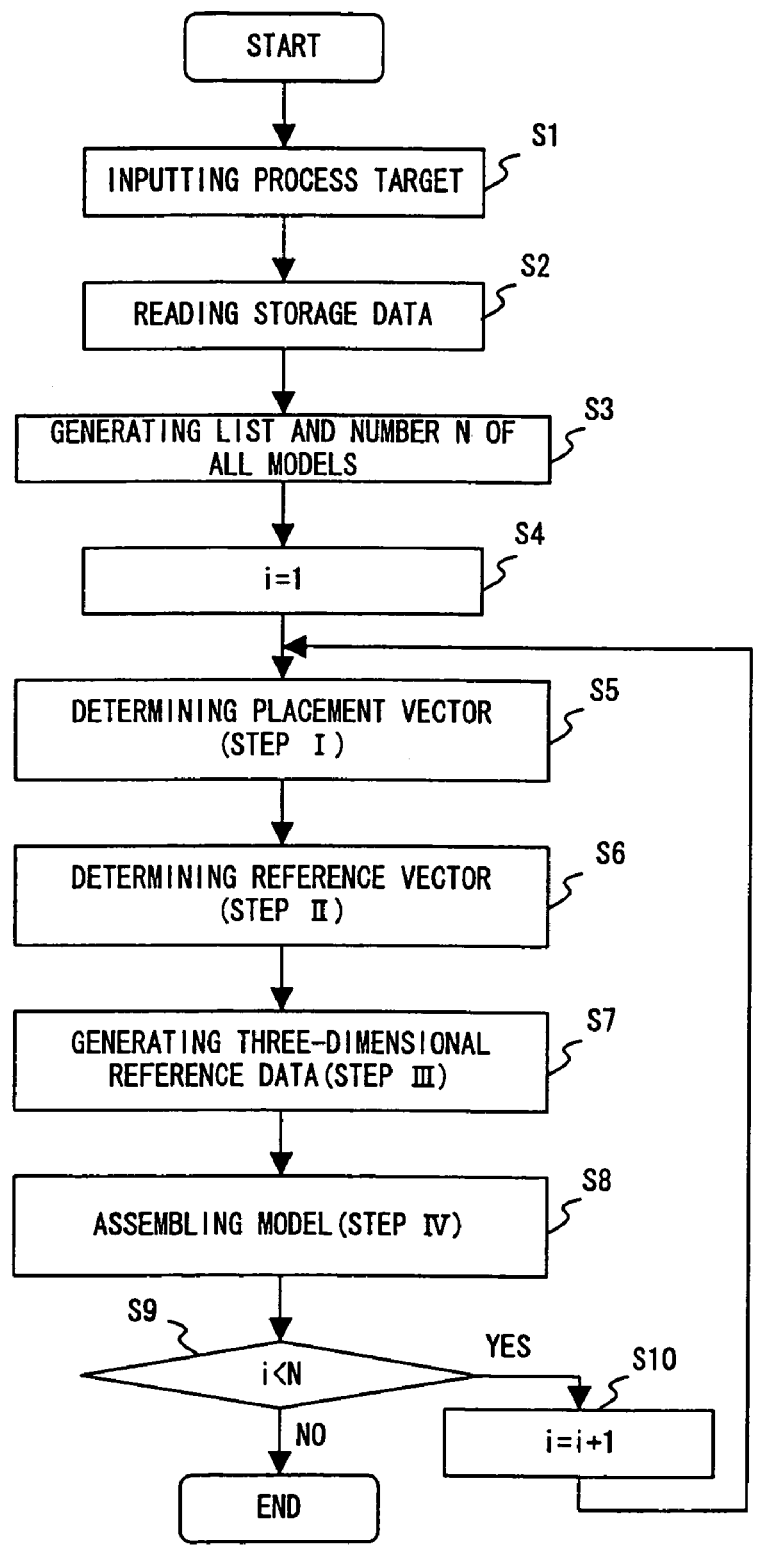
F I G. 9

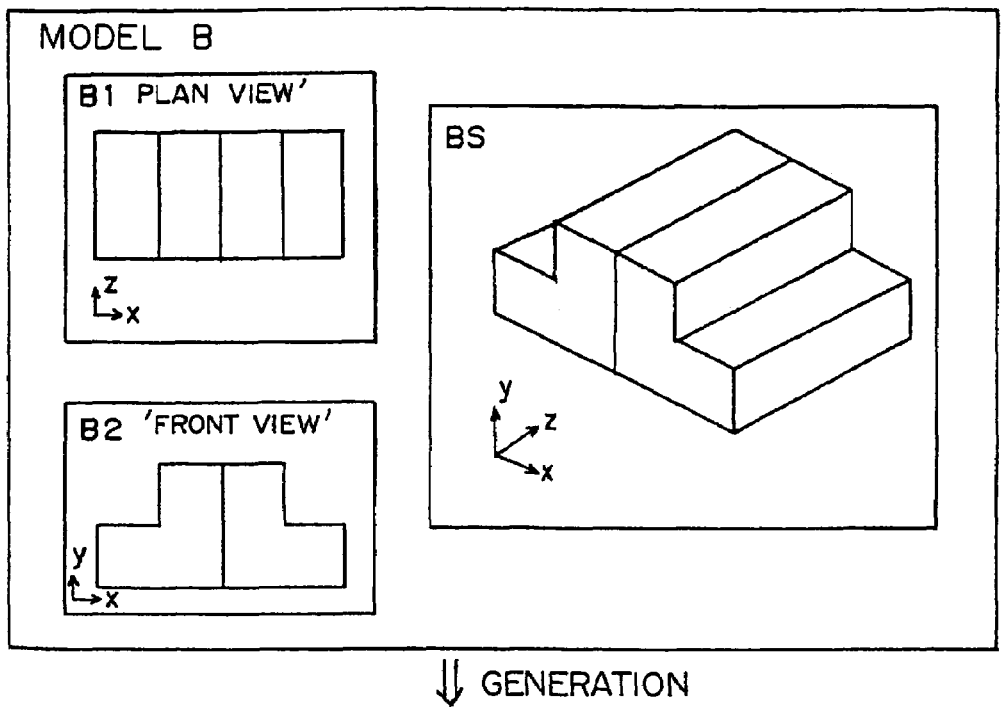
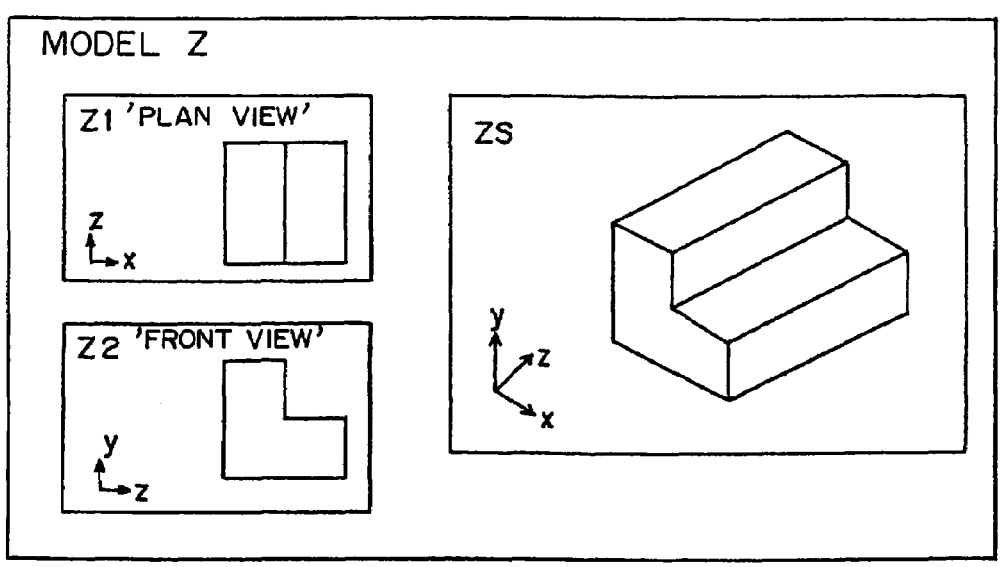
FIG. 15

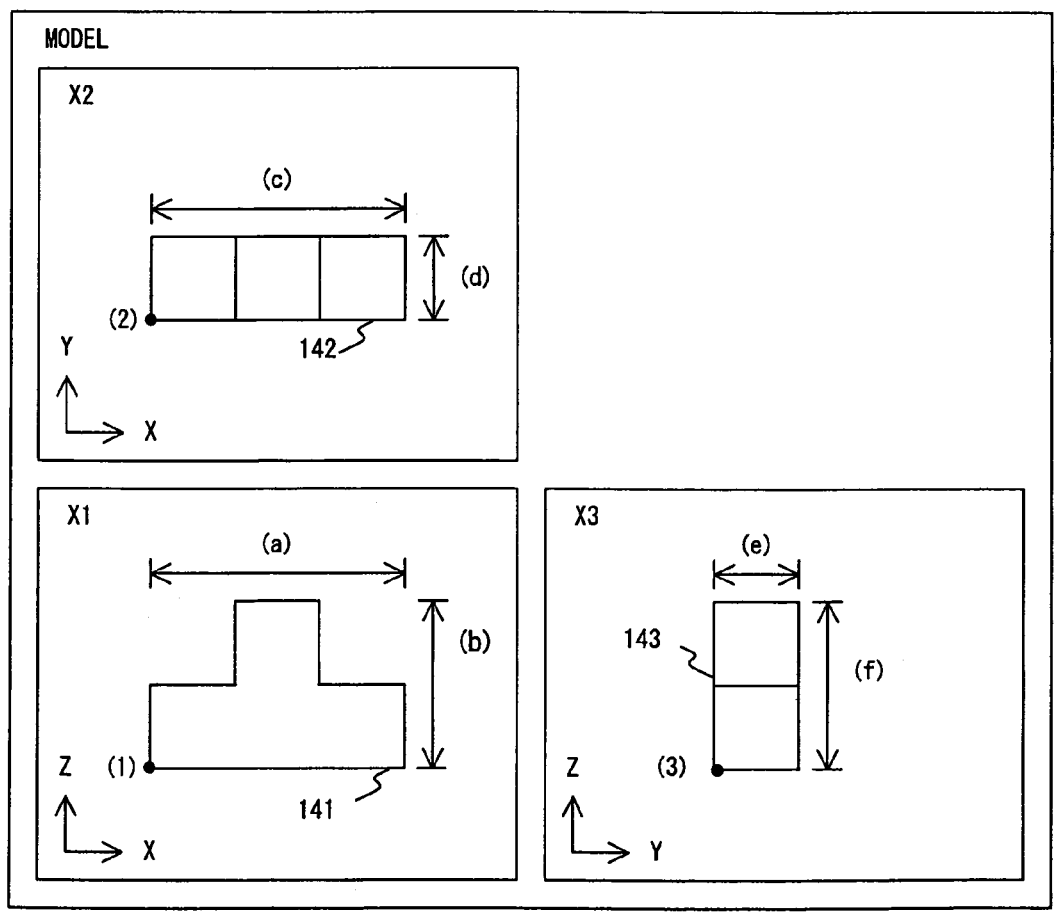
F I G. 16

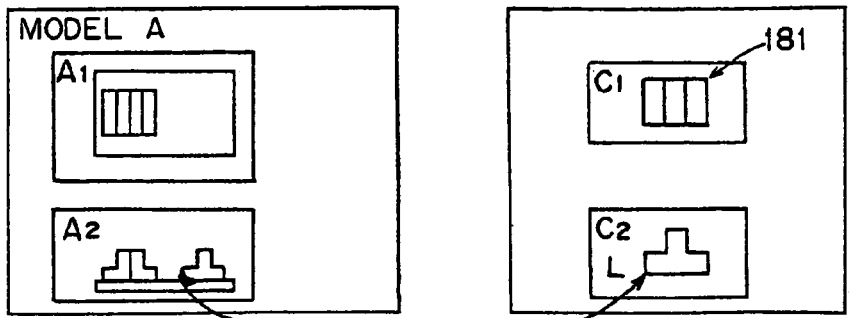
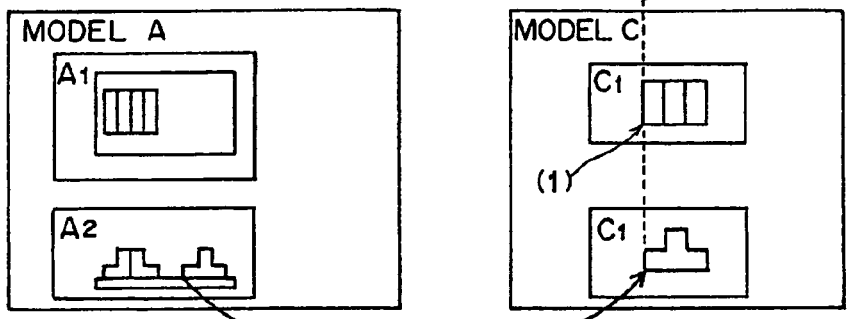
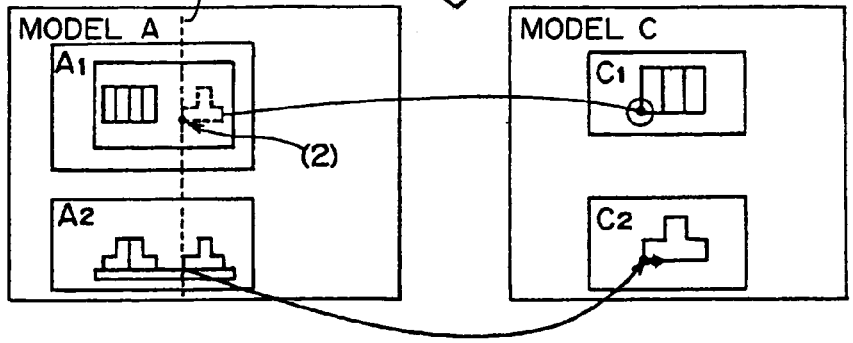
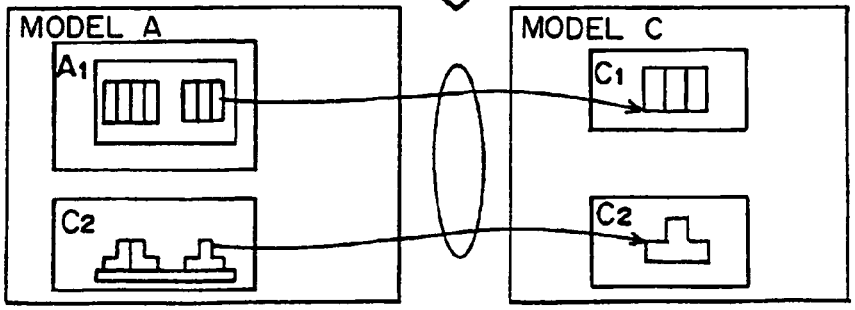
FIG. 20

MODEL FILE NAME

WORK PLANE DATA UNIT (PLANE NAME=「XY」, ID=1)

GRAPHIC DATA UNIT

| GRAPHIC ID | GRAPHIC INFORMATION |
|---|---|
| 1 | LINE: STARTING POINT, LENGTH, DIRECTION VECTOR |
| 2 | CIRCLE: CENTER, RADIUS |
| ∫ | |

SINGLE 2D PARTS STRUCTURE DATA UNIT

| PART ID | PLACEMENT POINT (X, Y) | PLACEMENT ANGLE | 2D REFERENCE INFORMATION ||| FILE NAME | PLANE DATA UNIT NAME |
| | | | MIRROR FLAG 1=MIRROR EXISTING 0=MIRROR NOT EXISTING | MIRROR AXIS || | |
| 1 | (20, 20) | 0° | 1/0 | $\alpha:(\alpha,\beta)\rightarrow(\alpha,-\beta)$ $\beta:(\alpha,\beta)\rightarrow(-\alpha,\beta)$ | $\alpha/\beta$ | PART FIGURE 1 | 'XY' |
| 2 | (40, 100) | 10° | 1/0 | | $\alpha/\beta$ | PART FIGURE 2 | 'XZ' |
| ∫ | | | | | | | |

F I G. 2 4

| MODEL FILE NAME | | | | |
|---|---|---|---|---|
| WORK PLANE DATA UNIT | | | | |
| GRAPHIC DATA UNIT | | | | |
| GRAPHIC ID | GRAPHIC INFORMATION | | | |
| 1 | | | | |
| 2 | | | | |
| ~ | | | | |

| SINGLE 3D PARTS DATA UNIT | | | | |
|---|---|---|---|---|
| PART ID | PLACEMENT POINT (X,Y,Z) | 3D REFERENCE INFORMATION ||| 
| | | FIRST AXIS | SECOND AXIS | FILE NAME |
| 1 | (0, 0, 0) | X AXIS (1, 0, 0) | Y AXIS (0, 1, 0) | PART FIGURE 10 |
| 2 | (15, 10, 10) | -Y AXIS (0, -1, 0) | -Z AXIS (0, 0, -1) | PART FIGURE 2 |
| ~ | | | | |

F I G. 2 5

COORDINATE CORRESPONDENCE TABLE

| PLANE ID | PLANE NAME | FIRST AXIS (α AXIS) | THREE-DIMENSIONAL COORDINATE AXIS VIEWED FROM EACH PLANE | CONVERSION EQUATION INTO 3D SPACE COORDINATE (CONVERSION MATRIX) |
|---|---|---|---|---|
| 1 | XY PLANE | X AXIS= (1, 0, 0) | Y ↑ → X | $\begin{bmatrix}x\\y\\z\end{bmatrix} = \alpha \begin{bmatrix}1\\0\\0\end{bmatrix} + \beta \begin{bmatrix}0\\1\\0\end{bmatrix}$ NORMAL VECTOR: Z AXIS = (0, 0, 1) |
| 2 | -ZY PLANE | -Z AXIS= (0, 0, -1) | Y ↑ Z ← | $\begin{bmatrix}x\\y\\z\end{bmatrix} = \alpha \begin{bmatrix}0\\0\\-1\end{bmatrix} + \beta \begin{bmatrix}0\\1\\0\end{bmatrix}$ NORMAL VECTOR: -X AXIS = (-1, 0, 0) |
| 3 | X-Z PLANE | X AXIS= (1, 0, 0) | → X ↓ Z | $\begin{bmatrix}x\\y\\z\end{bmatrix} = \alpha \begin{bmatrix}1\\0\\0\end{bmatrix} + \beta \begin{bmatrix}0\\0\\-1\end{bmatrix}$ NORMAL VECTOR: -Y AXIS = (0, -1, 0) |
| 4 | ZY PLANE | Z AXIS= (0, 0, 1) | Y ↑ → Z | $\begin{bmatrix}x\\y\\z\end{bmatrix} = \alpha \begin{bmatrix}0\\0\\1\end{bmatrix} + \beta \begin{bmatrix}0\\1\\0\end{bmatrix}$ NORMAL VECTOR: X AXIS = (1, 0, 0) |
| 5 | XZ PLANE | X AXIS= (1, 0, 0) | Z ↑ → X | $\begin{bmatrix}x\\y\\z\end{bmatrix} = \alpha \begin{bmatrix}1\\0\\0\end{bmatrix} + \beta \begin{bmatrix}0\\0\\1\end{bmatrix}$ NORMAL VECTOR: Y AXIS = (0, 1, 0) |
| 6 | -XY PLANE | -X AXIS= (-1, 0, 0) | Y ↑ X ← | $\begin{bmatrix}x\\y\\z\end{bmatrix} = \alpha \begin{bmatrix}-1\\0\\0\end{bmatrix} + \beta \begin{bmatrix}0\\1\\0\end{bmatrix}$ NORMAL VECTOR: -Z AXIS = (0, 0, -1) |

CONVERSION TABLE OF EACH PLANE
3D COORDINATE → 2D COORDINATE
(x, y, z)        (α, β)

$\begin{bmatrix}x\\y\\z\end{bmatrix} \rightarrow \begin{bmatrix}\alpha\\\beta\end{bmatrix} = \begin{bmatrix}x\\-z\end{bmatrix}$ $\begin{bmatrix}x\\y\\z\end{bmatrix} \rightarrow \begin{bmatrix}\alpha\\\beta\end{bmatrix} = \begin{bmatrix}z\\y\end{bmatrix}$ $\begin{bmatrix}x\\y\\z\end{bmatrix} \rightarrow \begin{bmatrix}\alpha\\\beta\end{bmatrix} = \begin{bmatrix}x\\y\end{bmatrix}$ $\begin{bmatrix}x\\y\\z\end{bmatrix} \rightarrow \begin{bmatrix}\alpha\\\beta\end{bmatrix} = \begin{bmatrix}-z\\y\end{bmatrix}$ $\begin{bmatrix}x\\y\\z\end{bmatrix} \rightarrow \begin{bmatrix}\alpha\\\beta\end{bmatrix} = \begin{bmatrix}-x\\y\end{bmatrix}$ $\begin{bmatrix}x\\y\\z\end{bmatrix} \rightarrow \begin{bmatrix}\alpha\\\beta\end{bmatrix} = \begin{bmatrix}x\\z\end{bmatrix}$ CONVERSION TABLE OF EACH PLANE
2D COORDINATE → 3D COORDINATE
(α, β)        (x, y, z)

$\begin{bmatrix}\alpha\\\beta\end{bmatrix} \rightarrow \begin{bmatrix}\alpha\\0\\-\beta\end{bmatrix}$ $\begin{bmatrix}\alpha\\\beta\end{bmatrix} \rightarrow \begin{bmatrix}0\\\beta\\-\alpha\end{bmatrix}$ $\begin{bmatrix}\alpha\\\beta\end{bmatrix} \rightarrow \begin{bmatrix}\alpha\\\beta\\0\end{bmatrix}$ $\begin{bmatrix}\alpha\\\beta\end{bmatrix} \rightarrow \begin{bmatrix}0\\\beta\\\alpha\end{bmatrix}$ $\begin{bmatrix}\alpha\\\beta\end{bmatrix} \rightarrow \begin{bmatrix}-\alpha\\\beta\\0\end{bmatrix}$ $\begin{bmatrix}\alpha\\\beta\end{bmatrix} \rightarrow \begin{bmatrix}\alpha\\0\\\beta\end{bmatrix}$

FIG. 28

PARENT FIGURE

FIG. 34

| ASSEMBLY MANAGEMENT TABLE ||
|---|---|
| NUMBER OF MODELS=N ||
| MODEL ID | MODEL NAME |
| 1 | TOTAL NUMBER OF FIGURE SETS |
| 2 | UNIT FIGURE 1 |
| ⋮ | ⋮ |
| N | PART FIGURE 10 |

FIG. 35

| ORDER ID | PARENT MODEL ID | PLACED CHILD MODEL ID | NUMBER OF PLACED MODELS | TERMINAL PROCESS FLAG |
|---|---|---|---|---|
| A | 1 | 2, 3, 4, | 3 | 0 |
| B | 2 | 5, 6 | 2 | 0 |
| C | 3 | 7, 8 | 2 | 1 |
| D | 4 | 9, 10 | 2 | 0 |
| E | 5 | 11, 12 | 2 | 1 |
| F | 6 | 13 | 1 | 1 |
| G | 9 | 14 | 1 | 1 |
| H | 10 | 15, 16 | 2 | 0 |
| I | 15 | 17 | 1 | 1 |

FIG. 36

| TERMINAL MODEL TABLE | | | | | | | | |
|---|---|---|---|---|---|---|---|---|
| NUMBER OF TERMINAL MODELS = N | | | | | | | | |
| NUMBER | 1 | 2 | 3 | 4 | 5 | 6 | 7 | 8 |
| MODEL ID | 7 | 8 | 11 | 12 | 13 | 14 | 16 | 17 |

F I G. 3 7

2D, 3D PARTS STRUCTURE CORRESPONDENCE TABLE

PARENTAGE PROCESS ID

CHILD MODEL ID

VIEW INTERLOCKING 2D PARTS STRUCTURE DATA UNIT

NUMBER OF PLACED PLANE ID = N

| ID | PARENT FIGURE PLACED PLANE ID | CHILD FIGURE PLACED PLANE ID |
|---|---|---|
| 1 | XY (=1) | X-Z (=3) |
| ⋮ | | |
| N | | |

3D SPACE PLACEMENT FLAG

1 = REFERENCE SET, 0 = REFERENCE NOT SET

FIG. 38

PRIOR PARENT HOLDING TABLE

| PARENTAGE PROCESS ID |               |            |
|----------------------|---------------|------------|
| NUMBER OF CHILD MODELS |             |            |
| ID                   | CHILD MODEL ID | CHECK FLAG |
| 1                    | 5             | 1          |
| 2                    | 6             | 0          |

FIG. 39

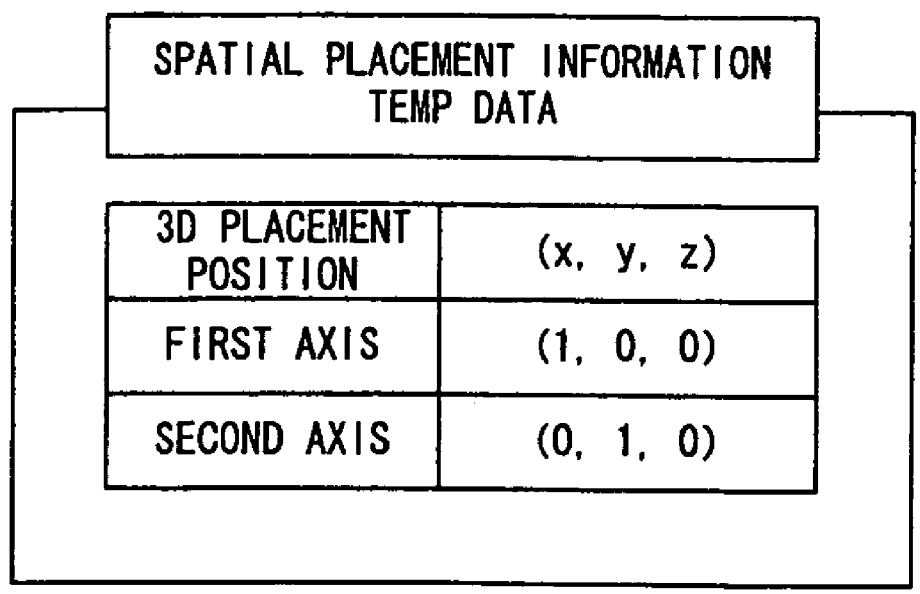
F I G. 40

PARALLEL PLANE MANAGEMENT TABLE

| COMBINATION ID | PLANE 1 | PLANE 2 |
|---|---|---|
| 1 | 1 | 6 |
| 2 | 2 | 4 |
| 3 | 3 | 5 |

FIG. 41

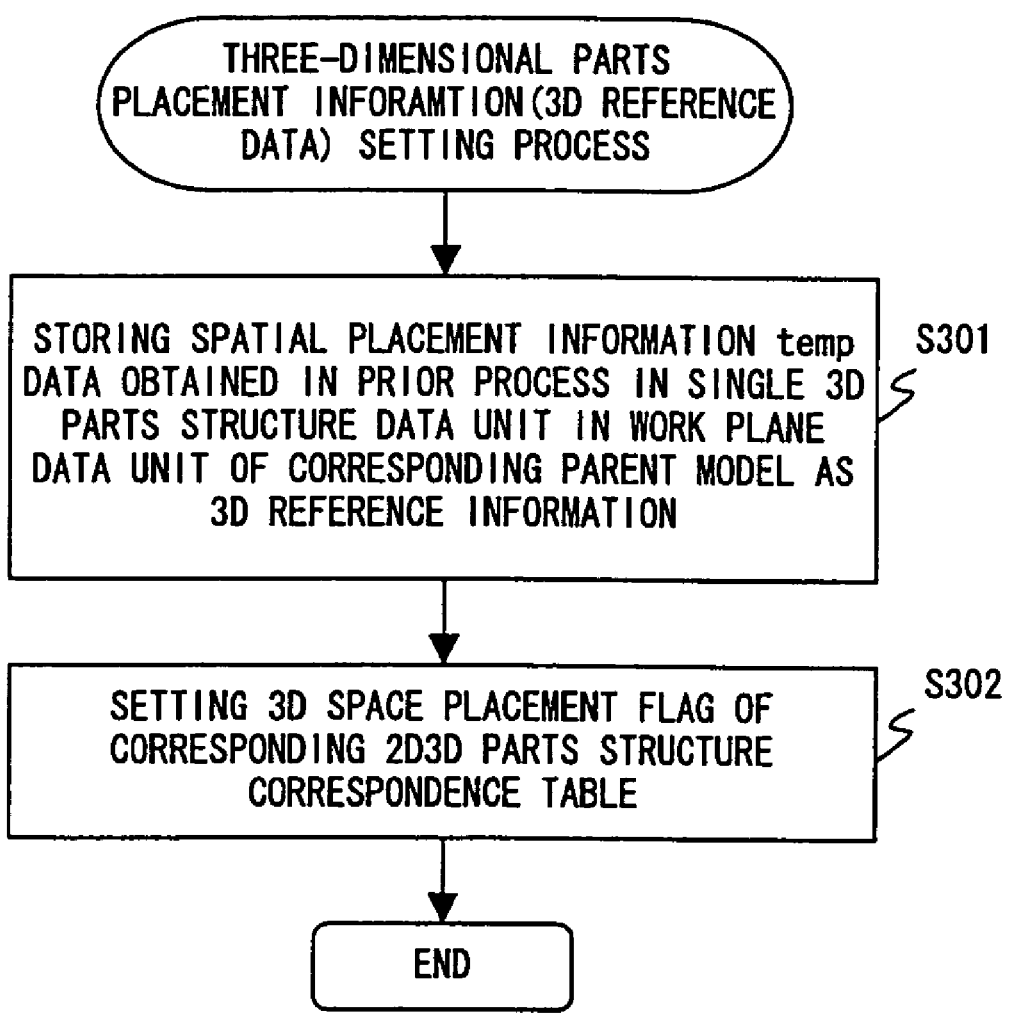
F I G. 4 5

CAD SYSTEM, CAD COOPERATIVE SYSTEM, CAD DATA MANAGING METHOD, AND STORAGE MEDIUM

BACKGROUND OF THE INVENTION

1. Field of the Invention

The present invention relates to a graphic process device such as a CAD system, etc. and a program storage medium storing a program used to realize the graphic process device, and more specifically to a technology of automatically assembling a three-dimensional model, and forming the correspondence among two- and three-dimensional data of a designed plane/space (hereinafter referred to as 'view').

2. Description of the Related Art

Recently, common machines and buildings are designed by the CAD system from the step of drawing figures using a drafter.

A two-dimensional CAD has been developed as an electronic function of drawing figures which have conventionally been drawn by a drafter (the two-dimensional CAD in the present invention contains an application for drawing the shape of an object referred to as a drawing tool in addition to a common two-dimensional CAD). The designing process by the two-dimensional CAD is performed while a line drawing process is performed on a two-dimensional plane such as a 3-view figure, etc. When a designing process is performed on the two-dimensional plane, the shape of a part of a unit and the three-dimensional partial placement position are represented separately by a plurality of figures (plane figures) such as a front view, a side view, a sectional view, etc. Therefore, there can be the inconsistent representation of a three-dimensional geometric shape. As a result, the designing process starts with an important portion (important parts and figures) with some parts remaining obscure at the initial stage of the designing process, and the process is gradually performed on detailed portions for consistency. Thus, a flexible designing process can be performed, and the process is frequently adopted.

Figures of machines, etc. come in various sizes such as figures of basic parts, a set of figures used for a combination of parts, figures showing final products, etc. In the two-dimensional CAD, these figures sequentially become large in size by referring to figures of smaller parts.

FIG. 1 shows the correspondence of data in the conventional CAD.

In FIG. 1, views A1, A2, B1, and B2 show the design plane of two-dimensional data, and show the plan view (A1 and B1) and the front view (A2 and B2) of the units A and B. Each of the design planes is configured by referring to other smaller design planes, and the data is hierarchically structured. The data is configured by the link of the data of configuring a design plane of a set of referred-from and referred-to units, and the data of the parts in the smallest unit. For example, the view A1 is configured by the link to the data of the views B1 of a child unit B1 and C1.

With the proceeding of a designing process on a two-dimensional design plane, a number of editing operations are performed on the placement positions and the shapes of common parts represented in a plurality of figures. However, these editing operations for related process cannot be performed over a plurality of views, and they are limited in improving the design quality and efficiency.

As shown in FIG. 1, in the views of the same unit, there is no information about the correspondence between the two-dimensional design plane A1 and the two-dimensional design plane A2, but the data is stored as independent in the hierarchical structure. The data of each view is stored in the respective storage files such as a front view, a plan view, etc.

The two-dimensional CAD can have the function of generating a shape of a projection line, etc. as the support function of setting the correspondence between views of a unit, but the function cannot edit the shape over a plurality of views. For example, since the structure of one part cannot be recognized over plural views, graphic data cannot be directly used, but ancillary data has to be generated by a user drawing a figure using a projection line while referring to the views, switching the views, and amending the positions and shapes of the parts to make amendments not only to one view but also to other views when the positions and shapes of a part are amended over a plurality of views.

There has been a system of a hierarchical structure (parentage) of data having a parts structure. However, since there is no structure in which data of each view is related to each other for one unit, each view has an independent hierarchical data structure as shown in FIG. 1. Therefore, when placement positions are amended or a hierarchical structure is generated or changed in one view, corresponding amending processes are to be made to the data of other views, thereby requiring troublesome operations.

In addition, since the three-dimensional CAD for processing a three-dimensional shape of each part or unit as a three-dimensional model can generate a three-dimensionally consistent shape, the resultant design quality can be improved. However, a complicated and intensive process is required to generate and edit (modeling). a three-dimensional model.

A three-dimensional design space AS and BS shown in FIG. 1 indicates the three-dimensional work space of the units A and B. For a simple configuration, two-dimensional data is directly converted into the three-dimensional data. However, when a set of figures are processed for a unit formed by several number of parts, a three-dimensional model in a three-dimensional work space is generated by the designer sequentially assembling a three-dimensional model of the smallest part. For example, a three-dimensional model in a three-dimensional design space AS is generated by manually generating a three-dimensional model BS of the unit B after determining the placement position while checking the consistency of the three-dimensional models DS and ES of the units D and E in the three-dimensional work space, and then combining the three-dimensional model of the unit B with the three-dimensional model CS of the unit C on the three-dimensional work space. In assembling parts, three-dimensional parts have to be placed one by one in the three-dimensional space while setting the conditions for matching in plane, point, axis, etc., thereby requiring a very intensive process when a large three-dimensional parts are assembled. In the example shown in FIG. 1, the number of parts is small, but a set of figures in an actual case may require several thousand parts for which very complicated and intensive operations are performed.

In the designing process performed using the three-dimensional model, parts can be assembled at product level or unit level, and the interference between parts can be confirmed, thereby improving the efficiency in designing (modeling) in part units. However, since the procedure of generating a model indicating the shape of a part is much complicated, and since a consistent shape in a plane view such as a front view, a side view, etc., a designing process for a machine at a designing stage of a set of figures and unit figures in which a plurality of units are simultaneously designed, a modeling process performed in a complicated procedure lowers the design efficiency.

The two-dimensional/three-dimensional cooperative CAD for processing both two-dimensional and three-dimensional data in cooperation has been developed based on the idea of efficiently performing a designing process with the two-dimensional CAD capable of flexibly performing a designing process as necessary or a three-dimensional CAD capable of generating consistent data adopted as necessary to solve the above mentioned problems.

However, the current two-dimensional/three-dimensional cooperative CAD does not have the system of generating three-dimensional data used in the three-dimensional CAD by using two-dimensional data used in the two-dimensional CAD, or the system of having two-dimensional data cooperatively used with the three-dimensional data at the parts structure level. Therefore, the cooperation realized by the current two-dimensional/three-dimensional cooperative CAD is only the cooperation system in which non-structured two-dimensional data is transferred to a three-dimensional CAD. Therefore, the current two-dimensional/three-dimensional cooperative CAD is realized only cooperation that the two-dimensional data in the sectional shape for generating three-dimensional data is transferred from a two-dimensional CAD system to a three-dimensional CAD system, two-dimensional data is transferred to a three-dimensional CAD system for using the data as reference data for determining an placement position, and three-dimensional data is developed on a two-dimensional work plane (such as a front view, a side view, or a sectional view, etc.).

Therefore, although there is electronic data configured using three-dimensional data to assemble a three-dimensional part such as a set of generated figures and/or unit figures, a designer cannot directly utilize this electronic data. Therefore, when a three-dimensional model is generated, the designer displays the data on the screen, assembles them into a three-dimensional part while viewing the screen, or fetches the information about one view to place and move three-dimensional parts one by one.

In addition, during the designing process, a two-dimensional design plane is frequently switched into a three-dimensional design space or vice versa for efficiency, but actually, only the two-dimensional CAD, or the three-dimensional CAD for a detailed designing part is used at the designing stage.

Thus, the conventional two-dimensional CAD, three-dimensional CAD, and two-dimensional cooperative CAD have the following problems.

(1) In the conventional two-dimensional/three-dimensional CAD, when a three-dimensional model is generated based on a set of views or a product figures of a certain scale, three-dimensional data is generated at each part figure level independent of a two-dimensional assembly figures. Then, the designer has to assemble the data in the three-dimensional design space.

(2) A plurality of two-dimensional design planes and three-dimensional design spaces are used for one part, unit, or assembly state. However, the current two-dimensional/three-dimensional CAD does not define the three-dimensional space correspondence for each two-dimensional figure. For example, if each of the three views is individually generated, the name of a view such as a front view, a side view, etc., refers only to the name of a data storage plane, but does not refer to the correspondence between two-dimensional figures such as three views, etc., or between a two-dimensional figure and a three-dimensional model. Furthermore, when a set of three-dimensional figures are generated, although there are corresponding electronic data such as a corresponding three-dimensional figure, etc., they can only be used as a display reference as reference data, and can not be used directly for assembling a three-dimensional part.

(3) Since there is no correspondence between a two-dimensional design plane and a three-dimensional design space, it is difficult of impossible to frequently switching between the two-dimensional design plane and the three-dimensional design space as necessary during the designing process.

(4) In the three-dimensional CAD, it is a troublesome process to perform an arranging operation on a three-dimensional part.

(5) The data of a parts figure can be placed in an assembly figure, but there is no system of recognizing each of the two-dimensional plan view and the three-dimensional model as belonging to one part. Therefore, it is not possible to know how far the influence of figure elements representing one part or unit reaches. Accordingly, the three-dimensional consistency in the correspondence about part position, etc. cannot be managed.

SUMMARY OF THE INVENTION

Based on the above mentioned problems, the present invention aims at providing a two-dimensional CAD system, a three-dimensional CAD system, a two-dimensional/three-dimensional cooperative CAD system, a cooperative system for realizing the cooperation between CADs, a cooperating method, and a program storage medium for performing the following functions (a) through (e) below.

(a) to provide a system for setting the correspondence among a plurality of two-dimensional figures and three-dimensional models for the same part or unit.

(b) to provide a system of interlocking the edited contents in a two-dimensional design plane and a three-dimensional design space to another two-dimensional design plane and three-dimensional design space according to the correspondence among two-dimensional design planes and three-dimensional design spaces for the same part or unit, and the information about references.

(c) to provide a system of assigning a spatial attribute at a part level to a two-dimensional figure such as a front view, a side view, etc.

(d) to provide an outline for processing plural pieces of plane data such as a front view, a side view, etc. as a unit when other figure data is referred to.

(e) to provide a system for automatically assemble a unit in a three-dimensional shape by generating a spatial correspondence in a three-dimensional shape based on the spatial correspondence of an assembly figure and a part figure generated from the two-dimensional design plane.

The present invention is based on the CAD system for processing a two-dimensional design plane/three-dimensional design space configured by referring to a two-dimensional design plane/three-dimensional design space.

The CAD system according to the present invention includes an inter-model reference management unit and an intra-model correspondence management unit.

The intra-model correspondence management unit manages the correspondence between a two-dimensional design plane and a three-dimensional design space for the same target. The inter-model reference management unit manages the reference information between models configured by a two-dimensional design plane and a three-dimensional design space for the same target.

When one of the two-dimensional references or the three-dimensional references between the models is operated, the inter-model reference management unit operates another two-dimensional reference or three-dimensional reference between the models for the above mentioned operation. Thus, the operation model in a two-dimensional design plane/three-dimensional design space can be interlocked with another two-dimensional design plane/three-dimensional design space or another model. And a plurality of two-dimensional design planes and/or three-dimensional design spaces belonging to the model can be specified to be edited based on the correspondence in the model.

In addition, the CAD system can further include an automatic assembly unit. The automatic assembly unit generates a three-dimensional reference between the three-dimensional design space of a first model and the three-dimensional design space of a second model from the two-dimensional reference of a plurality of two-dimensional design planes belonging to the first model to the two-dimensional design plane belonging to the second model, and the correspondence in the first model and the correspondence in the second model. In addition, the automatic assembly unit automatically assembles a three-dimensional design space belonging to the above mentioned model using the two-dimensional reference of a plurality of two-dimensional design planes belonging to the same model and the correspondence in the model. The automatic assembly unit automatically assembles a three-dimensional design space having the correspondence in the model and the reference information between the correspondence in the model and the reference information to another model.

In addition, the present invention includes not only a CAD system, but also a cooperative system for cooperatively processing graphic data between the two-dimensional CAD and the three-dimensional CAD, a CAD data managing method, a program storage medium.

According to the present invention, a three-dimensional design space with another model can be automatically set. Therefore, a three-dimensional design space configured by a plurality of elements can be automatically assembled. Furthermore, the three-dimensional design space has the correspondence with the two-dimensional design plane in the same model and the three-dimensional reference with another model. As a result, the operation in a two-dimensional design plane/three-dimensional design space can be reflected by another two-dimensional design plane/three-dimensional design space in the model or another model.

BRIEF DESCRIPTION OF THE DRAWINGS

FIG. 7 is a flowchart of the process flow of automatically generating a three-dimensional reference;

FIG. 9 is a flowchart of the process of generating a three-dimensional reference and a three-dimensional model;

FIG. 15 shows the process of inheriting a spatial attribute in each of the two-dimensional design planes in a new model generating process;

FIG. 16 shows an example of a guide;

FIG. 20 shows the process flow of the CASE 2;

FIG. 24 shows an example of a configuration of the work plane data unit;

FIG. 25 shows an example of a configuration of the work space data unit;

FIG. 28 shows an example of a coordinate correspondence table;

FIG. 34 shows a three-dimensional conversion matrix table corresponding to a two-dimensional design plane pattern;

FIG. 35 shows an example of the configuration of an assembly management table;

FIG. 36 shows an example of the configuration of a parentage process table;

FIG. 37 shows an example of the configuration of an terminal model table;

FIG. 38 shows an example of the configuration of a 2D3D parts structure correspondence table;

FIG. 39 shows an example of a prior parent holding table;

FIG. 40 shows an example of spatial placement information temp data;

FIG. 41 shows an example of a parallel plane management table;

FIG. 45 is a flowchart of the three-dimensional parts placement information setting process;

DESCRIPTION OF THE PREFERRED EMBODIMENTS

Figure 2:
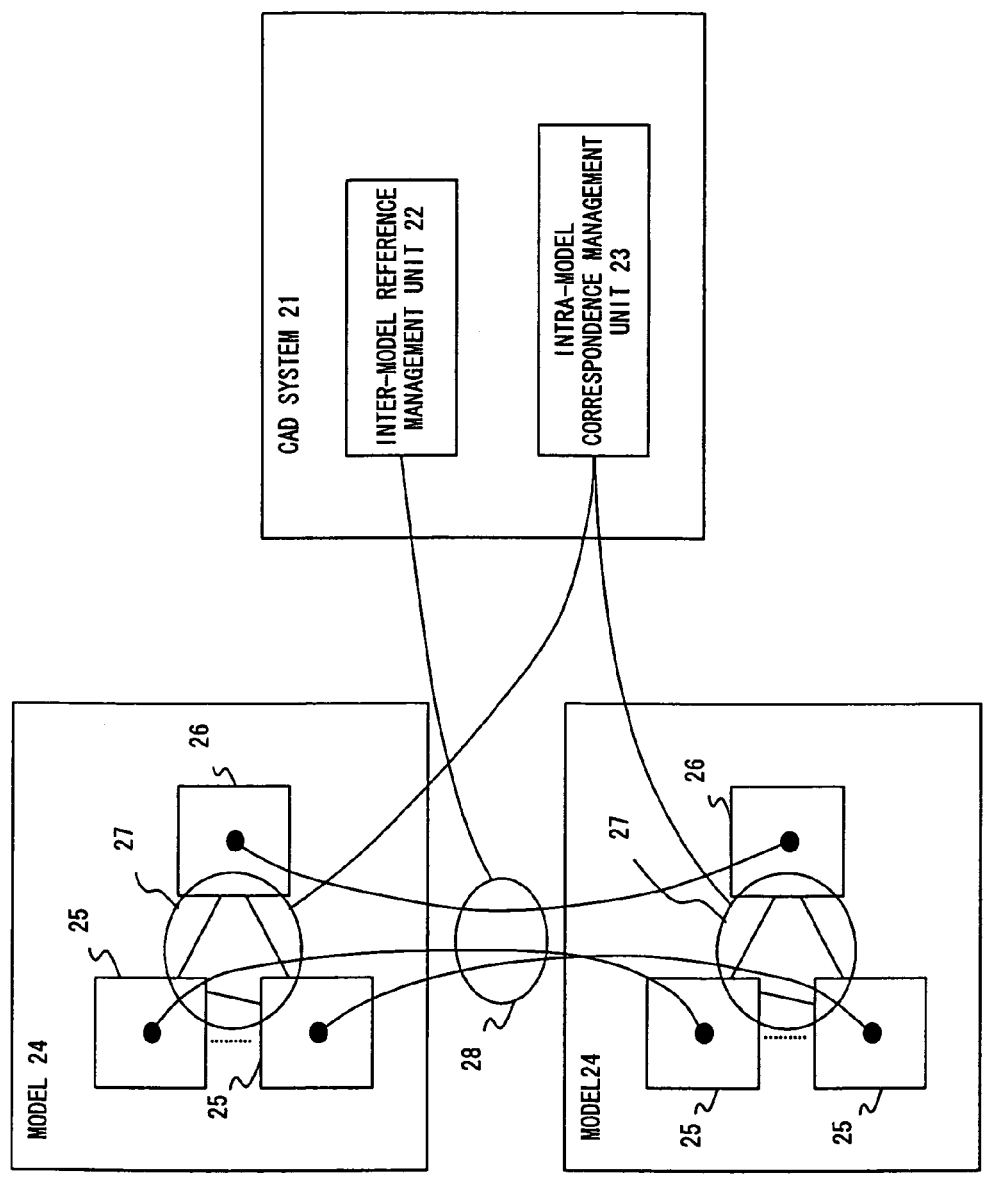
FIG. 2 shows the principle of the CAD system.

FIG. 2 shows the CAD system according to an embodiment of the present invention.

The present embodiment is based on a CAD system 21 for processing a two-dimensional design plane/three-dimensional design space configured by referring to a two-dimensional design plane/three-dimensional design space 26.

The CAD system 21 comprises an inter-model reference management unit 22 and an intra-model correspondence management unit 23.

The intra-model correspondence management unit 23 manages a correspondence 27 between the two-dimensional design plane 25 and the three-dimensional design space 26 for the same target.

The inter-model reference management unit 22 manages reference information 28 between models 24 configured by the two-dimensional design plane and the three-dimensional design space for the same target.

In this specification, a model is a unit and refers to all design planes (two-dimensional design plane/three-dimensional design space) for the same target such as a part, a unit, etc. Furthermore, a two-dimensional reference refers to a hierarchical reference between two-dimensional design planes to another model, a three-dimensional reference refers to a reference between three-dimensional design spaces, and an inter-model reference refers to a two-dimensional reference and a three-dimensional reference between models. A work plane/space refers to the design plane/space of a model to be processed in a designing operation.

When one of the two-dimensional reference or the three-dimensional reference between the models 24 is operated, the inter-model reference management unit 22 operates another two-dimensional reference and three-dimensional reference between the models corresponding to the above mentioned operation. Thus, the operation in a two-dimensional design plane/three-dimensional design space or the operation in a model can be interlocked with another two-dimensional design plane/three-dimensional design space or another model.

The CAD system 21 can further comprise an automatic assembly unit. The automatic assembly unit generates a three-dimensional reference between the three-dimensional design space 26 of the first model and the three-dimensional design space 26 of the second model from the two-dimensional reference of a plurality of two-dimensional design planes 25 belonging to the first model to the two-dimensional design plane 25 belonging to the second model, and the correspondence 27 of the first model and the correspondence 27 in the second model. The automatic assembly unit automatically assembles the correspondence 27 belonging to the same model 24 using the two-dimensional reference of a plurality of two-dimensional design planes 25 belonging to the same model 24 and the correspondence 27 in the model 24. Using the automatic assembly unit, the three-dimensional design space 26 having the correspondence 27 in a model and the reference information 28 to another model.

The present invention not only includes a CAD system, but also a cooperative system for performing a cooperative process on graphic data between the two-dimensional CAD and the three-dimensional CAD, a CAD data managing method, and a program storage medium.

According to the CAD system of the present embodiment, a three-dimensional reference with another model can be automatically set. Therefore, a three-dimensional design space having a plurality of elements can be automatically assembled. The three-dimensional design space has the correspondence with a two-dimensional design plane in the same model and a three-dimensional reference with another model. Therefore, an operation in a two-dimensional design plane/three-dimensional design space can be reflected in another two-dimensional design plane/three-dimensional design space in a model or in another model.

FIG. 3 shows the configuration of the data for each model in a CAD system according to the present embodiment.

Figure 3A:
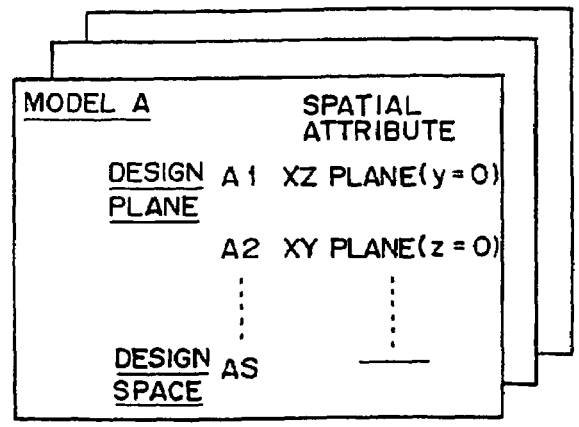
FIGS. 3A and 3B show the configuration of the data for each of the design planes in the CAD system.
Figure 3B:
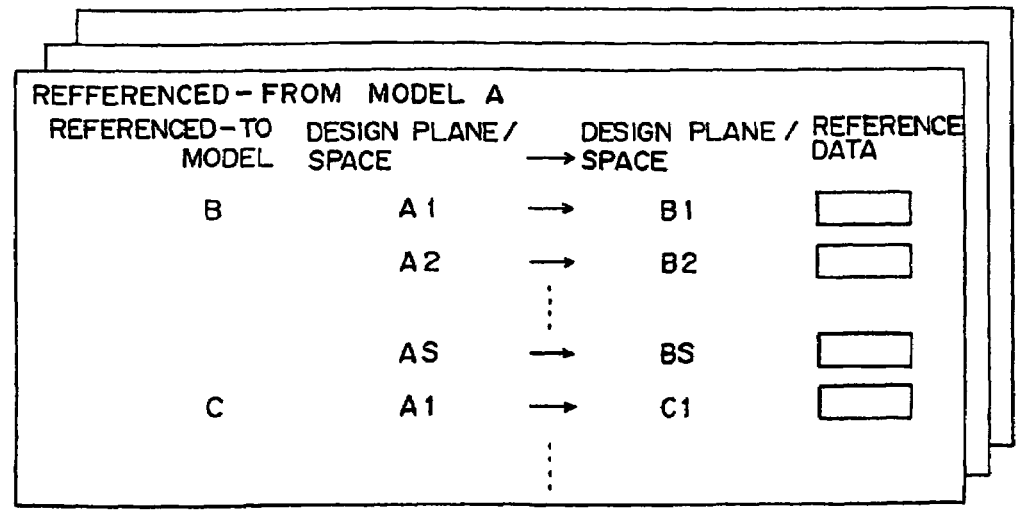

In the CAD system, the data of each model comprises the model information shown in FIG. 3A and the model reference information shown in FIG. 3B.

The model information stores the information about a two-dimensional design plane and a three-dimensional design space of the model, and the spatial attribute indicating what attribute each two-dimensional design plane has in a three-dimensional design space. In the case shown in FIG. 3, the model A has A1, A2, . . . as a two-dimensional design plane, and has AS as a three-dimensional design space. As a spatial attribute, the design plane A1 indicates an XZ plane (Y=0) and the design plane A2 indicates an XY plane (Z=0), in the three-dimensional design space.

Figure 4:
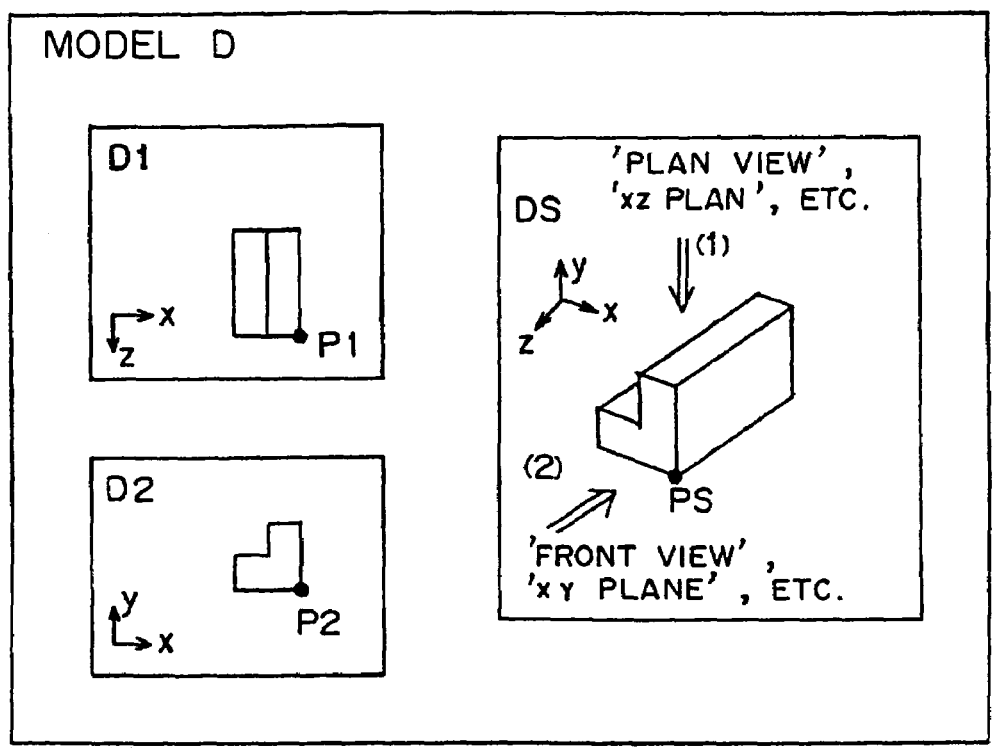
FIG. 4 shows the spatial attribute of the two-dimensional design plane.

FIG. 4 shows a spatial attribute in each two-dimensional design plane.

The method of assigning a spatial attribute in the three-dimensional design space of each two-dimensional design plane can be a method of assigning a spatial name in advance such as an 'XY plane', a 'front view', etc., shown in FIG. 3, to fixed views of (1), (2), etc., shown in FIG. 4 for prescription by name, a method of assigning it by a mathematical and direct representation using a normal vector such as x=0, etc., a method of associating an origin in the two-dimensional design plane with an origin in the three-dimensional design space, etc.

The model reference information shown in FIG. 3B stores what design plane in another model each design plane/space in a model refers to. For example, in FIG. 3B, for the design plane A1 of a model A, the reference of the design plane B1 of a model B and the reference of the design plane C1 of a model C, and a conversion matrix between an placement vector in the referred-from design plane and a reference vector in the referred-to design plane are stored as reference data.

Figure 5:
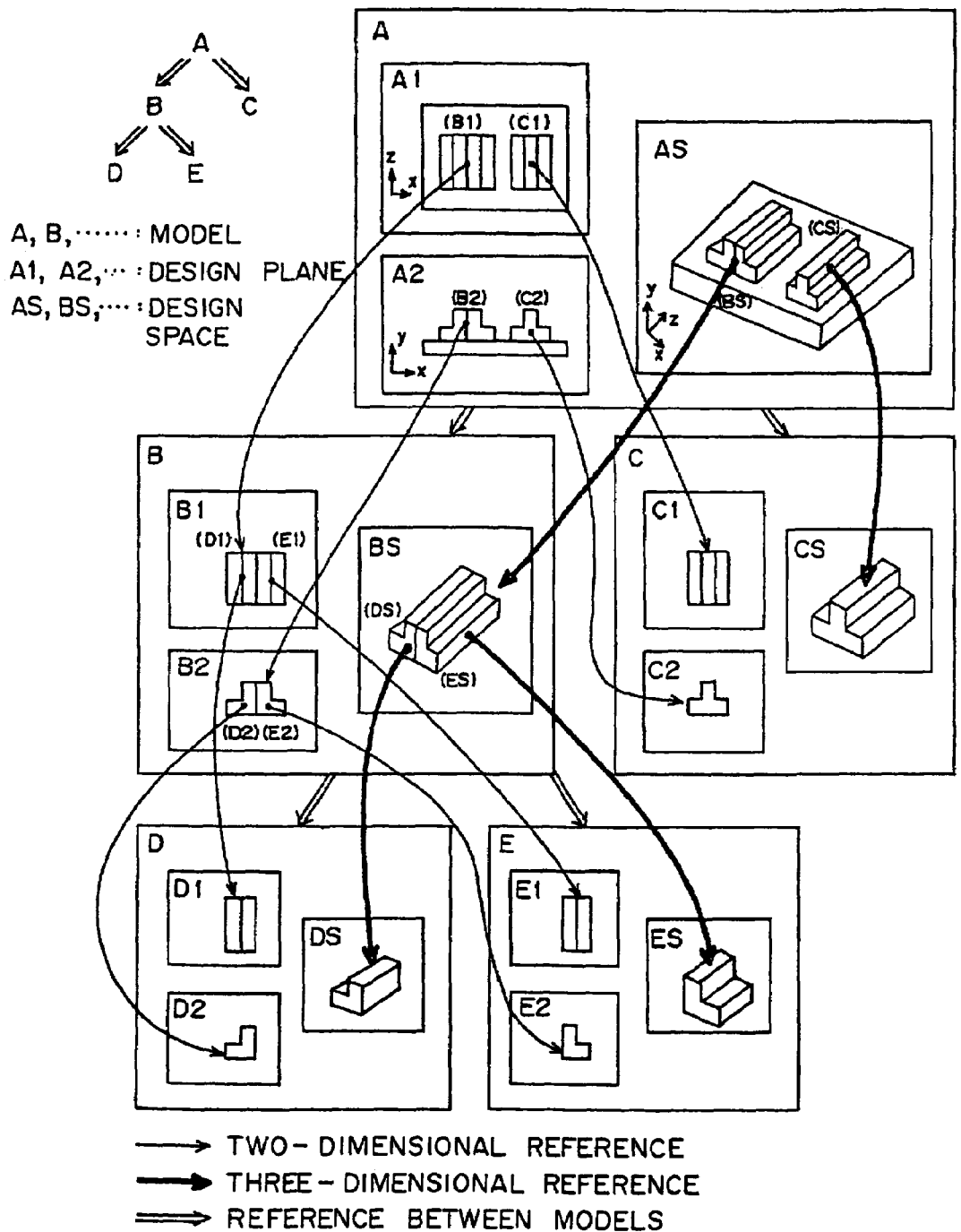
FIG. 5 shows the reference relation between design planes.

FIG. 5 shows an example of a reference between a design plane and a space according to the present embodiment.

According to the present embodiment, when a model for use in automatically assembling a three-dimensional model is specified, a three-dimensional reference is generated and a three-dimensional model is generated in a three-dimensional work plane from the two-dimensional reference and spatial attribute in the two-dimensional design plane for a part and a unit to be processed in a designing operation as a preprocess before starting an editing process by a user. Then, a reference between design planes is set for managing information about spatial consistency, etc. from the two-dimensional reference and the three-dimensional reference. Design planes of all related models B through E are referenced from the two-dimensional reference of the two-dimensional design planes A1 and A2 of the model A to be processed in the designing operation shown in FIG. 5. Then, using the two-dimensional reference and the spatial attribute sequentially from the lowest order model, a three-dimensional model is automatically generated in the three-dimensional design space AS while generating a three-dimensional reference.

Figure 6:
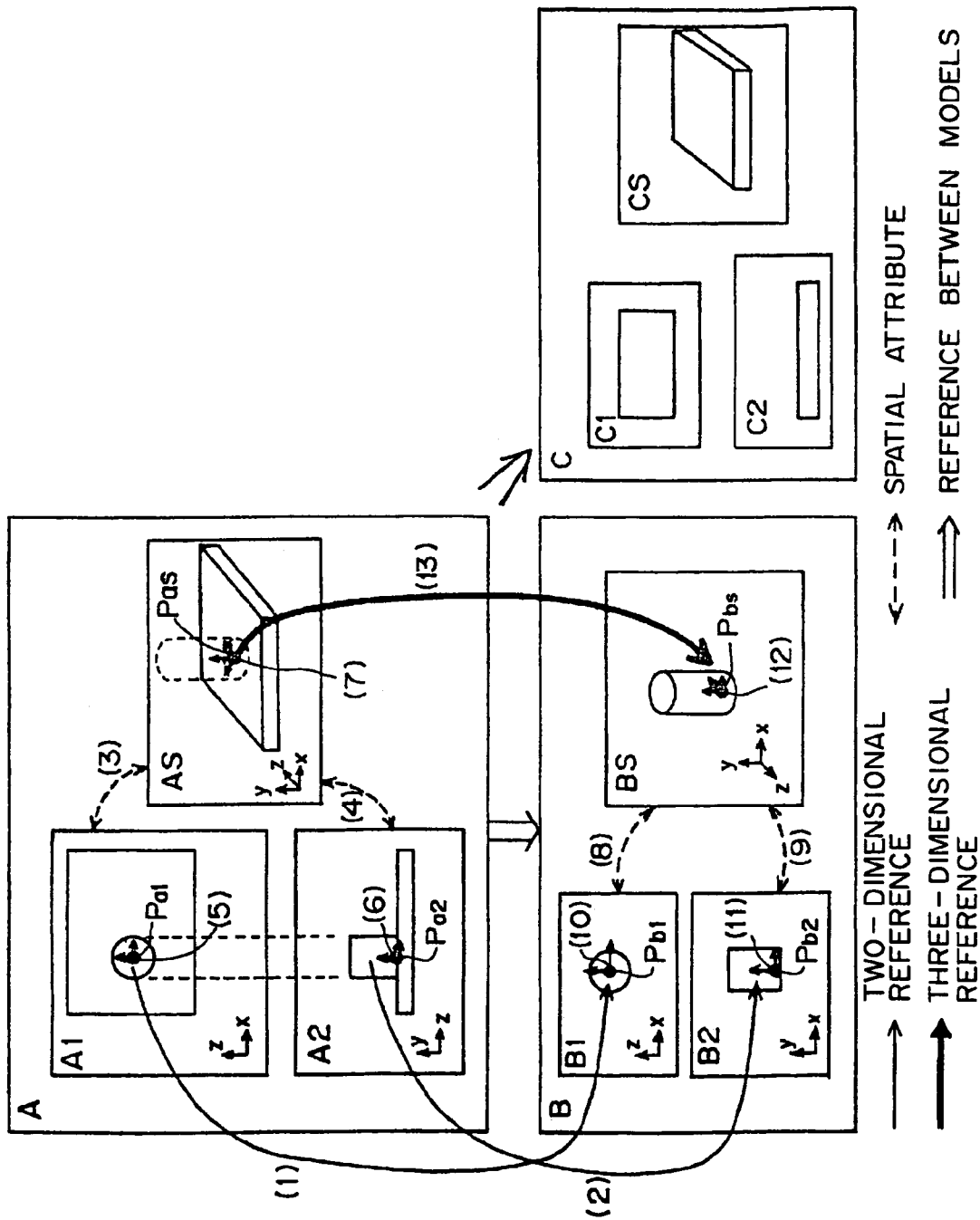
FIG. 6 shows an image of the process flow of automatically generating a three-dimensional reference.

FIG. 6 shows an image of the process flow for automatically generating a three-dimensional reference.

In FIG. 6, the models B and C are configured without referring to other models at the lowest model. The model A is configured by the models B and C. Since the three-dimensional reference with the model C is generated as in the case of the model B, the explanation is omitted here.

The process flow shown in FIG. 6 is described below by referring to the flowchart shown in FIG. 7.

The following process is performed on each model in order from the model at the lowest hierarchical level.

Step I: Determining Placement Vector

First, the placement point and the placement vector ((5), (6)) for reference placement of the two-dimensional design planes B1 and B2 of the model B with the two-dimensional design planes A1 and A2 of the model A are converted into the point and vector ((7)) in the three-dimensional design space AS using the two-dimensional references ((1), (2)) of the two-dimensional design planes A1 and A2 to the two-dimensional design planes B1 and B2 of the model B, and the spatial attributes ((3), (4)) with the design plane AS.

FIG. 8 shows the process of converting the placement point and the placement vector. FIG. 8 shows the process of converting the points Pa1 (x1, z1) and Pa2 (x2, y2) and the placement vectors ($1_{x1}$, $1_{z2}$) and ($1_{x2}$, $1_{y2}$) referring to each of the two-dimensional design planes of the model B on the design planes A1 and A2 into the point and vector in the AS using the spatial attribute with the design plane AS. FIG. 8 shows only the portion corresponding to the model B.

Figure 8A:
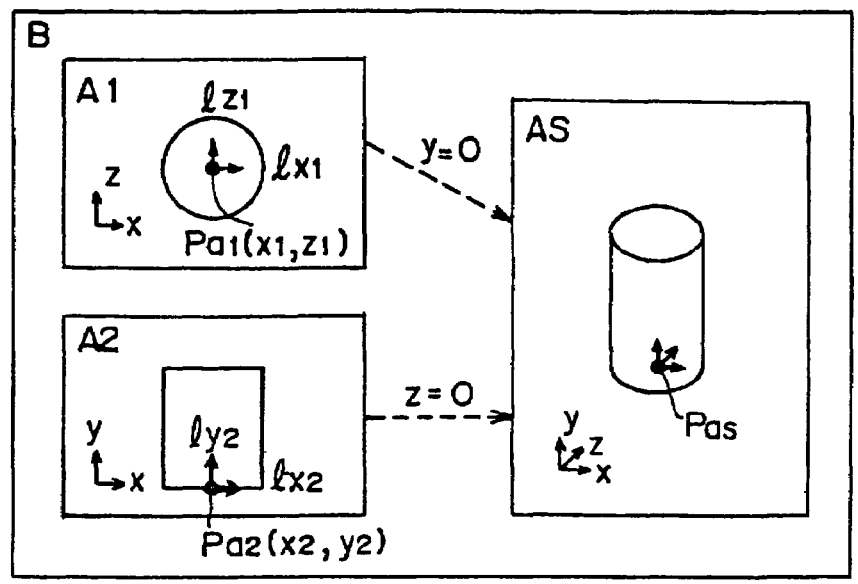
FIGS. 8A and 8B shows the process of converting an placement point and an placement vector.

As shown in FIG. 8A, the spatial attributes of the two-dimensional design planes A1 and A2 for the three-dimensional design space AS are such that the two-dimensional plane A1 is the XZ plane (y=0) of the three-dimensional design space AS, and the two-dimensional plane A2 is the XY plane (z=0). Using the spatial attribute, the corresponding point and vector in the three-dimensional design space AS are obtained as shown in FIG. 8B.

When the two-dimensional design plane refers to the design plane of another model, the placement point and placement vector for placement are set at the reference source to determine where in the design plane of the reference source the graphics of the reference destination are to be placed. At the reference destination, the reference point and the reference vector, which are references for use in determining the position and direction of data at the reference source, are set. In the case shown in FIG. 6, the placement points Pa1 and Pa2 indicating the positions of the data of the two-dimensional design planes B1 and B2 are set in the two-dimensional design planes A1 and A2 as shown in FIG. 8. To simplify the explanation in the example shown in FIG. 8A, the design planes A1 and A2 are perpendicular to each other. However, in the following processes, they can be freely set by considering the inclination as an element for a two-dimensional design space in which they are not orthogonal to each other.

Figure 8B:
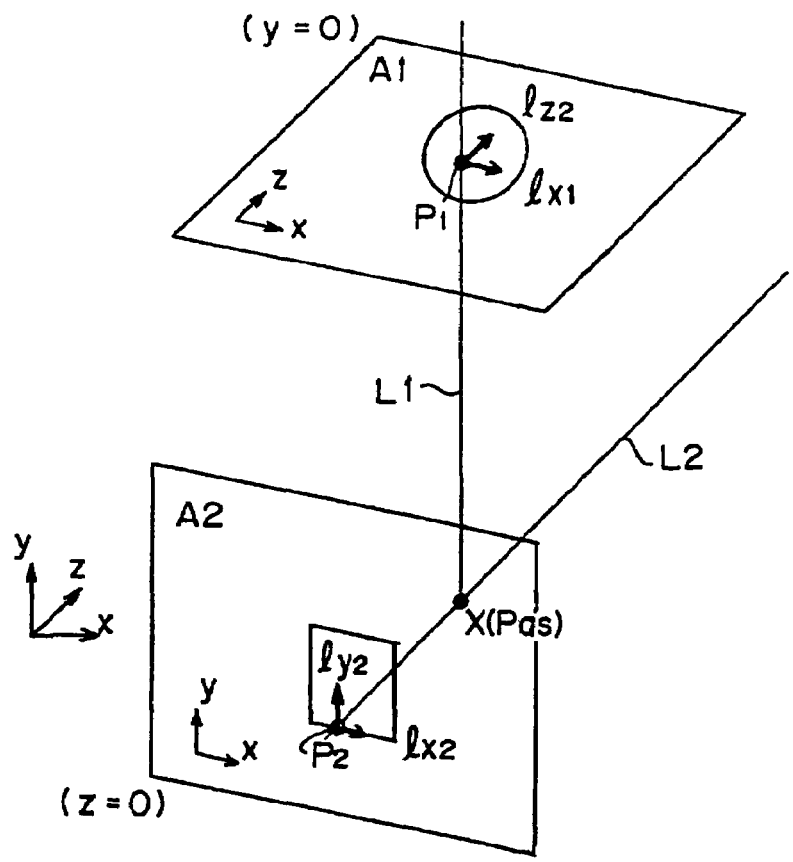

As shown in FIGS. 8A and 8B, the placement point Pas of model B in the three-dimensional design space AS is calculated as an intersection X between a line L1 passing the placement point Pa1 in the A1 plane and perpendicular to the A1 plane (y=0), and a line L2 passing the placement point Pa2 in the A2 plane (z= 0) and perpendicular to the A2 plane.

Thus, the placement position Pas is determined in the AS of the three-dimensional model BS.

If the intersection X cannot be obtained and the placement position Pas is not obtained, the three-dimensional inconsistency exists between the design planes A1 and A2, which is notified to the designer to change the position Pa1 on the two-dimensional design plane A1 or the Pa2 on the two-dimensional design plane A2 into the consistent position. Otherwise, the designer is requested to set the placement position Pas of the model B in the three-dimensional design space.

Step II: Determining Reference Vector

Then, for the model B, the reference point and the reference vector ((10), (11)) on the two-dimensional design planes B1 and B2 of the model B referenced by the two-dimensional design planes A1 and A2 of the model A are converted into the reference position and the reference vector ((12)) in the three-dimensional design space BS, using the spatial attribute ((8), (9)) between two-dimensional design plains B1 and B2 and three-dimensional design space BS.

The converting process performs the process in step I similar to the process performed on the design planes A1, A2, and AS of the model A as shown in FIG. 7B with the placement vector on the design plane A1 replaced with the reference vector on the design plane B1, with the placement vector on the design plane A2 replaced with the reference vector on the design plane B2, with the placement vector on the design plane AS replaced with the reference vector on the design plane BS, with the attribute on the design plane A1 replaced with the spatial attribute on the design plane B1, and with the spatial attribute on the design plane A2 replaced with the spatial attribute on the design plane B2. An intersection between a line passing the placement point Pb1 in the B1 plane (y=0) and perpendicular to the B1 plane, and a line passing the placement point Pb2 in the B2 plane (z=0) and perpendicular to the B2 plane. The point is defined as the placement position Pbs of the model B in the three-dimensional design space BS.

Thus, the correspondence among the reference vector in the model B, a two-dimensional plane, and a three-dimensional space is obtained.

Step III: Generating Three-Dimensional Reference Data Between Design Planes AS and BS A conversion matrix M between the placement vector in the three-dimensional design space AS obtained in step I and the reference vector in the three-dimensional design space obtained in step II is generated, and is stored as the three-dimensional reference data from the three-dimensional design space AS to the three-dimensional design space BS.

Step IV: Automatic Assembly

Based on the conversion matrix M generated in step III, the three-dimensional data of the model B referenced in the three-dimensional design space AS is copied or referenced, thereby assembling the three-dimensional model.

FIG. 9 is a flowchart of the process of the three-dimensional reference, and the three-dimensional model generation.

First, in step S1, the designer specifies to input a model to be processed. Then, in step S2, the model information and the model reference information of the target model are read from the database, a referenced model is obtained from the model reference information, and the model information and the model reference information about the model are read. The process is performed to the model in the lowest hierarchical level in the reference relation, and the model information and the model reference information about all models directly or indirectly related to the model to be processed in reference are read.

Then, in step S3, the number N of all models is checked from the model information and the model reference information read in step S2, and a list indicating the reference of each model is generated.

Then, the pointer i indicating the process target is initialized to '1', in order from the model in the lowest hierarchical level in the reference correspondence based on the list generated in step S3, the processes in the above mentioned steps I through VI, that is, the placement vector is determined (step S5), a reference vector is determined (step S6), and the three-dimensional reference data is generated (step S7), and the three-dimensional model is automatically assembled (step S8).

Then, the processes in steps S5 through S8 are performed on all models. When the pointer i reaches the number N of all models (NO in step S9), the process terminates. When the pointer i is smaller than the number N of all models (YES in step S9), the pointer i is incremented by 1 (step S10), and then the processes in steps S5 through S8 are performed on the next model.

In the above mentioned processes, a three-dimensional model can be automatically assembled from a set of two-dimensional figures and unit figures by using the spatial attribute of a two-dimensional design plane and a two-dimensional reference, which cannot be realized by the conventional technology.

In addition, a three-dimensional model in the three-dimensional design space assembled in the above mentioned process has the three-dimensional reference data with a lower order model and a spatial attribute with the two-dimensional design plane in the same model. In each of the two-dimensional design planes in the same model as the three-dimensional model, there is correspondence through a three-dimensional design space. Therefore, the three-dimensional model can automatically reflect the edited contents on another work plane, or the two-dimensional design plane and the three-dimensional design space can automatically reflect the process on the three-dimensional model. Then, all other related design planes/spaces reflect the edited contents, and consistent new models can be automatically generated, thereby realizing the functions which cannot be realized by the conventional technology by having the correspondence among the two-dimensional design planes/three-dimensional design spaces in the model and the inter-model references as data.

Described below is the part moving process as an example of reflecting an editing process on another design plane/space in the model and on another model.

Figure 10:
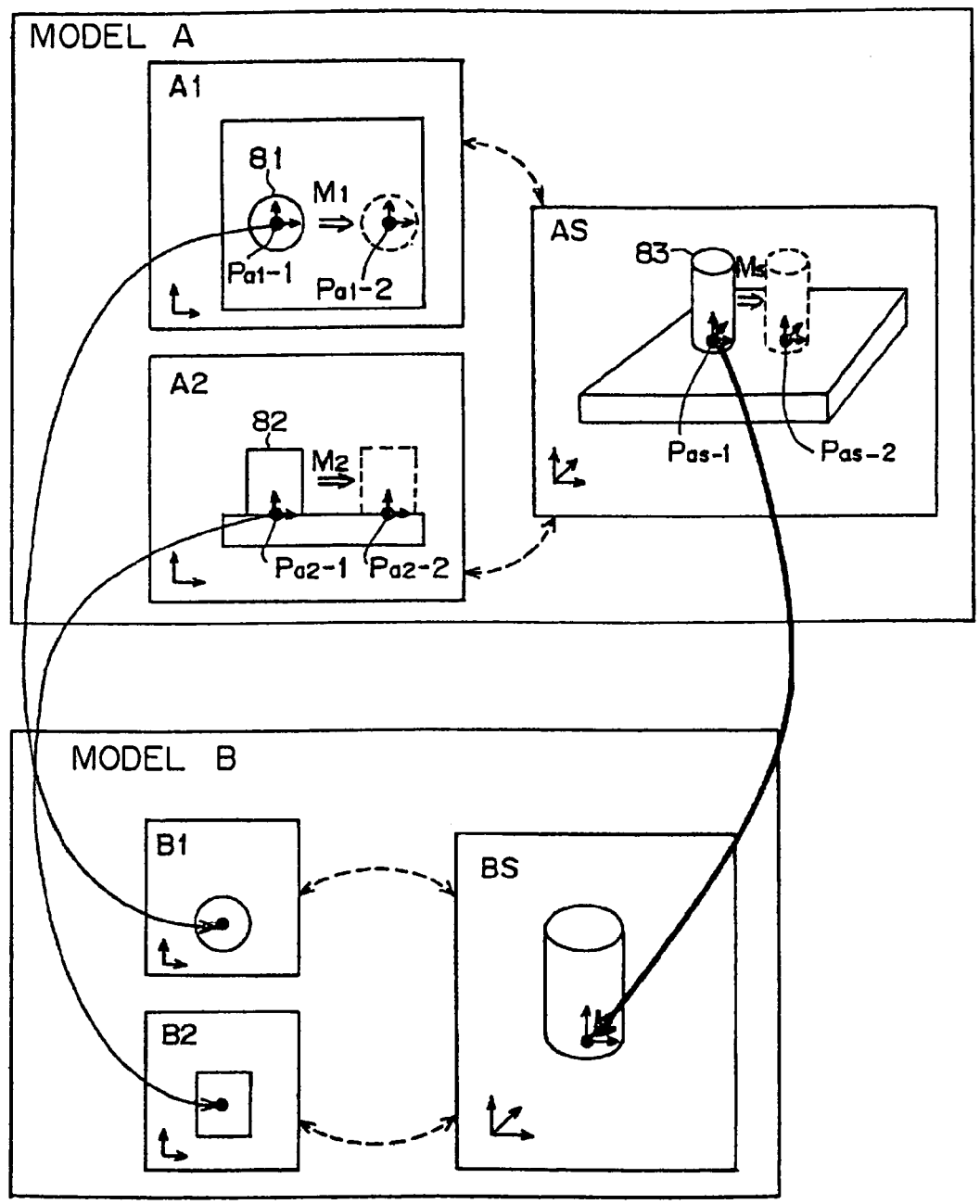
FIG. 10 shows the process of moving a part on a two-dimensional design plane.

FIG. 10 shows a moving process.

In FIG. 10, when the position of a part 81 referencing the two-dimensional design plane B1 of the model B is moved on the two-dimensional design plane A1, the moving information M1 indicating the amount and direction of the movement is converted into the moving information M2 in the two-dimensional design plane A2 and the moving information Ms in the three-dimensional design space AS, and the same parts 82 and 83 corresponding in the two-dimensional design plane A2 and the three-dimensional design space AS move corresponding to the movement on the two-dimensional design plane A1.

Figure 11:
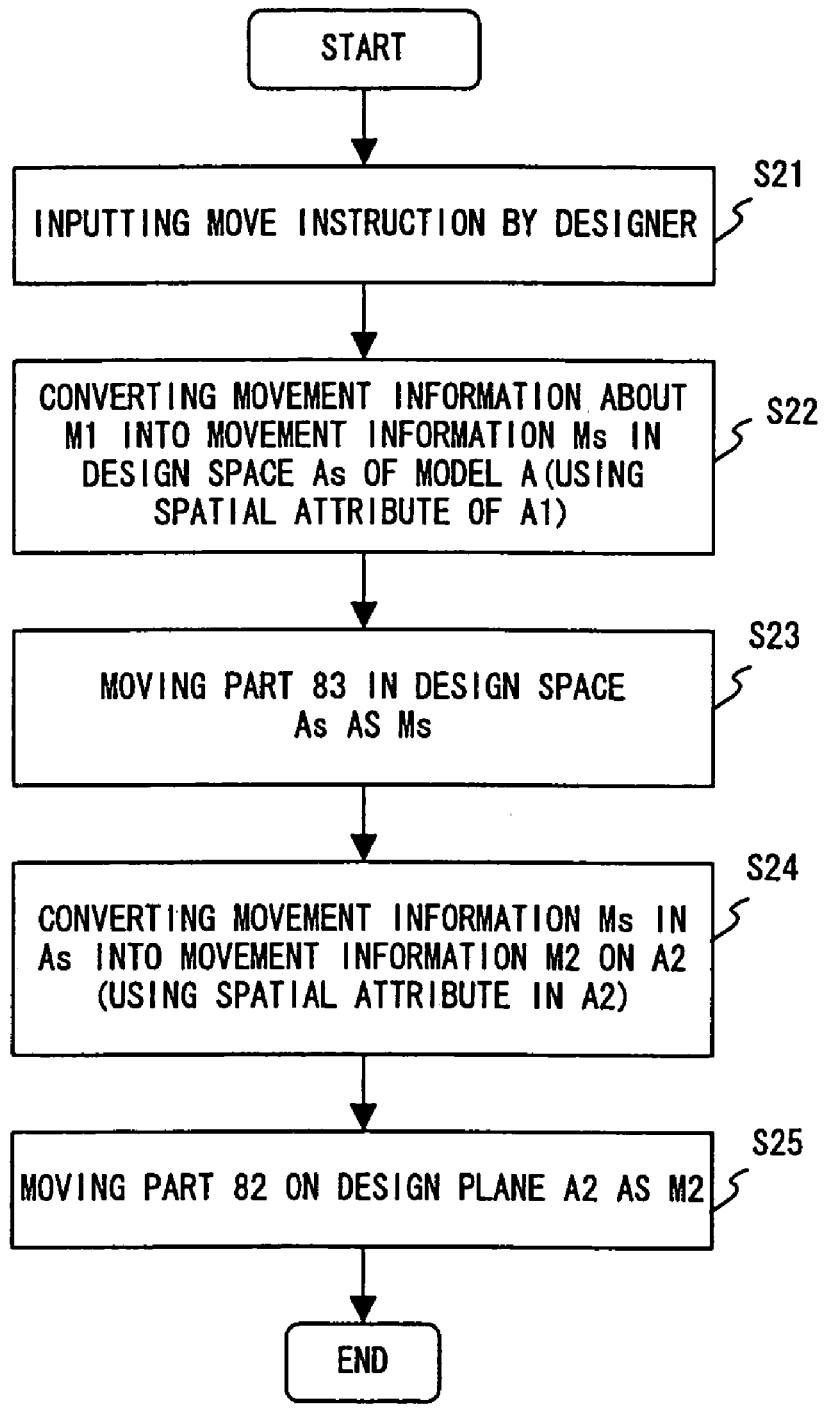
FIG. 11 is a flowchart of the process flow when the part shown in FIG. 10 is moved.

FIG. 11 is a flowchart of the process flow in the movement of the parts shown in FIG. 10. In the work plane A1 of the model A, when the designer moves the part 81 on the screen using a move command, it is input as a move instruction (step S21).

According to the move instruction, the moving information M1 is converted into the moving information Ms in the three-dimensional design space AS of the model A using the coordinate correspondence table described later, and the spatial attribute of the two-dimensional design plane A1 (step S22). According to the moving information Ms, the position Pas-2 of the placement vector after moving the part 83 is obtained by converting the position Pas-1 of the placement vector of he model B before the movement, and the three-dimensional model of the model B is placed at the position Pas-2. Thus, the part 83 is moved in the three-dimensional design space AS (step S23).

In the two-dimensional design plane A2, the moving information Ms in the three-dimensional design space AS obtained in step S22 is converted to obtain the moving information M2 in the two-dimensional design plane A2 (step S24). According to the moving information M2, the position Pa2-2 of the placement vector after moving the part 82 is obtained by converting the position Pa2-1 of the placement vector before moving the model B, and the part 82 referencing the design plane B2 is moved to the position Pa2-2 (step S25). The moving information M2 can be derived in step S24 not according to the moving information Ms, but directly according to the spatial correspondence between the two-dimensional design planes A1 and A2. For example, when the plane A1 is an xy plane, and the design plane A2 is an Xz plane, only the displacement of the moving information M1 in the x direction can be obtained as the moving information M2.

Thus, an edit instruction of figures from the designer in one work plane is automatically reflected on another two-dimensional design plane in the same model or the three-dimensional design space. The reflection of the edit instruction on another two-dimensional design plane and the three-dimensional design space is not automatically performed, but the designer can be notified of whether or not the reflection is performed in an interactive mode. Otherwise, it can be checked whether or not the edit instruction is consistent, and the reflection can be realized while the check result is notified to the designer.

In the above mentioned example, a part is moved, and another edit instruction without spatial displacement, for example, copy, delete, shape-change, color-change, switch display/non-display instructions, etc. can be performed in the similar converting process using a corresponding reference, thereby the process contents on one work plane can be inflected on other two-dimensional design plane and three-dimensional design space. For example, when a copy is made, the process is performed to generate an inter-model reference to a new copied model by using the moving information Ms and M2 obtained in steps S22 and S24 shown in FIG. 11 as the moving information from the copy source to the copy destination; not as the movement in steps S23 and S25 (that is, without deleting the image at the original position).

Figure 12:
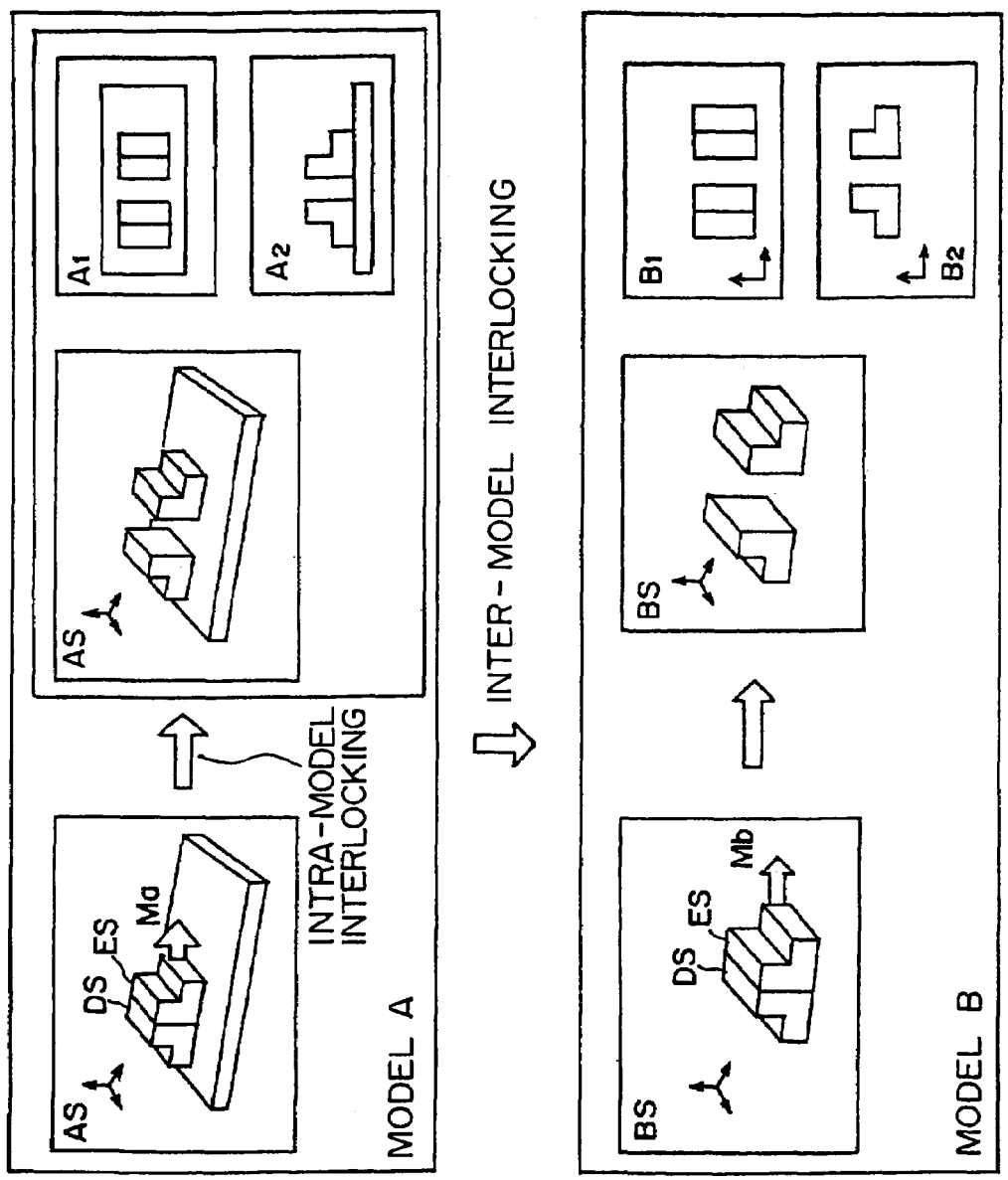
FIG. 12 shows another model reflecting an edit instruction.

In addition, the reflection of an edit instruction on another two-dimensional design plane/three-dimensional space in the process using the relation information between each design plane and space can also be reflected on the design plane/design space of another related model as shown in FIG. 12, not only on the same model as described by referring to FIGS. 10 and 11.

In FIG. 12, when the ES is moved to the Ma in the three-dimensional design space AS, the two-dimensional design planes A1 and A2 in the same model are not only changed as interlocking, but a model B is retrieved through the inter-model reference when the three-dimensional design space ES refers to the model B, and there is the model B relating to the moved portion, and a moving process is performed corresponding to the inter-model interlocking on the two-dimensional design plane (B1, B2) and the three-dimensional design space (BS).

Thus, the edited contents in one two-dimensional design plane/three-dimensional design space can be interlocked with another two-dimensional design plane/three-dimensional design space because the correspondence is set between the two-dimensional design planes/three-dimensional design spaces in a model and references between models are generated in advance as shown in FIG. 5.

Since the correspondence for the two-dimensional design planes and the three-dimensional design spaces in the same model and an inter-model reference are managed, a portion where a target input has conventionally been switched does not require a work plane to be processed or a work space to be switched in performing an editing operation.

Figure 13:
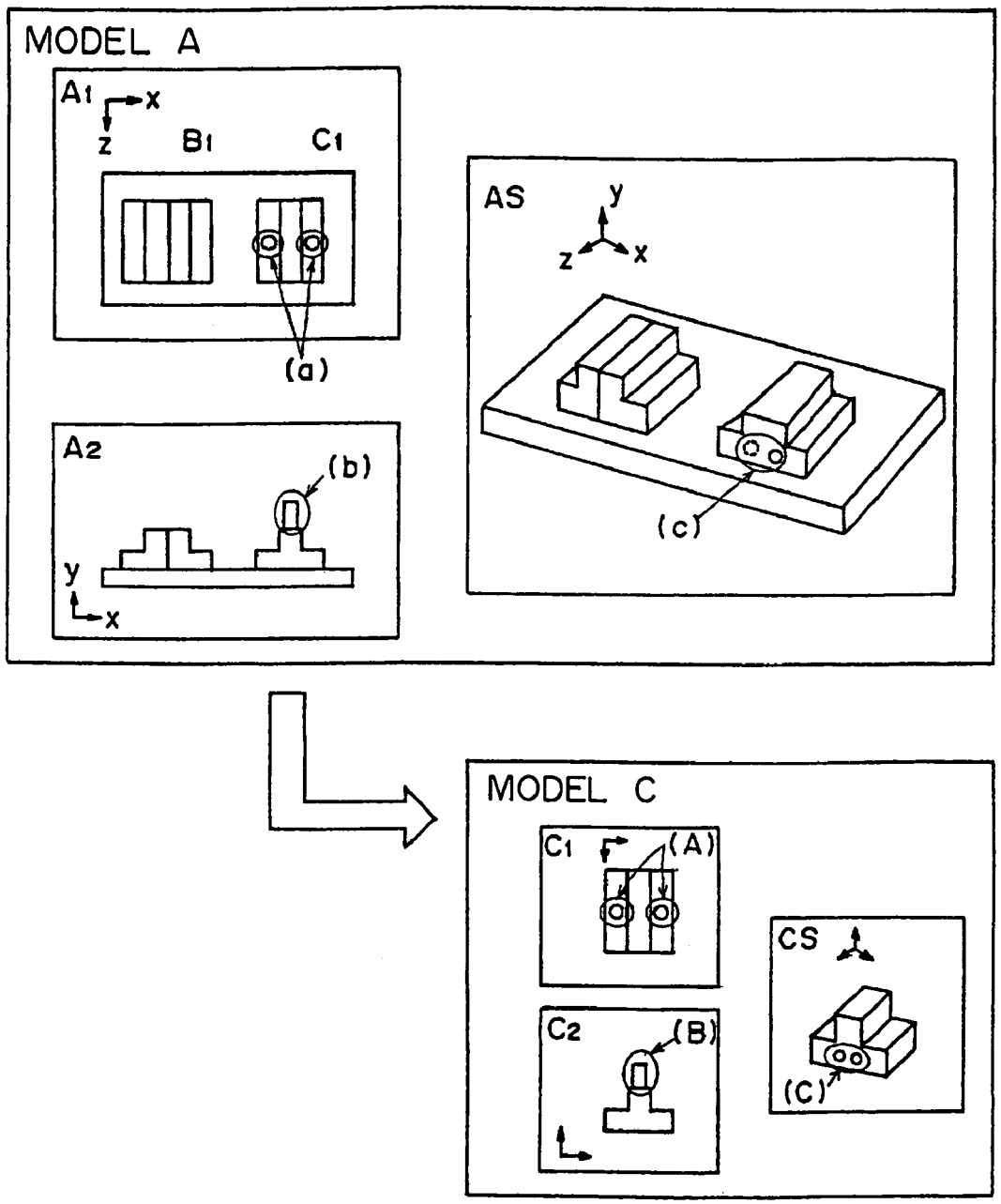
FIG. 13 shows a case in which an editing operation is performed with a model specified as a target input without switching a work plane or a work space.

FIG. 13 shows an example of an editing operation. Since data cannot be conventionally referenced over a design plane and a space, only one design plane/design space can be specified as a target input. For example, as shown in FIG. 13, when a change (a) is made from the two-dimensional design plane A1 to the model C, when a change (b) is made from the two-dimensional design plane A2, and when an edition (c) is added from the three-dimensional design space AS, the process (b) is performed after the work plane is switched into the two-dimensional design plane A2 after performing the process (a) after switching the work plane into the two-dimensional design plane A1, and then the process (c) has to be performed after switching the target work into the three-dimensional design space AS. Thus, the work plain/space is sequentially switched to perform an editing process. This is a troublesome work in designing a machine whose design is frequently changed and in setting designing steps.

However, in the system according to the present embodiment, since reference data and graphic data can be referenced over models and over a two-dimensional design plane and a three-dimensional design space in a model, the model C can be specified as a target input in FIG. 13, and processes (a), (b), and (c) can be input without switching the work plane/work space in the model A which is a higher order model to the model C, thereby storing the result can be stored in the corresponding work plane/work space C1, C2, and Cs as the processes (A), (B), and (C).

By containing data for correspondence in a model and for reference between models, a specific element can be selected from a work plane/space, and a lower order model containing the element can be newly generated.

Figure 14:
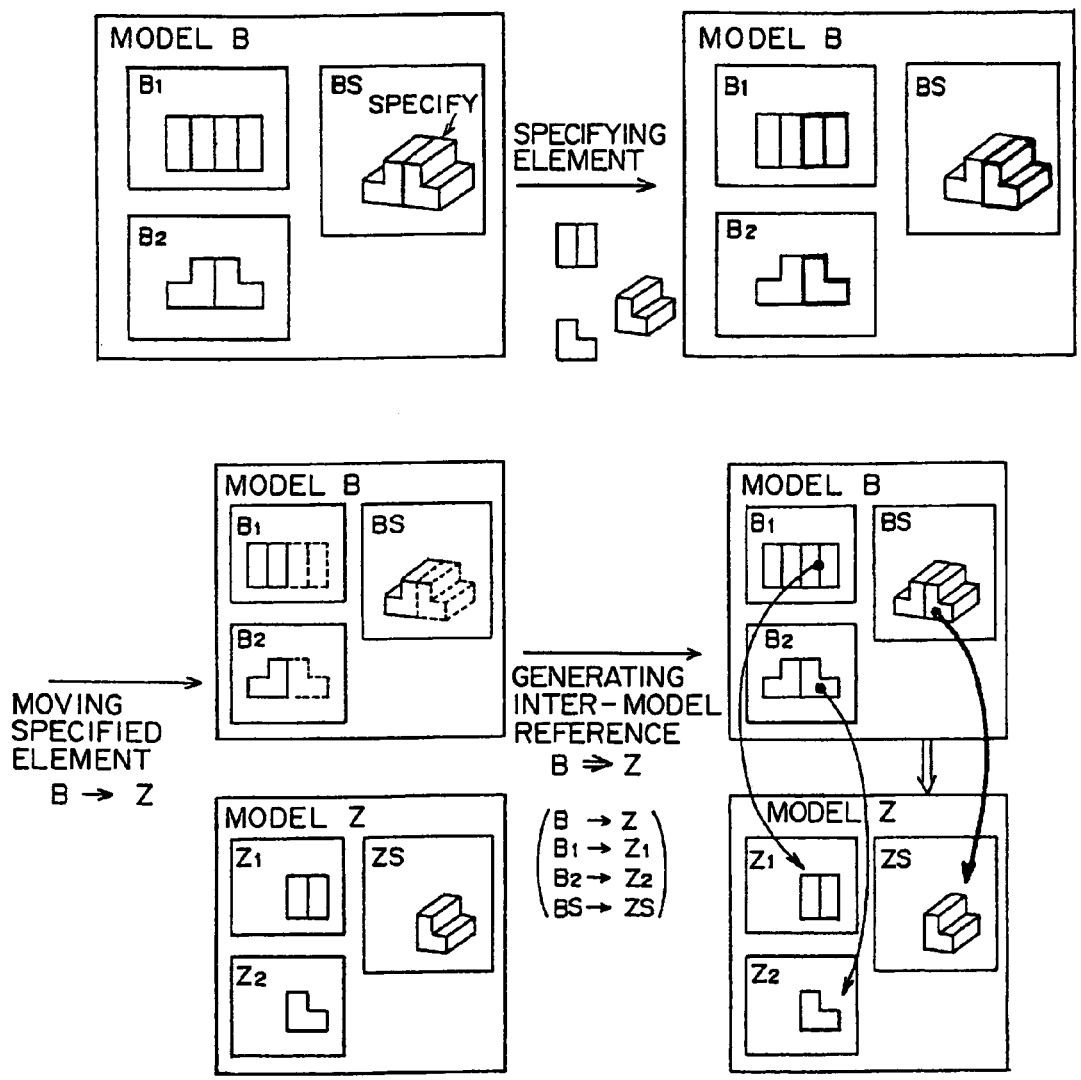
FIG. 14 shows the process of generating a new model.

FIG. 14 shows the process of generating the new model.

FIG. 14 shows an example of generating a new model Z from the model B shown in FIG. 5.

First, the designer specifies an element for a new model from any of the two-dimensional design planes B1, B2, and the three-dimensional design space BS of the model B. In the case shown in FIG. 14, an element is specified from the three-dimensional design space BS. At this time, without specifying an element on other work planes B1 and B2 by switching the three-dimensional work space, an element corresponding to the element specified from the three-dimensional design space BS based on the correspondence between the two-dimensional design plane/three-dimensional design space can be automatically selected on the two-dimensional design planes B1 and B2.

When the specified element is moved to a new model Z, the inter-model reference between the models B and Z can be automatically generated based on the correspondence in a model of the model B and the inter-model reference with another model.

FIG. 15 shows the process of inheriting a spatial attribute in each of the two-dimensional design planes in the process of generating a new model as shown in FIG. 14.

When a new model is generated, each of the two-dimensional design planes of the new model can maintain the consistency in three dimensions by inheriting the spatial attribute of the two-dimensional design plane from the original model. In the case shown in FIG. 15, when the two-dimensional design plane Z1 is generated, it inherits the spatial attribute 'plan view' from the corresponding two-dimensional design plane of the model B which is the original model, and the two-dimensional design plane Z2 inherits the spatial attribute 'front view'. If the designer issues an instruction to rotate the coordinate axis or perform a mirror conversion when a new model is generated, a corresponding spatial attribute should be obtained through conversion. For example, if the designer issues an instruction to rotate the Z axis by 90 degrees as shown in FIG. 15, the spatial attribute of the two-dimensional design plane Z1 is converted from the 'plan view' of the two-dimensional design plane B1 to the 'front view'. In addition, when the three-dimensional design space ZS is generated, a spatial attribute is inherited from the three-dimensional design space BS of the original model B. As in the case of the two-dimensional design plane, a conversion is performed into the corresponding spatial attribute in the three-dimensional design space at the instruction to rotate the coordinate axis or perform a mirror conversion.

Described below is the process performed when a specified element is moved to a new model shown in FIG. 14. When a specified element is moved from the original model to a new model by specifying it from the two-dimensional design plane of the specified-from model, the designer has to set a reference point for the specified element. According to the system of the present embodiment, the designer is guided to (automatically) maintain the spatial consistency of the new model when the reference point is specified.

FIG. 16 shows an example of the guide of the system. In the example shown in FIG. 16, the three two-dimensional design planes X1 (xz plane), X2 (xy plane), and X3 (zy plane) of the original model X, the designer specifies a reference point in the order of X1, X2, and X3.

First, the designer specifies an element 141 to be moved to a new model on the two-dimensional design plane X1, and specifies (1) as a reference point of the element 141.

Then, the designer specifies an element 142 to be moved to a new model to set a reference point on the two-dimensional design plane X2. When a reference point (2) is to be set for the element 142, the system recognizes that (a) on the two-dimensional design plane X1 is the same as (c) on the two-dimensional design plane X2 from the position of the reference point 1 of the two-dimensional design plane and the reference between the two-dimensional design planes X1 and X2, fixes the x direction as an input guide on the two-dimensional design plane X2, and defines the specification only in the y direction.

When the designer sets the reference point (2) on the two-dimensional design plane X, the system recognizes that (e) on the two-dimensional design plane X3 is the same as (d) on the X2, and (f) on the X3, is the same as (b) on the X1 from the setting positions of the references (1) and (2) and the reference among the two-dimensional design planes X3, X1, and X2. Thus, the reference point (3) consistent with the reference points (1) and (2) is automatically set for the element 143 on the two-dimensional design plane X3.

A spatially consistent reference point can be set by the guide of the system as a reference point on the two-dimensional design plane.

Since the reference between the three-dimensional design space and each of the two-dimensional design planes is set and managed in the present system, the reference point of a specified element on each of the two-dimensional design planes is automatically obtained by setting a three-dimensional reference on the three-dimensional design space.

Figure 17:
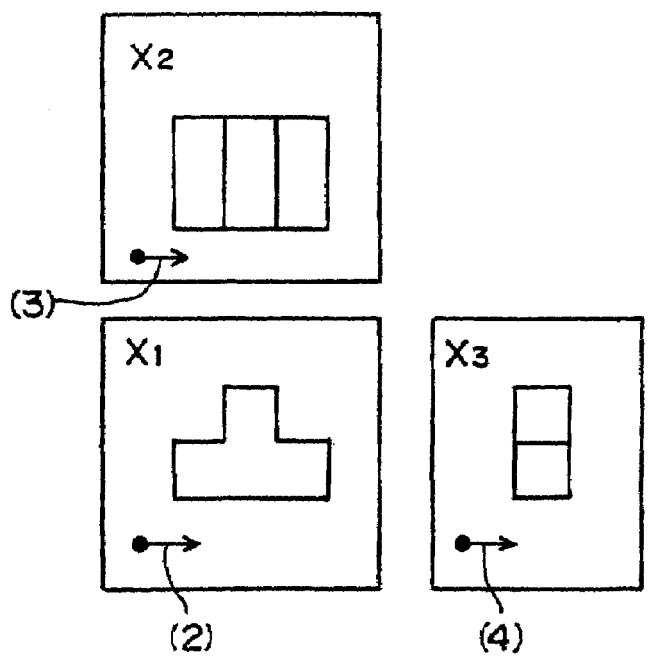
FIG. 17 shows the process of automatically setting a reference point of a specified element in each of the two-dimensional design planes by setting a three-dimensional reference to a three-dimensional design space.

In FIG. 17, when the reference point (1), the first axis (x axis), and the second axis (y axis) are set in the three-dimensional design space Xs, the reference point for the two-dimensional specified element selected on each of the two-dimensional design planes X1, X2, and X3, and the placement angle among the first axis (2) and (3), the second axis (4), and the first axis of the new model are automatically obtained as a two-dimensional reference.

Described below is the settings of inter-model references of new models.

Figure 18:
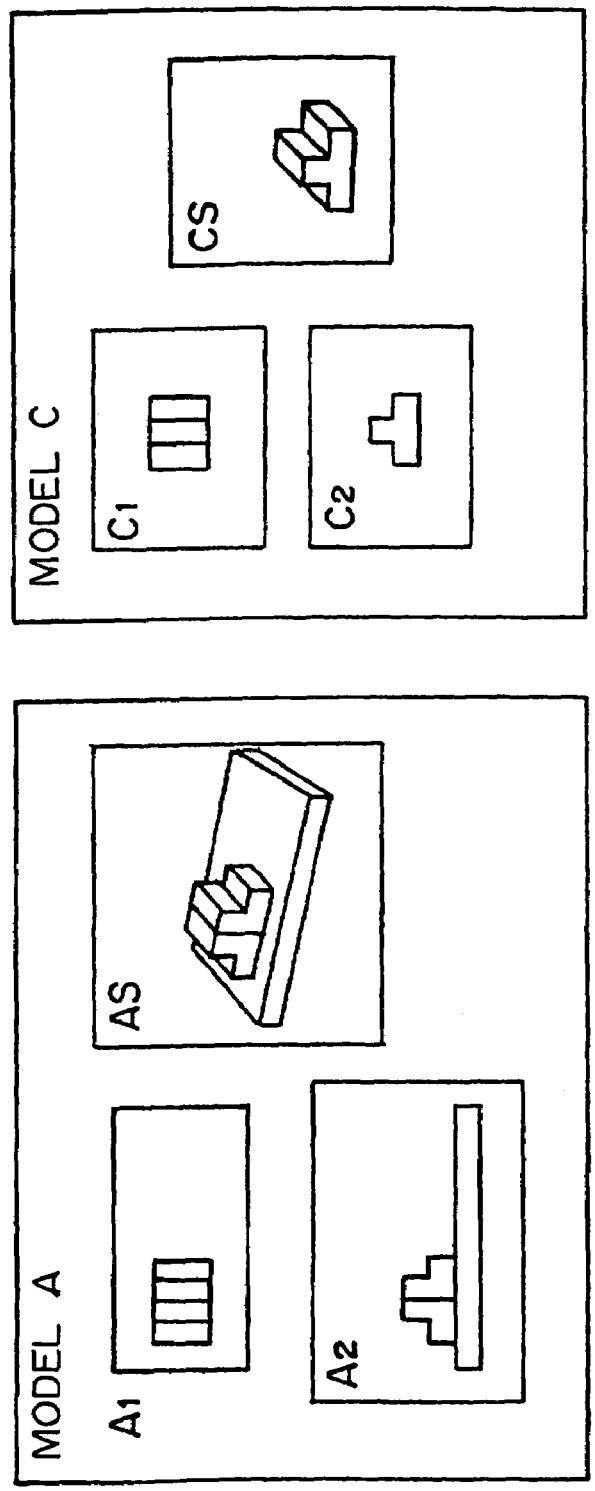
FIG. 18 shows the premise on which a new inter-model reference is set.

The following explanation describes an example in which the model C is referenced and placed for the model A shown in FIG. 18.

Case 1 (when a Model is Set and Placed on One Two-Dimensional Design Plane (Front View))

Figure 19:
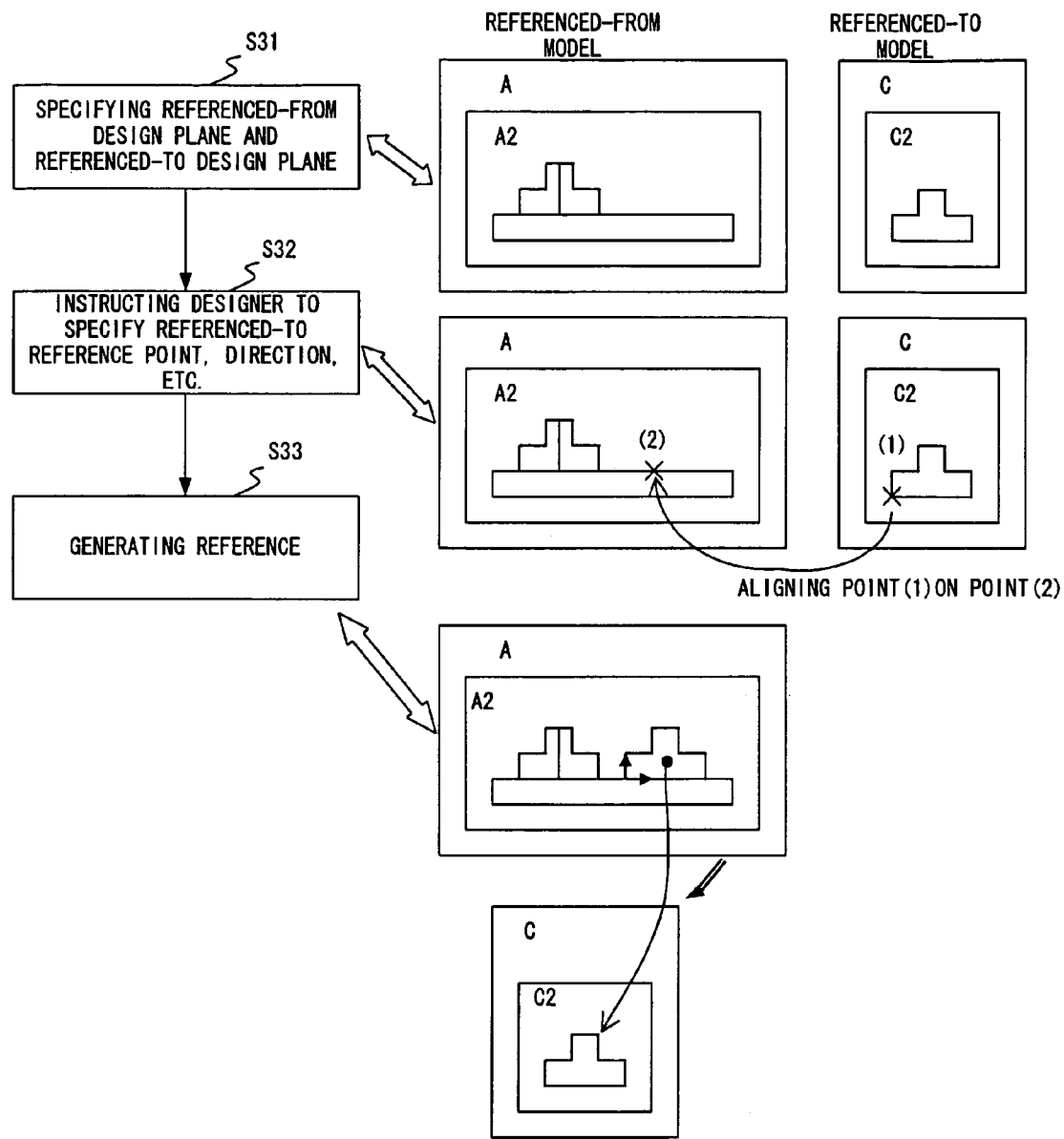
FIG. 19 shows the process flow of the CASE 1.

FIG. 19 shows a process flow in which a two-dimensional design plane C2 is set and placed on one two-dimensional design plane A2 (front view) as CASE 1.

First, the designer specifies a referenced-from design plane A2 and a referenced-to design plane C2 (step S31).

Then, the designer specifies a reference point for reference and placement on the referenced-to design plane C2, a reference vector indicating a direction, and a placement vector indicating a placement position and direction on the design plane C2 of the referenced-from A2 (step S32).

The design plane C2 is set and placed on the design plane A2 by aligning the reference vector at the referenced-to plane set in step S32, on the placement vector at the referenced-from plane.

Thus, the reference between the design plane A2 and the design plane C2 is generated (step S33).

Case 2

FIG. 20 shows a case as CASE 2 in which a reference is set between design planes of the same model after setting the reference for one two-dimensional design plane in CASE 1.

As an initial state shown in FIG. 20, a reference is set between the design plane A2 which is a front view of the model A and the design plane C2 of the model C. From the state, a reference is set between the two-dimensional design planes A1 and C1 which are the plan views of the models A and C respectively from the two-dimensional references of the design planes A2 and C2, the coordinate correspondence table, and the 2D3D placement consistency correspondence table described later.

First, the designer specifies a specified element 181 on the design plane C1 (step 41). Then, the system displays as a guide a straight line 182 corresponding to the reference point of the design plane C2 using the coordinate correspondence table described later. And the designer sets the reference point (1) to maintain consistency with the straight line 182 (step 42).

Then, the system displays a guide line 183 fixed in the axis direction on the two-dimensional design plane A1 to maintain the consistency between the reference point 1 and the design planes A2 and C2. The designer sets the placement point (2) at any position on the guide line (step 43). A 7oreference (two-dimensional reference) can be set between the two-dimensional design planes A1 and C1 by setting and placing the design plane C2 on the two-dimensional design plane A1 with the placement point (2) aligned on the reference point (1) on the design plane C1. Two two-dimensional references, which are between the design plain A1 and C1 and whichare between the design plains A2 and C2, are set between the model A and C. Thus, a view interlocked 2D parts structure data is generated, and a part can be recognized over a plurality of views, thereby realizing an interlocking operation.

Case 3 (Setting Two-Dimensional Reference After Setting Three-Dimensional Reference)

Figure 21:
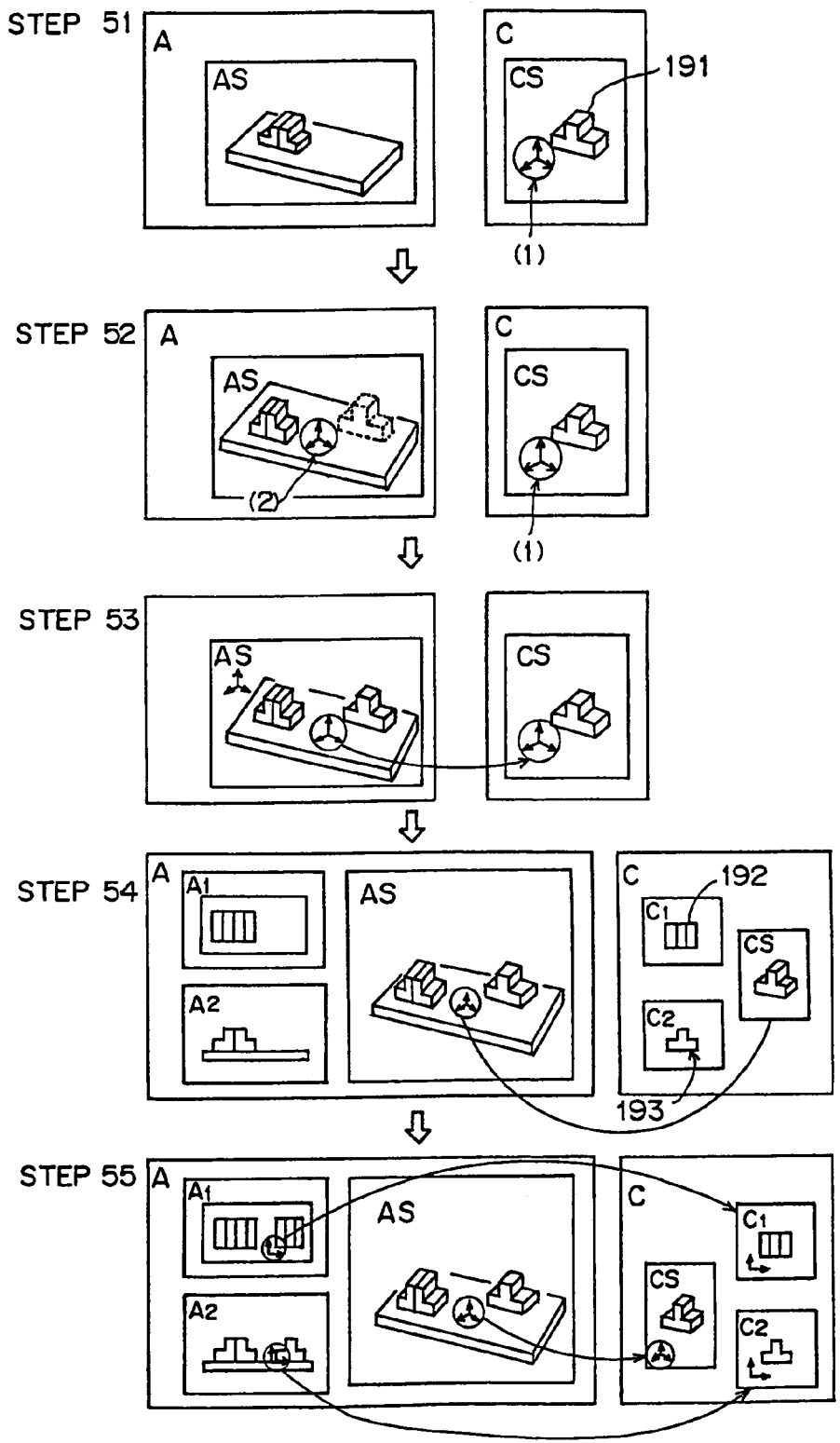
FIG. 21 shows the process flow of the CASE 3.

FIG. 21 shows a case as CASE 3 in which a three-dimensional reference is set between three-dimensional design spaces, and a two-dimensional reference is set based on the three-dimensional reference.

In FIG. 21, when the designer selects a specified element 191 in the three-dimensional design space CS of the model C, the system indicates to the designer the referent point, the first and second axes (reference vector (1)) for the specified element 191 (step 51).

Then, the system indicates the placement point, the first axis, and the second axis (placement vector (2)) in the three-dimensional design space AS of the model A where they are placed (step 52). A reference (three-dimensional reference) is set between the three-dimensional design spaces AS and CS by the designer setting and placing the three-dimensional design space CS in the three-dimensional design space AS with the reference vector (1) in the three-dimensional design space CS aligned on the placement vector (2) (step 53).

Then, the designer selects and indicates specified elements 192 and 193 from the model A and the two-dimensional design planes C1 and C2 of the model C in which a three-dimensional reference is set (step 54). Thus, a two-dimensional reference is automatically generated from the three-dimensional reference set in step S53, the coordinate correspondence table, and the 2D3D placement consistency correspondence table described later (step S55).

The processing operations according to the present embodiment described above are explained below by referring to a practical configuration.

In the following descriptions, each of the two-dimensional design planes includes only six views. One model is placed on the parent model only one placement. The operation such as moving a part, etc. is only a parallel movement and a rotating movement in 90° unit.

The assumption above is given for simple explanation, and can be easily extended using the data structure and process described below.

Data is extended with a plane defined as an optional plane in a space.

A two-dimensional design plane—three-dimensional design space correspondence table is generated based on the extended data.

When an optional moving operation is performed, it is necessary to change or newly set a two-dimensional reference, but the processes for them are performed with the moving operation or in an interactive mode. In addition, a consistency check is made and the check result is notified.

A two-dimensional data is newly set from three-dimensional data for an unplaced work plane or non-existing work plane. Otherwise, a new corresponding work plane is set, and a process is performed for generating the shape, etc.

Figure 22:
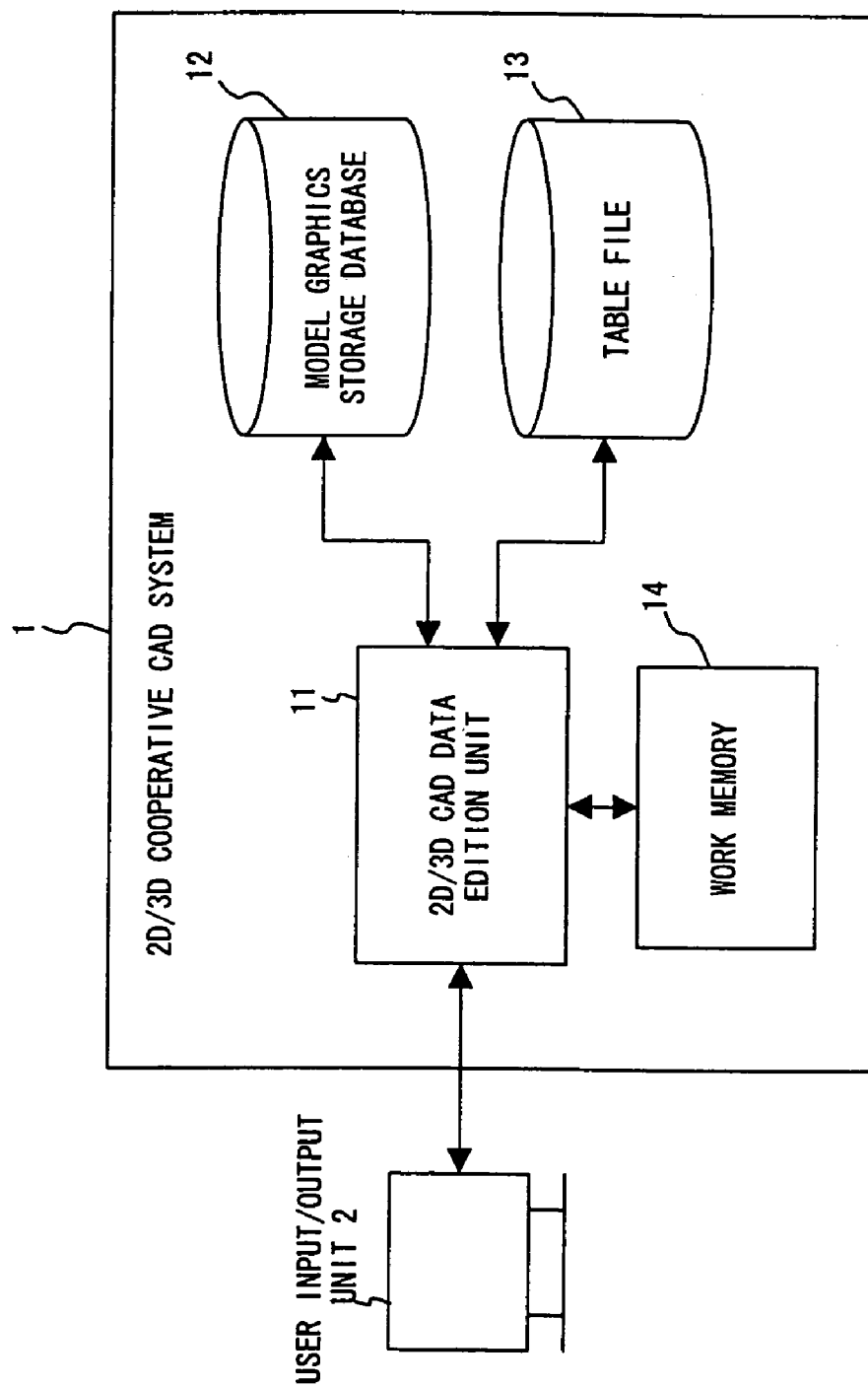
FIG. 22 shows the outline of the configuration of a two-dimensional/three-dimensional cooperative CAD system.

FIG. 22 shows the outline of the configuration of the present invention when it is configured as a two-dimensional/three-dimensional cooperative CAD system. The present invention is not only realized as a two-dimensional/three-dimensional cooperative CAD as shown in FIG. 22, but can be configured as a two-dimensional CAD or a three-dimensional CAD. In this case, the two-dimensional/three-dimensional CAD according to the present embodiment is connected to a three-dimensional CAD or a two-dimensional CAD with a different configuration, and these CAD systems comprises cooperation units which share two-dimensional/three-dimensional data, and cooperate the plurality of CAD systems. Otherwise, it can be configured as a cooperative system for realizing the cooperation between a two-dimensional CAD and a three-dimensional CAD.

A two-dimensional/three-dimensional cooperative CAD system 1 shown in FIG. 22 is connected to a user input/output unit 2 for communicating with the designer for operating and designing a system. The user input/output unit 2 can be, for example, a terminal information processing device, a monitor, a printer, a keyboard, a pointing device, etc. with which the designer specifies and inputs to the two-dimensional/three-dimensional cooperative CAD system 1, or the two-dimensional/three-dimensional cooperative CAD system 1 outputs to the designer two-dimensional/three-dimensional data such as a two-dimensional figure, a three-dimensional model, etc.

The two-dimensional/three-dimensional cooperative CAD system 1 comprises a two-dimensional/three-dimensional data edition unit 11, the model graphics storage database 12, a table file 13, and work memory 14. FIG. 22 shows only the portion relating to the present embodiment.

The two-dimensional/three-dimensional data edition unit 11 is a unit for processing the two-dimensional/three-dimensional data processed by the two-dimensional/three-dimensional cooperative CAD system 1, generates a work plane on the user input/output unit 2 from the data in the model graphics storage database 12, receives an operation instruction from the designer, performs a corresponding process, etc. In addition, at an instruction from a user, it automatically assembles a three-dimensional model in a three-dimensional design space from the two-dimensional/three-dimensional data in the model graphics storage database 12 using each table in the table file 13, generates various tables described later on work memory, sets and manages an inter-model reference and the correspondence in a model, etc. The two-dimensional/three-dimensional data edition unit 11 can also be realized by hardware, but generally realized by software.

The model graphics storage database 12 stores the data of each design plane as a database for each model. The table file 13 stores a processing table used by the two-dimensional/three-dimensional data edition unit 11. The work memory 14 is used by the two-dimensional/three-dimensional data edition unit 11 as a work memory in the process. The work memory 14 stores the correspondence between a two-dimensional design plane and a three-dimensional design space in the model and a reference between models in the form of a table.

Figure 23:
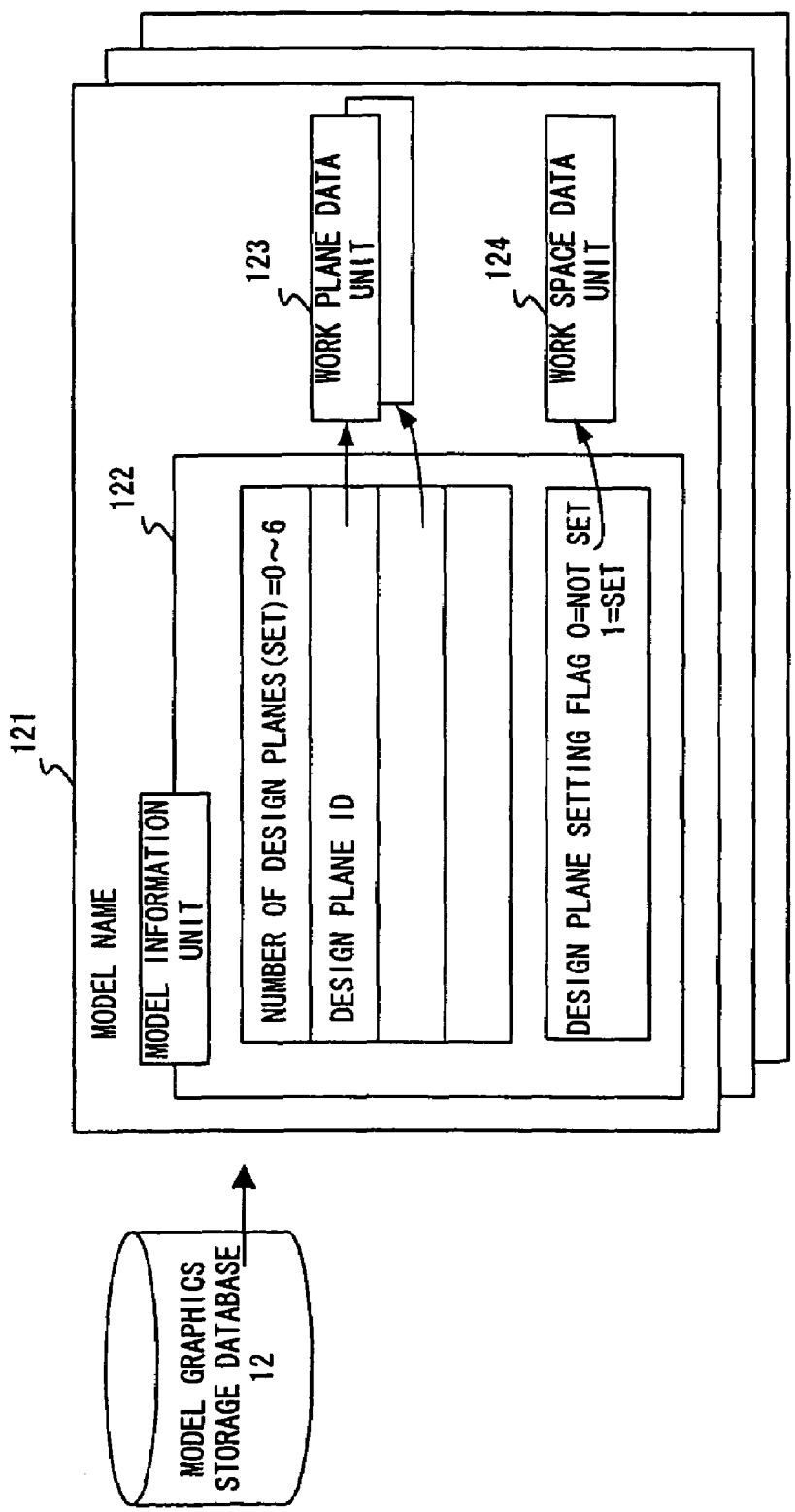
FIG. 23 shows the configuration of the data stored in a model graphics storage database 12.

FIG. 23 shows the data structure of the model graphics storage database 12. The model graphics storage database 12 stores the data of each design plane as a database for each model, and contains a model information unit 122 corresponding to the model information shown in FIG. 3A, a work plane data unit 123 corresponding to each of the two-dimensional design plane, and a work space data unit 124 corresponding to the three-dimensional design space as a database for each model.

The model information unit 122 is generated for each model, and manages the data of the two-dimensional design plane/three-dimensional design space of the model. The model information unit 122 comprises the number of two-dimensional design planes, the design plane ID of the two-dimensional design plane, and a design space establishment flag indicating whether or not the model has a three-dimensional design space.

The work plane data unit 123 manages the information about a two-dimensional design plane in each model. The work space data unit 124 manages the information about a three-dimensional design space in each model.

FIG. 24 shows an example of the configuration of the work plane data unit 123.

The work plane data unit 123 is a graphic storage area storing two-dimensional data in each model, and comprises a plane name, a plane ID, a graphic data unit, and a single 2D part structure data unit.

A plane name refers to the name of a design plane corresponding to the work plane data unit 123. A plane ID refers to an identifier of the design plane, and corresponds to the design plane ID in the model information unit.

The graphics data unit and the single 2D parts structure data unit stores graphics data of a figure of a two-dimensional design plane. The graphics data unit stored the data newly added on the screen, and is configured by graphics information such as a graphics ID, the type and size of graphics, etc. The single 2D parts structure data unit stores the information for the two-dimensional design plane of another model referenced by the two-dimensional design plane to process a referenced design plane as a process unit. When the design plane references another design plane, the file name indicating the model to which the design plane belongs, the plane data unit name for identification of the design plane in the file, the placement point and placement angle indicating the placement position, a mirror flag indicating whether or not a mirror conversion is performed, and when a mirror conversion is performed, an ID assigned to each design plane referenced by the mirror axis as 2D reference information are stored. When the design plane is in the lowest hierarchical level in the reference and does not reference other design planes, the work plane data unit 123 does not have the single 2D parts structure data unit.

FIG. 25 shows an example of the configuration of the work space data unit 124.

The work space data unit 124 has basically the same configuration as the work plane data unit 123 shown in FIG. 24, and is a graphics storage area for storing three-dimensional data in each model. The work space data unit 124 comprises a graphics data unit and a single 3D parts structure data unit.

The graphics data unit and the single 3D parts structure data unit correspond to the graphics data unit and the single 2D parts structure data unit shown in FIG. 25, and stores the graphics data of a figure in a three-dimensional design space. The single 3D parts structure data unit stores the information for the three-dimensional design space of another model referenced by the three-dimensional design space, the file name indicating the child model to which a referencing design plane belongs, the placement point indicating the placement position, the first axis which is the coordinate axis of the patent model corresponding to the X axis of the child model, and the second axis which is the coordinate axis of the parent model corresponding to the Y axis of the child model, with the ID assigned for each design plane referred to as the 3D reference information. When the design space is in the lowest hierarchical level in the reference and does not reference other design spaces, the work space data unit 124 does not have the single 3D parts structure data unit as in the work plane data unit 123.

Figure 26:
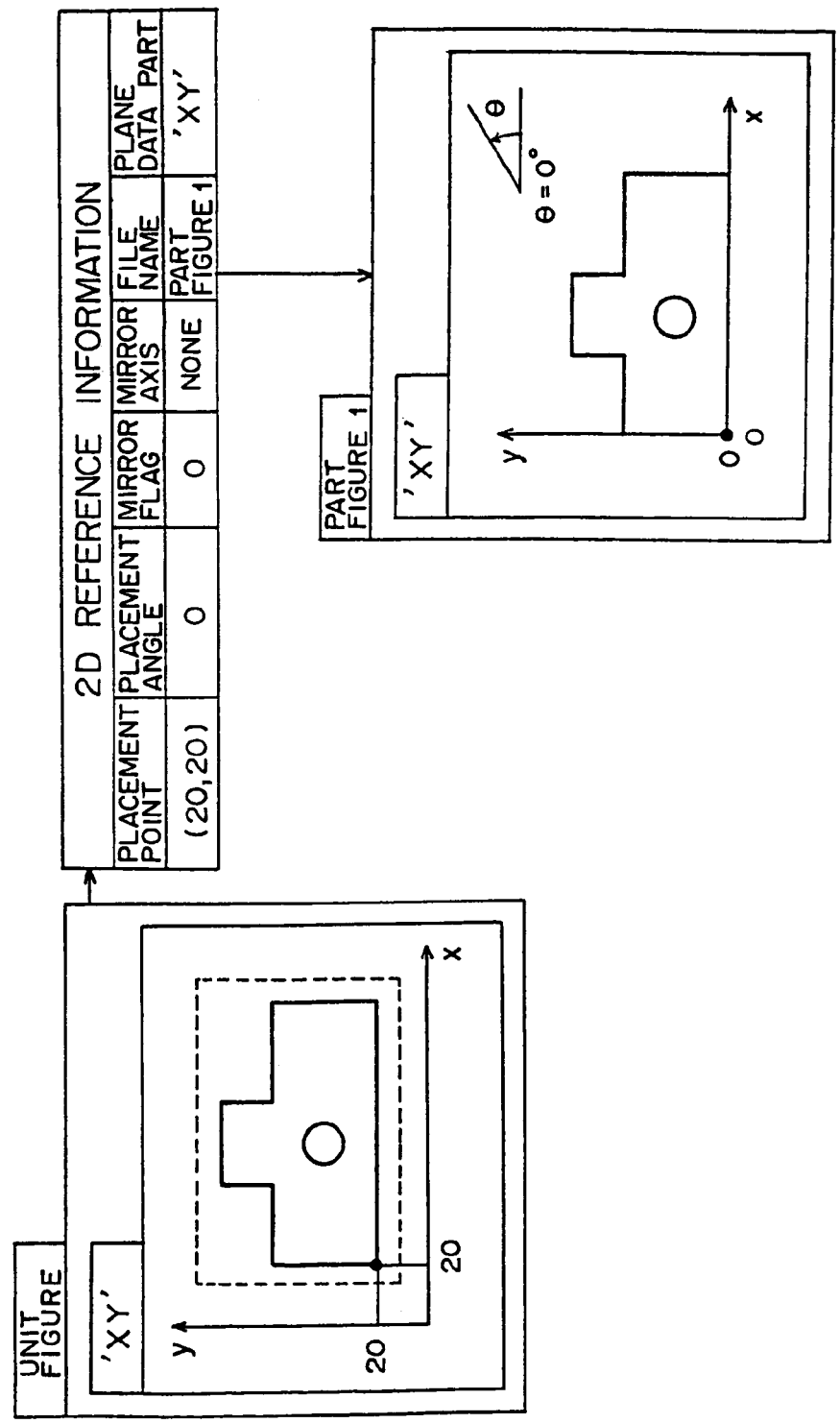
FIG. 26 shows an example of arranging a reference image on a two-dimensional design plane according to the 2D reference information of the work plane data unit.

FIG. 26 shows an example of the placement of a reference image to the two-dimensional design plane according to the 2D reference information of the work plane data unit 123.

Figure 1:
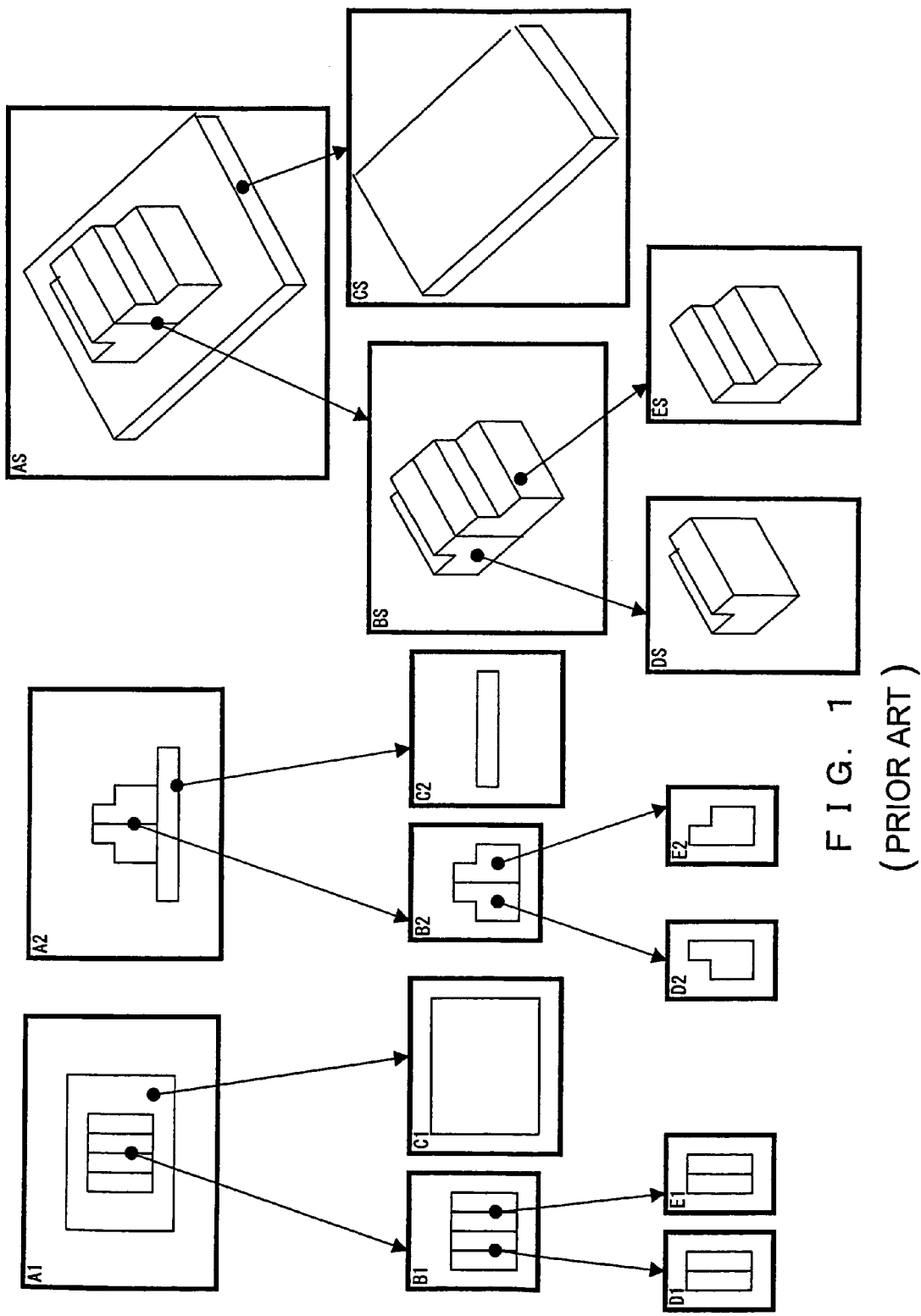
FIG. 1 shows the method of managing data using the conventional CAD system.

FIG. 26 shows an example of referencing and placing a two-dimensional design plane of 'XY' of the model of a 'FIG. 1 of a part' on the view of 'XY' of the model of a 'figure of a unit'. In this example, the x axes of the referenced-from and referenced-to two-dimensional design planes are placed to be parallel (having an angle of 0°) to each other with the reference point (0, 0) of the referenced-to two-dimensional design plane ('XY' of the model 'FIG. 1 of a part') aligned on the referenced-from placement point (20, 20) corresponding to the placement point and placement angle in the 2D reference infomation of two-dimensional design plain 'XY' of the model 'figure of a unit'. Since the mirror flag is set to 0, the two-dimensional design plane is placed without a mirror conversion.

Figure 27:
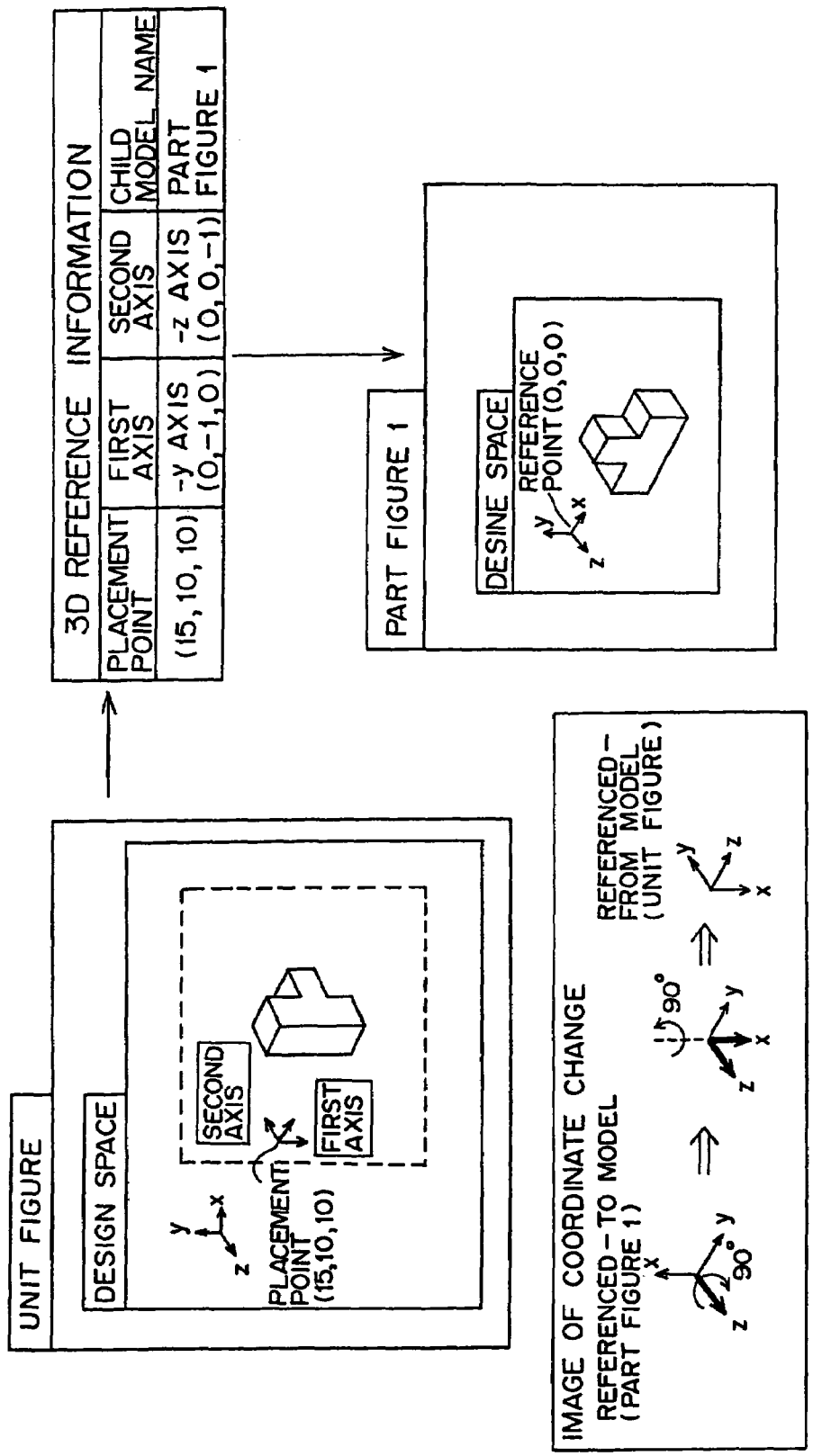
FIG. 27 shows an example of arranging a reference image on a three-dimensional design space according to the 3D reference information of the work plane data unit.

FIG. 27 shows an example of placing a reference image on a three-dimensional design space according to the 3D reference information of the work space data unit.

FIG. 27 shows an example of referencing and placing the three-dimensional design space of a model of a 'FIG. 1 of a part' on the view of the three-dimensional design space of the model of a figure of a unit. Coordinates are converted such that the referenced-to first axis (x axis) can be the referenced-from −y axis, and the referenced-to second axis (y axis) can be the referenced-from −z axis, and the reference point (0, 0, 0) of the referenced-to three-dimensional design space is aligned to the placement point (15, 10, 10) of the referenced-from three-dimensional design space aligned, corresponding to the placement point and the placement angle of the 3D reference information of the 'figure of a unit' of the model.

Described below is the coordinate correspondence table and the 2D3D placement consistency correspondence table stored in the work memory 14.

FIG. 28 shows the configuration of the coordinate correspondence table.

The coordinate correspondence table shows the spatial position of the two-dimensional design plane in the three-dimensional design space.

FIG. 29 shows the correspondence between the two-dimensional design plane and the three-dimensional design space.

Figures 29A, 29B, 29C, 29D:
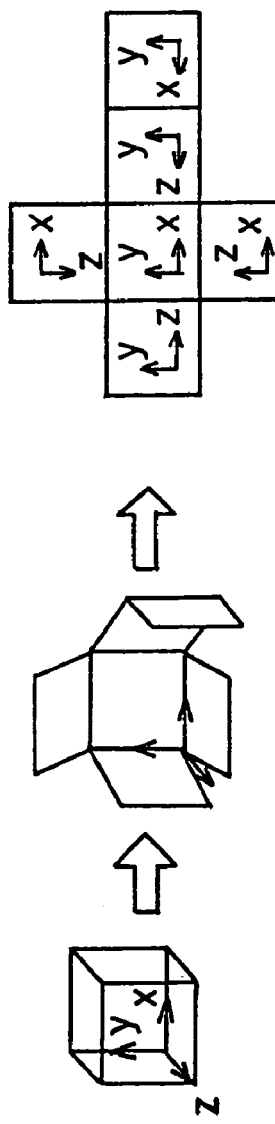
FIGS. 29A, 29B, 29C, and 29D show the correspondence between each of the two-dimensional design planes and its three-dimensional coordinate system.

According to the present embodiment, each of the two-dimensional design planes indicates any of the 6 views, but the 6 views are, as shown in FIG. 29A, based on the three sides of the x, y, and z axes in a three-dimensional space, and are defined as 6 pieces of infinite planes passing the origin. According to the present embodiment, when a three-dimensional space is developed on a two-dimensional design plane, as shown in FIG. 29A, each of the two-dimensional design planes passes the origin of the three-dimensional space, and is defined as a plane having any of the x, y, and z axes as a normal vector. The plane ID as shown in FIG. 29B and the plane name as shown in FIG. 29C, are assigned for each of these two-dimensional design planes. In addition, each of the two-dimensional design planes is defined as a coordinate system with the right direction defined as the +direction of the first axis ($\alpha$ axis) as shown in FIG. 29D, and with the up direction defined as the +direction of the second axis ($\beta$ axis).

The coordinate correspondence table shown in FIG. 28 shows the spatial position in the three-dimensional design space for each of the two-dimensional design planes shown in FIG. 29C, and comprises for each of the two-dimensional design planes the plane ID, the plane name, the appearance of the three-dimensional coordinate axis from each of the planes, the conversion equation (matrix) from each two-dimensional design plane to the three-dimensional spatial coordinates, a conversion table from the two-dimensional data to the three-dimensional data (from each of the two-dimensional design plane to the three-dimensional coordinates) corresponding to the conversion equation, and a conversion table from three-dimensional data to two-dimensional data (the three-dimensional coordinates into two-dimensional design planes).

FIG. 30 shows a design plane conversion pattern of the 2D3D placement consistency correspondence table using the plane ID. The 2D3D placement consistency correspondence table is used to check the consistency when the design plane of a referenced child model is set and placed on the design plane of a referenced-from parent model.

When a child figure is referenced and placed with three-dimensional consistency with the parent, the placement is limited to a specific method. Therefore, the consistency can be checked by checking how and what child figure is to be referenced and placed to which parent figure.

In this embodiment, each of the two-dimensional design planes is any of the six views. Therefore, in the case of consistent reference or placement, the reference between a parent figure and a child figure can be one of the 24 patterns shown in FIG. 30B.

Figure 30A:
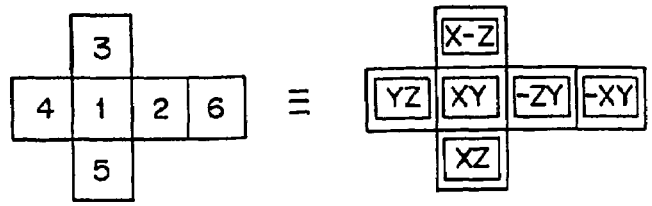
FIGS. 30A and 30B show the design plane conversion pattern of a 2D3D placement consistency correspondence table using a plane ID.
Figure 30B:
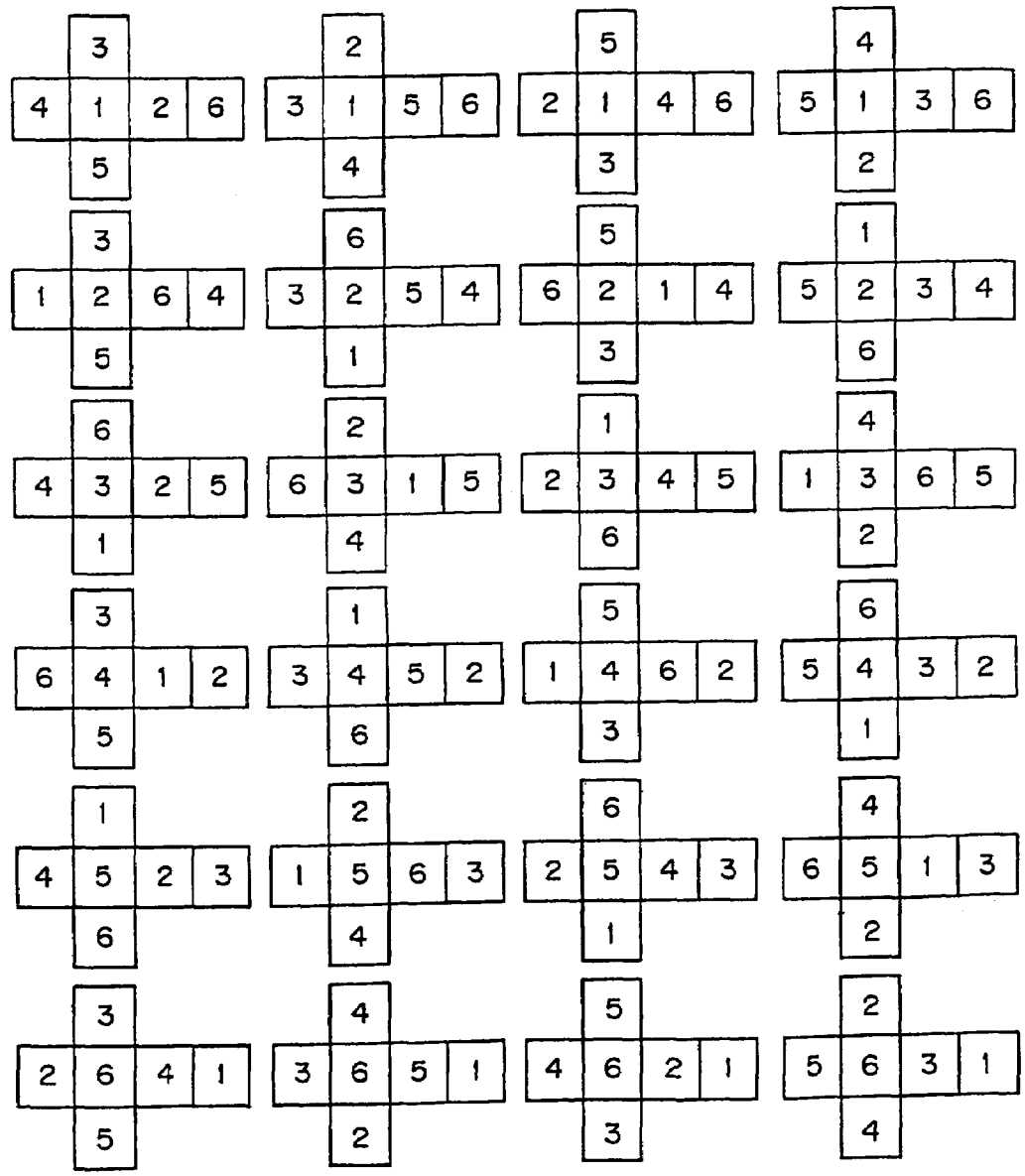

That is, if reference or placement is performed with any of the 24 patterns shown in FIG. 30B at the position of the parent figure shown in FIG. 30A, then the reference is consistent. For example, if the two-dimensional design plane of the plane ID1 of the parent figure references and places the child figure of the two-dimensional design plane of the plane ID 6, and the planes ID 2, 3, 4, 5, and 6 respectively reference and place the planes ID 3, 2, 5, 4, and 1, then it corresponds to the rightmost pattern at the bottom shown in FIG. 30B. In this case, it is determined that the reference is consistent.

Figure 31:
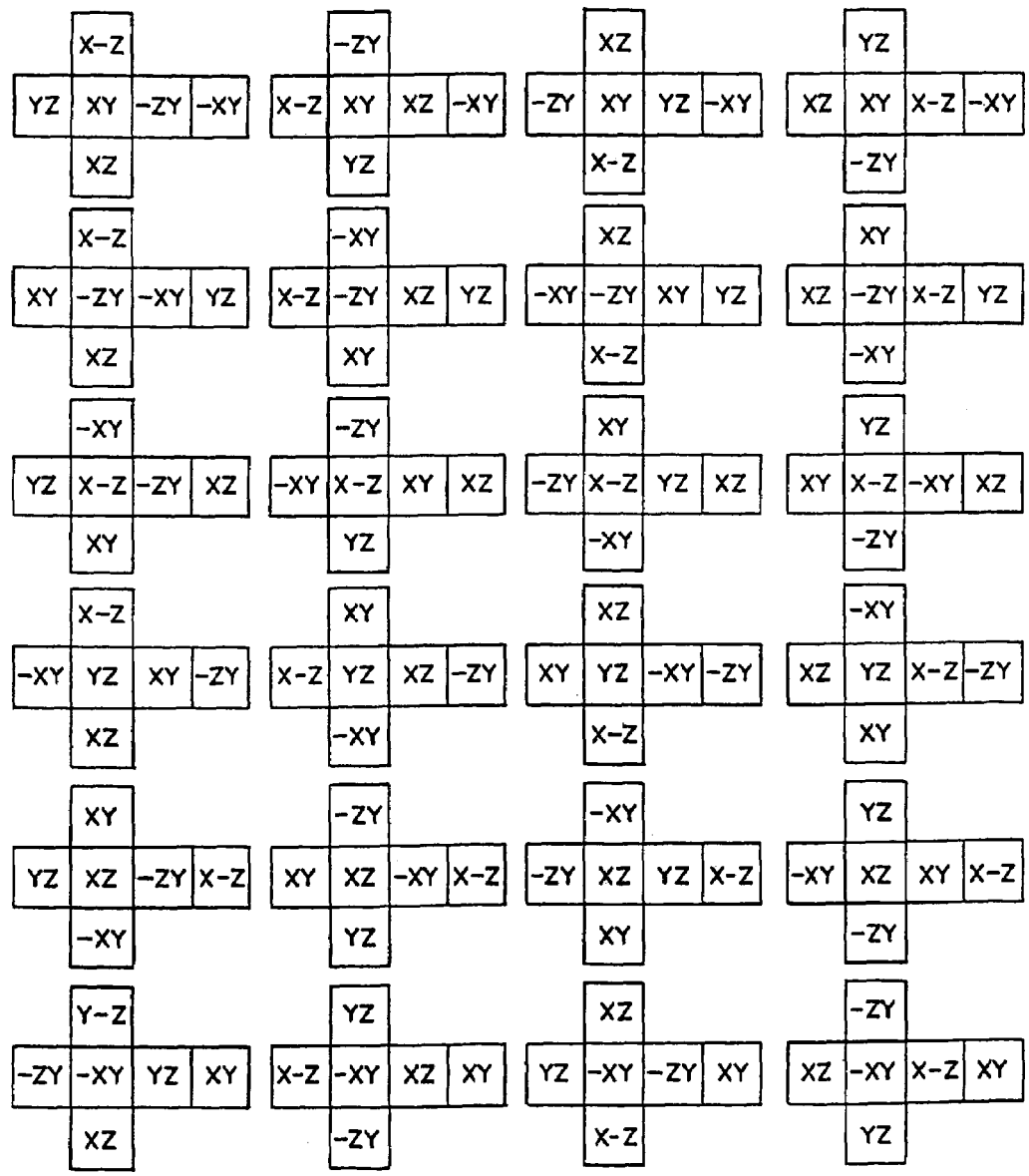
FIG. 31 shows the design plane conversion pattern of a 2D3D placement consistency correspondence table using the name of a plane.
Figure 32:
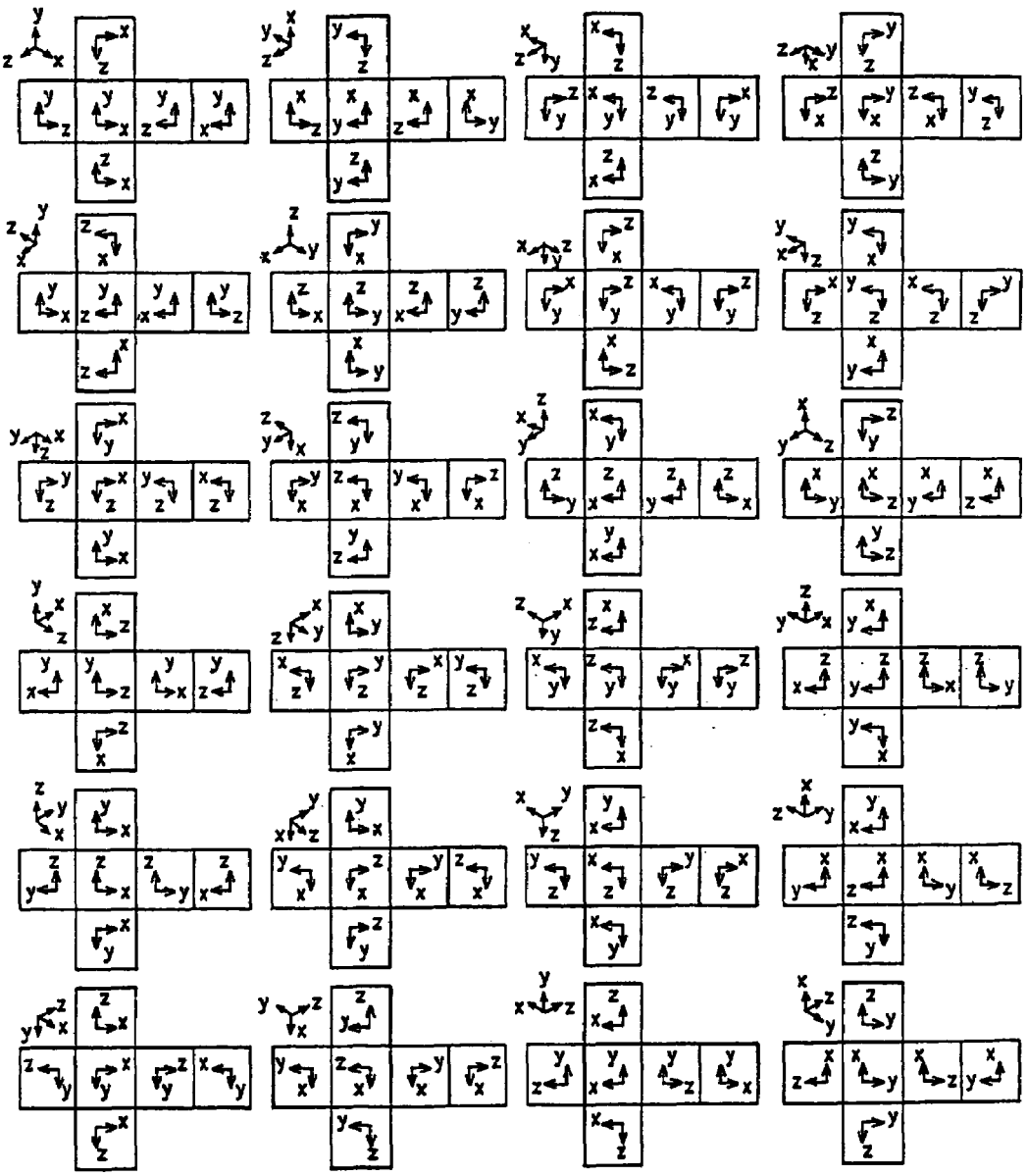
FIG. 32 shows the design plane conversion pattern of a 2D3D placement consistency correspondence table using the appearance of a three-dimensional coordinate axis.

FIG. 31 shows the placement pattern of the reference between a parent figure and a child figure shown in FIG. 30 using a plane name, not a plane ID. FIG. 32 shows the placement pattern of a reference shown in FIG. 30 from the appearance of the three-dimensional coordinate axis viewed from each plane. With the 2D3D placement consistency correspondence table configured as shown in FIGS. 31 and 32, the table can be used in checking the consistency of the reference as in the case shown in FIG. 30.

Figure 33:
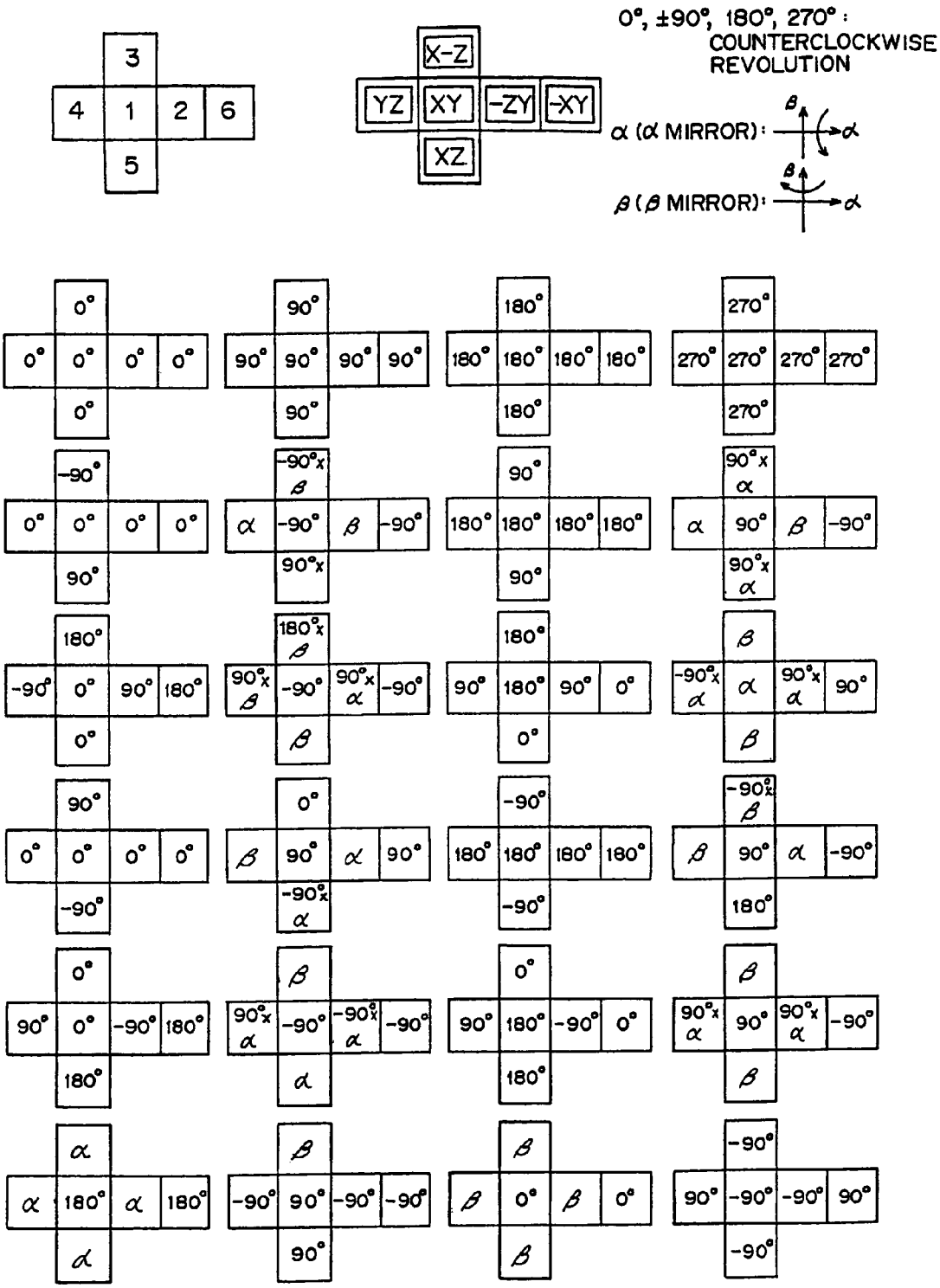
FIG. 33 shows a 2D3D placement consistency correspondence table indicates by the number of revolutions of the first axis.

FIG. 33 shows a 2D3D placement consistency correspondence table showing the placement pattern of the reference between a parent figure and a child figure by the number of revolutions of the first axis (α axis) in the placement process. Each position of the child figure shown in FIG. 33 corresponds to FIGS. 31, 32, and 33.

In FIG. 33, 0°, (±) 90°, 180°, and 270° show the counterclockwise revolution angle for the first axis when placement is performed on the parent figure. In addition, the α mirror and the β mirror indicate the mirror conversion performed on the α axis and the β axis.

A consistency check about the placement of a child figure to a parent figure is made by checking whether or not the same placement pattern exists on FIGS. 33, 31, and 32.

Figure 34:
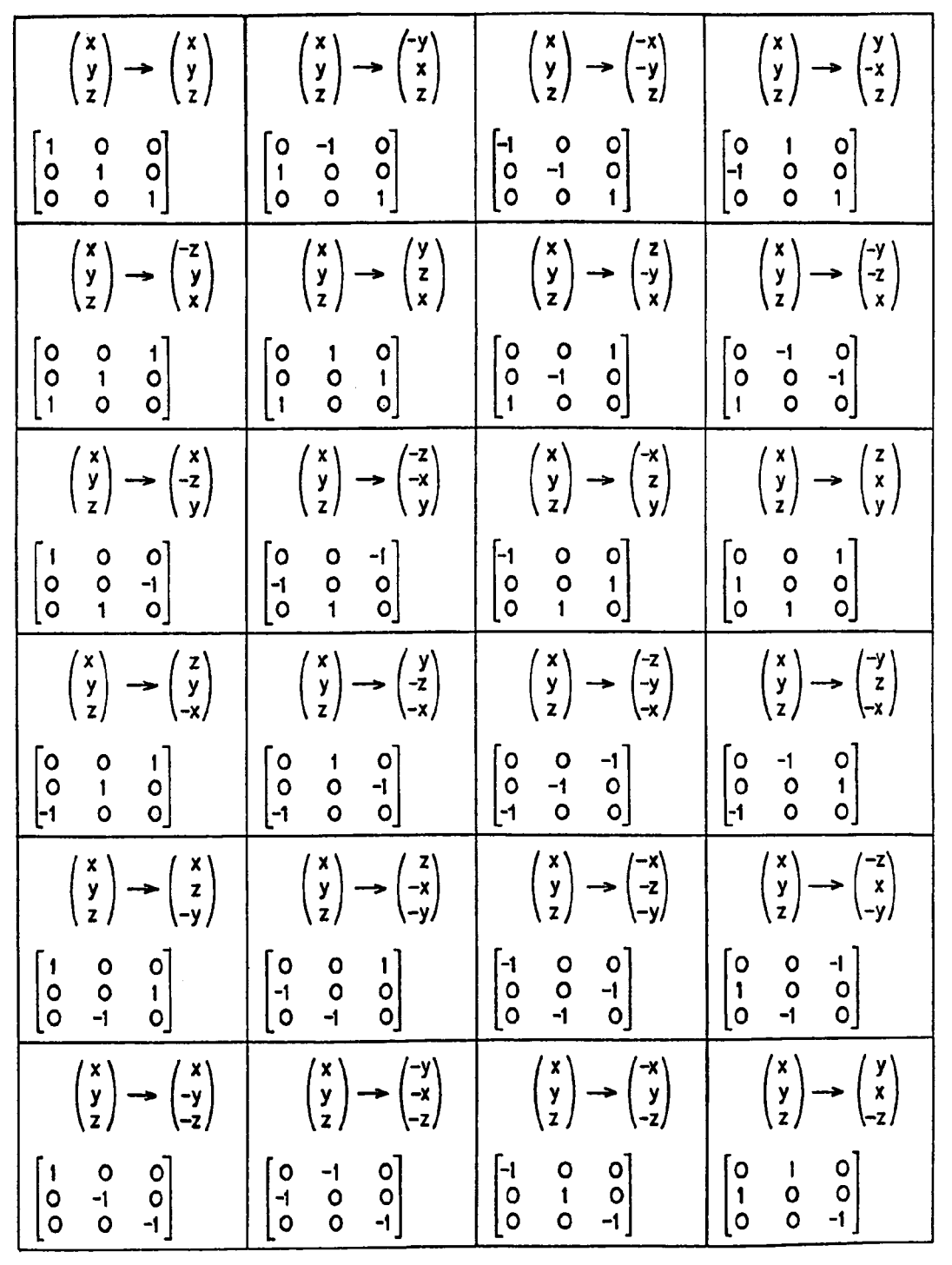

FIG. 34 shows a three-dimensional conversion matrix table corresponding to the two-dimensional design plane pattern.

The position of each box shown in FIG. 34 corresponds to the child figure of the 2D3D placement consistency correspondence table shown in FIGS. 30, 31, 32, and 33.

FIG. 34 shows matrixes corresponding to the coordinate conversion from a child model to a parent model and a correspondence matrix. For example, the upper right (x y z)->(y –x z) indicates that the coordinates of the child model (x y z) is converted into a parent model (y –x and z) in the parent model in the matrix operations using a corresponding matrix.

Each process table generated on the work memory 14 by the two-dimensional/three-dimensional data edition unit 11 when the automatic assembling process on the three-dimensional model is started is described below. The process tables are reference data which is used to manage the reference between two-dimensional design planes and a three-dimensional design space, and the inter-model reference, and corresponds to the model reference information shown in FIG. 3B.

On the table generated on the work memory 14 can be an assembly management table, a parentage process table, a terminal model table, a 2D3D placement consistency correspondence table, a prior parent holding table, and a spatial placement information temp data. Among them, the prior parent holding table and the spatial placement information temp data are temporary data temporarily generated in the process.

FIG. 35 shows an example of the configuration of the assembly management table.

An assembly management table is used when an ID (model ID) is assigned to the data of each model forming the hierarchical structure, and manages the correspondence between a model name (file name of the model) and the model ID. In the example shown in FIG. 35, the number of total models is N, and the model ID 1 through N for all models and the corresponding model names are stored.

The assembly management table is generated by the preprocess of the three-dimensional model automatic assembly process. The assembly management table is generated while the file of the model to be processed in the process model ID assigning process is read from the model graphics storage database 12, and the placement relation is sequentially retrieved from a parent model to a child model.

The parentage process table manages the information about the reference (parentage) between a model specified by a user to be processed and another model, and the order in the parentage process.

FIG. 36 shows an example of the configuration of the parentage process table.

In the parentage process table, a record is generated for each model which is a parent model to any model. A record in the table comprises a parentage process order ID, a parent model ID, a placed child model ID, the number of placed models, and a terminal process flag. The parentage process order ID is an ID assigned to a model which is a parent model of any model, and indicates the order in the parentage process in which the parentage of models is retrieved and processed. The three-dimensional model automatic assembly process is performed in the reverse order of the parentage process order ID. The parent model ID is a model ID of a parent model in the reference. The number of placed models and the placed child model ID respectively indicate the number of child models which the parent model refers to and places, and the model ID of the child model. The terminal process flag indicates a flag when the parentage process is no more required, and there are no reference in the lower levels in the structure.

The terminal model table shows the model at the lowest hierarchical level in the reference, and the model ID of the terminal model having no child model is set.

FIG. 37 shows an example of the configuration of the terminal model table. In FIG. 37, the number of terminal models and the model IDs are stored together with the serial number of the IDs of the terminal models. By checking the terminal model table, the two-dimensional/three-dimensional data edition unit 11 can recognize that there is no reference at a level lower than the model stored in this table.

The 2D3D parts structure correspondence table is generated for the parentage managed on the parentage process table, and manages the information as to which two-dimensional design plane of a child model is referenced and placed on which two-dimensional design plane of its parent model, how many models are placed, etc., for each parentage. In the parentage, reference and placement is performed among three-dimensional design spaces, and it is managed whether or not a three-dimensional reference is set.

FIG. 38 shows an example of the configuration of the 2D3D parts structure correspondence table.

The 2D3D parts structure correspondence table comprises a parentage process ID, a child model ID, a view interlocking 2D parts structure data unit, and a 3D space placement flag. The parentage process ID corresponds to the parent model ID of the parentage process table. The child model ID is any of the placed child ID stored in the record of the parent model ID corresponding to the parentage ID in the parentage process table. The view interlocking 2D parts structure data unit stores data used to recognize two-dimensional data as one part over two-dimensional design planes, and stores the number of placed planes, the parent figure placement plane IDs of the number of placed planes, and the child figure placement plane ID. The 3D space placement flag indicates whether or not a 3D reference is set for the parentage managed by the 2D3D parts structure correspondence table. If 0 is set, the flag indicates that the three-dimensional design space of a child model is not referenced or placed for the parent model, and a three-dimensional reference is not set. If 1 is set, the flag indicates that the three-dimensional design space is referenced and placed for the parent model, and a three-dimensional reference is set between the child model and the parent model.

FIG. 39 shows a prior parent holding table. The prior parent holding table is a temporary table for a parentage process performed over all hierarchical levels, and stores a parent model ID (parentage process ID), the number of child models, a serial number (ID), a child model ID, and a check flag.

FIG. 40 shows the spatial placement information temp data.

The spatial placement information temp data stores 3D data and its three-dimensional placement position coordinate information, etc.

FIG. 41 shows a parallel plane management table.

The parallel plane management table stores a set of plane IDs of the planes placed in parallel in a three-dimensional space.

Figure 42:
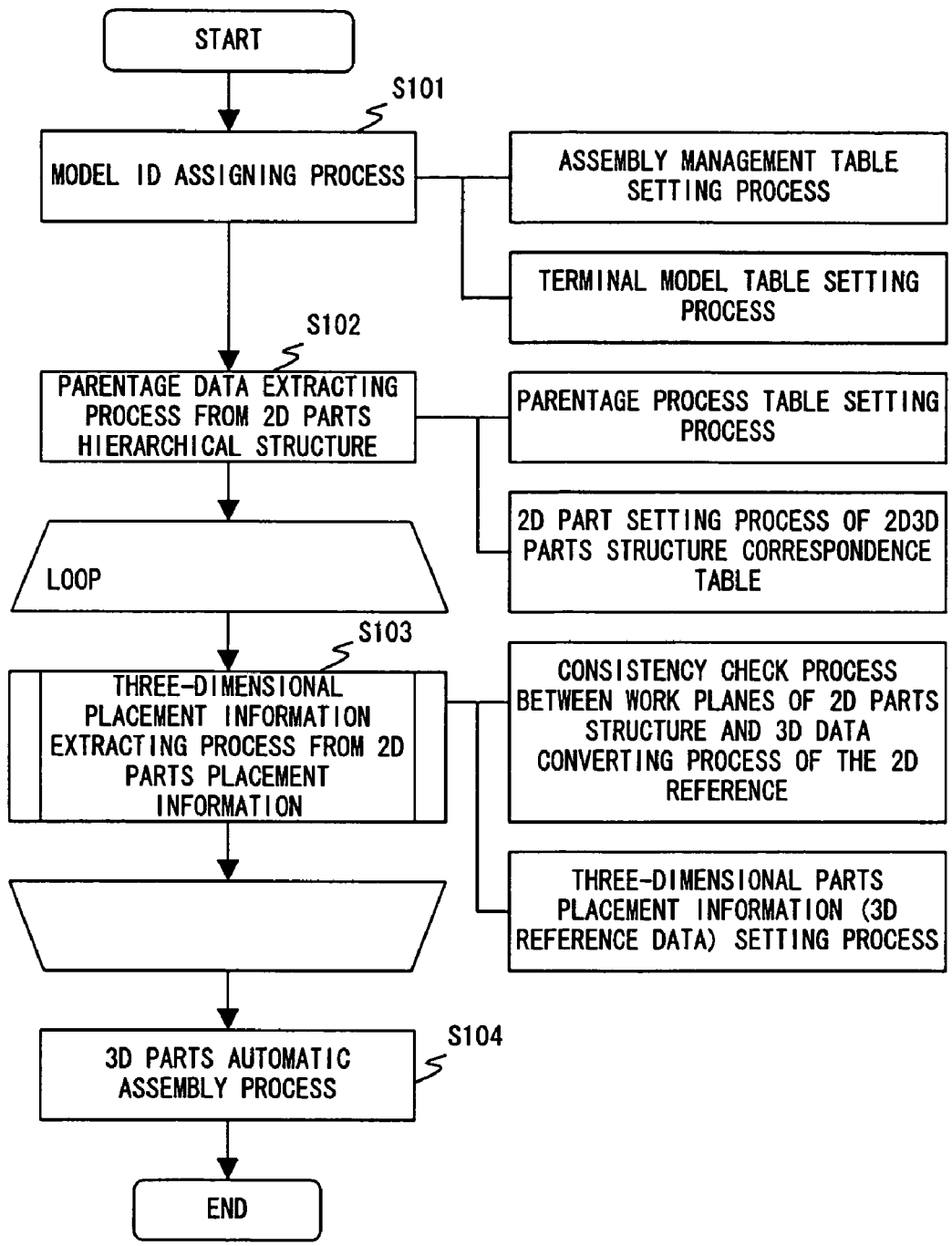
FIG. 42 is a flowchart of the flow of a three-dimensional automatic assembly process using a table and data.

FIG. 42 is a flowchart of the entire flow of the three-dimensional automatic assembly process using each table and data processed by the two-dimensional/three-dimensional CAD data process unit 11.

In FIG. 42, a model ID assigning process is performed in step S101. The model ID assigning process comprises an assembly management table setting process for setting an assembly management table shown in FIG. 35 and a terminal model table setting process for setting a terminal model table shown in FIG. 37. In this model ID assigning process, the model graphics storage database 12 is sequentially searched from the parent model, and an ID is assigned to each model.

In step S102, a parentage data extracting process is performed from the 2D parts hierarchical structure. The parentage data extracting process from the 2D parts hierarchical structure comprises a parentage process table setting process for performing a parentage process table setting process shown in FIG. 36 and a 2D3D parts structure correspondence table setting process for setting the 2D3D parts structure correspondence table shown in FIG. 38. The parentage process setting table setting process extracts the parentage by retrieving the single 2D parts data unit of all plane data units of each model sequentially from the model at highest hierarchical level, and sets it in the parentage process table. A terminal process flag is set by matching the placed child model ID with the terminal model table, and setting a terminal process flag when all placed child model IDs exist in the terminal model table. The 2D3D parts structure correspondence table setting process is a process that sets a 2D portion which is the data for recognition of a part over views on the 2D3D parts structure correspondence table. This process is performed by retrieving the parentage and setting a view interlocking 2D parts structure data unit on the 2D3D parts structure correspondence table between all parentage.

In step S103, the three-dimensional placement information extracting process from the 2D parts placement information is performed on all parentage set on the parentage process table and the 2D3D parts structure correspondence table in the reverse order of the order ID of the parentage process table. The three-dimensional placement information extracting process comprises a consistency check process between work planes of the 2D parts structure, a three-dimensional data converting process of the two-dimensional reference, and a three-dimensional parts placement information (three-dimensional reference data) setting process.

In the same model, there is correspondence between a two-dimensional design plane which is a two-dimensional plane and a three-dimensional design space which is a three-dimensional space according to the coordinate correspondence table. Since the placement information in the two-dimensional plain (two-dimensional reference) is the placement information in a parent model, the two-dimensional reference is converted into three-dimensional information as the spatial placement information (three-dimensional reference) of a parent model in the three-dimensional data. Therefore, the three-dimensional placement information extracting process is performed by the consistency check process between work planes of the 2D parts structure, the three-dimensional data converting process of two-dimensional reference, and the three-dimensional parts placement information (three-dimensional reference data) setting process.

Finally, in step S104, using the 3D reference data obtained in the three-dimensional placement information extracting process from the 2D parts placement information in step S103, the 3D parts automatic assembly process for displaying or copying the three-dimensional model of a child model to a parent model in the reverse order of the order ID of the parentage process table is performed.

Figure 43:
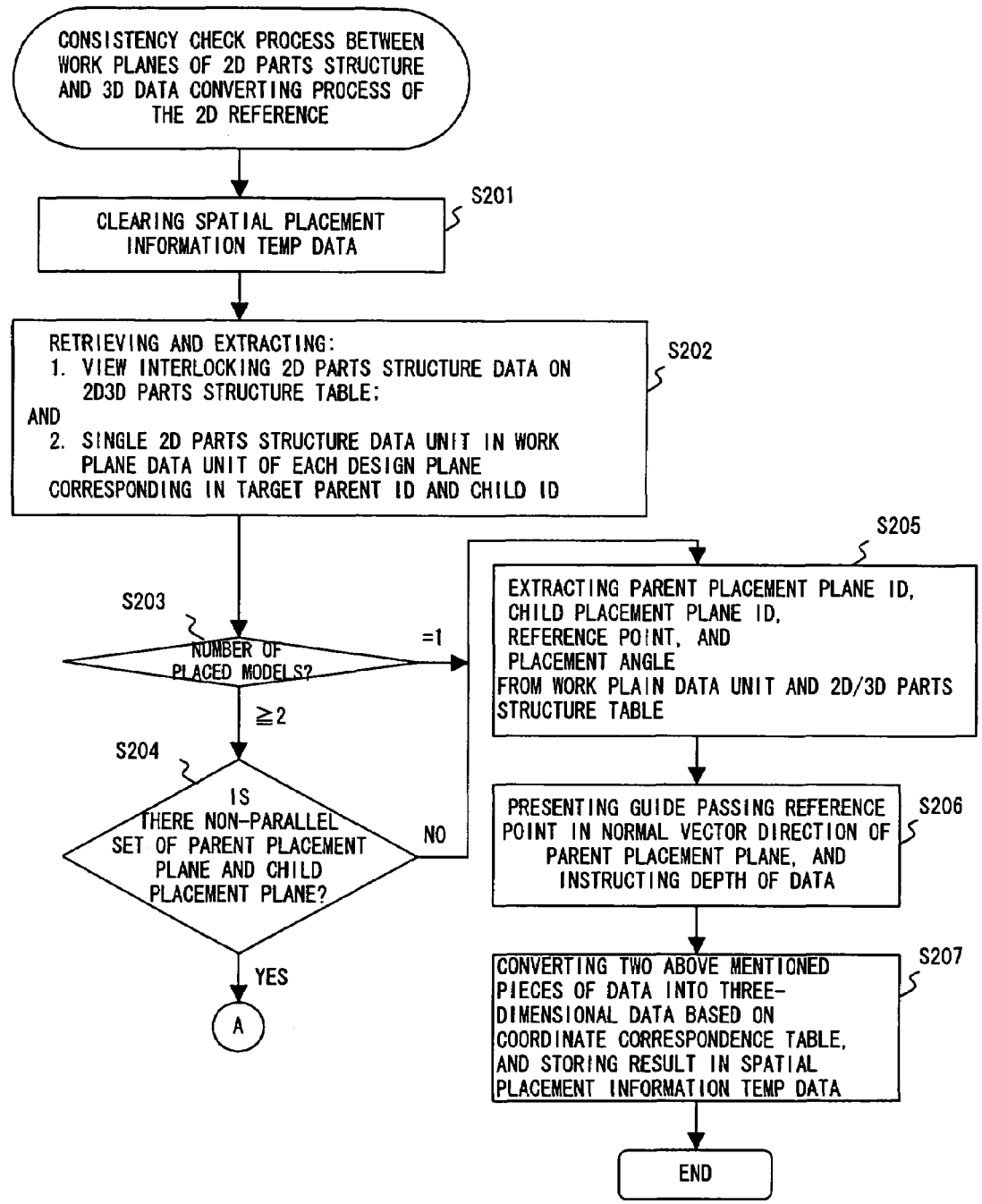
FIG. 43 is a flowchart (1) of the controllability check process between 2D parts structure work planes and the three-dimensional data canverting process of a two-dimensional reference.
Figure 44:
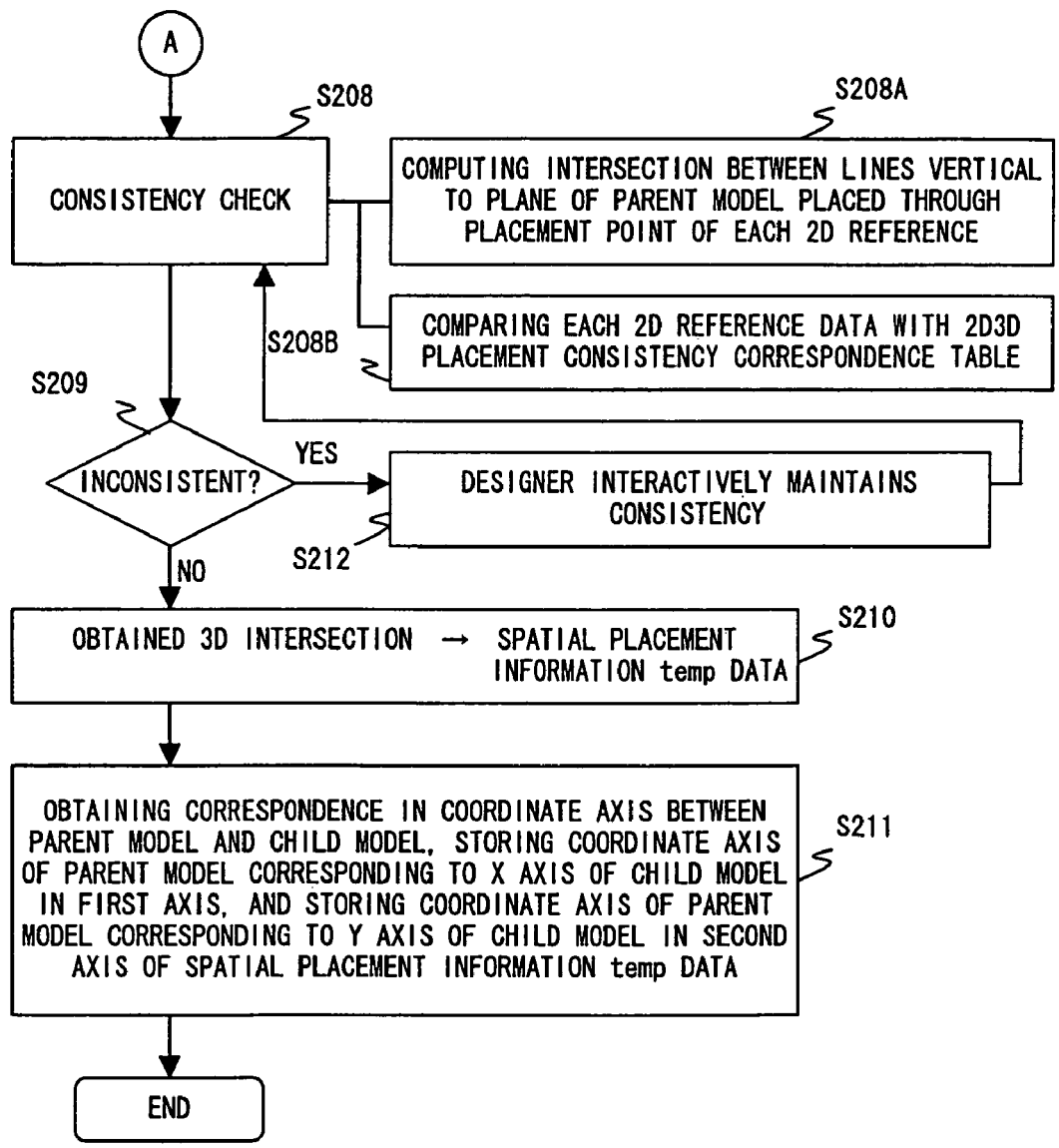
FIG. 44 is a flowchart (2) of the controllability check process between 2D parts structure work planes and the three-dimensional data converting process of a two-dimensional reference.

FIGS. 43 and 44 are flowcharts of the detailed process flow of the consistency check process between the 2D parts structure work planes and the converting process form the two-dimensional reference to the three-dimensional data process in step S103 shown in FIG. 42.

The consistency check process between the 2D parts structure work planes and the converting process form the two-dimensional reference to the three-dimensional data are performed by checking the consistency of the design plane of the child model placed on the design plane of the parent model for the parentage set on the parentage process table and the 2D3D parts structure correspondence table, and, if there is no inconsistency, storing the coordinate axis, etc. of the parent model corresponding to the y axis of the child model in the work memory 11 as the spatial placement information temp data with the coordinate axis of the parent model corresponding to the x axis of the child model as the first axis.

When the process starts, the spatial placement information temp data is cleared (step S201).

Then, in the current target parentage (parent ID, child ID), the view interlocking 2D parts structure data of the corresponding 2D3D parts structure table corresponding to the current target parentage and the single 2D parts structure data unit of the work plane data unit 123 of each design plane are searched to extract necessary information (step S202). When the number of placed models referenced or placed on the design plane of the parent model is 1 (=1 in step S203), the parent placement plane ID, the child placement plane ID, the reference point, and the placement angle are extracted from the work plane data unit 123 and the 2D3D parts structure table (step S205). Then, the guide passing through the reference point in the direction of the normal vector of the parent placement plane is presented, and the user specifies the depth (step S206).

The data obtained in steps S205 and S206 is converted into three-dimensional data based on the coordinate correspondence table, stored in the spatial placement information temp data (step S207), thereby terminating the three-dimensional data converting process.

In step S203, if the number of new placed parent models on the design plane is two or larger ($\geq 2$ in step S203), it is checked whether or not there are non-parallel parent placement planes and child placement planes (step S204). The check is made by matching the parallel plane management table shown in FIG. 41 with the plane ID of a parent placement plane and a child placement plane to check whether or not there is a combination not entered in the parallel plane management table. If there is no non-parallel planes (NO in step S204), then control is passed to the process in step S205. If there is non-parallel planes (YES in step S204), control is passed to the process in step S208.

In step S208, the consistency is checked using the view interlocking 2D parts structure data and the two-dimensional reference data. The consistency check is made by computing the intersection between the lines vertical to the plane of the parent model placed through the placement point of each of the two-dimensional references (step S208A), and comparing the two-dimensional reference data with the 2D3D placement consistency correspondence table (step S208B).

Next, it is determined whether or not there is inconsistency (step S209). If yes, that is, if no intersection can be obtained on the three-dimensional space, or there is parentage not entered on the 2D3D placement consistency correspondence table (YES in step S209), the designer interactively maintains the consistency, and a consistency check is made again in step S208.

If it is determined in step S209 that there is no inconsistency (NO in step S209), then the obtained three-dimensional intersection is stored in the 3D placement position of the spatial placement information temp data (step S210).

Then, the 2D reference data whose parent placement plane has the smallest ID value is extracted, the 2D3D placement consistency data is checked as to which x, y, and z axes of the parent model match the x, y, and z axes of the child model, the first axis of the spatial placement information temp data stores the coordinate axis of the parent model corresponding to the x axis of the child model, and the second axis stores the coordinate axis of the parent model corresponding to the y axis of the child model (step S211), thereby terminating the process.

FIG. 45 is a flowchart of the details of the three-dimensional parts placement information (three-dimensional data) setting process in step S102 shown in FIG. 42.

When the process shown in FIG. 45 starts, the spatial placement information temp data obtained in the consistency check process (step S208) between the 2D parts structure work planes and the three-dimensional data converting process (step S207) of the two-dimensional reference, shown in FIGS. 42 and 43, are stored as the 3D reference information in the single 3D parts data unit in the work space data unit 124 of the corresponding parent model (step S301).

Then, a corresponding 3D space placement flag of the 2D3D parts structure correspondence table is set (step S302), thereby terminating the process.

FIG. 46 shows an interlocking operation in 6 views.

FIG. 46 shows the interlocking operations of a child figure moving on a two-dimensional design plane and interlocking on another two-dimensional design plane.

Figures 46A, 46B:
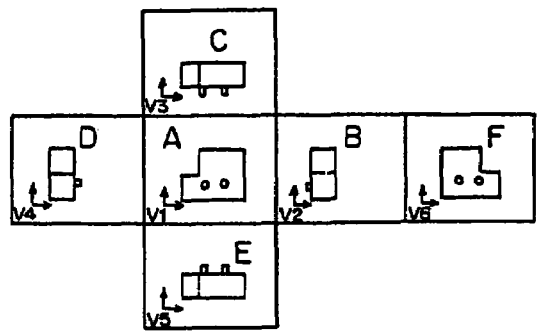
FIGS. 46A and 46B show interlocking operations using 6 views.

Two-dimensional design planes V1 through V6 are set in each of the six child figures shown in FIG. 46A. A through F indicate the vertical axes of each of the two-dimensional design planes V1 through V6.

As shown in FIG. 46A, in each child figure in which the two-dimensional design planes V1 through V6 and their vertical axes A through F are set, if the vertical axes A through F in each of the child figures are moved in the arrow direction as shown at the leftmost column shown in FIG. 46B, another child figure interlocks the movement and moves in the arrow direction as indicated at the columns of V1 through V6.

Figure 47:
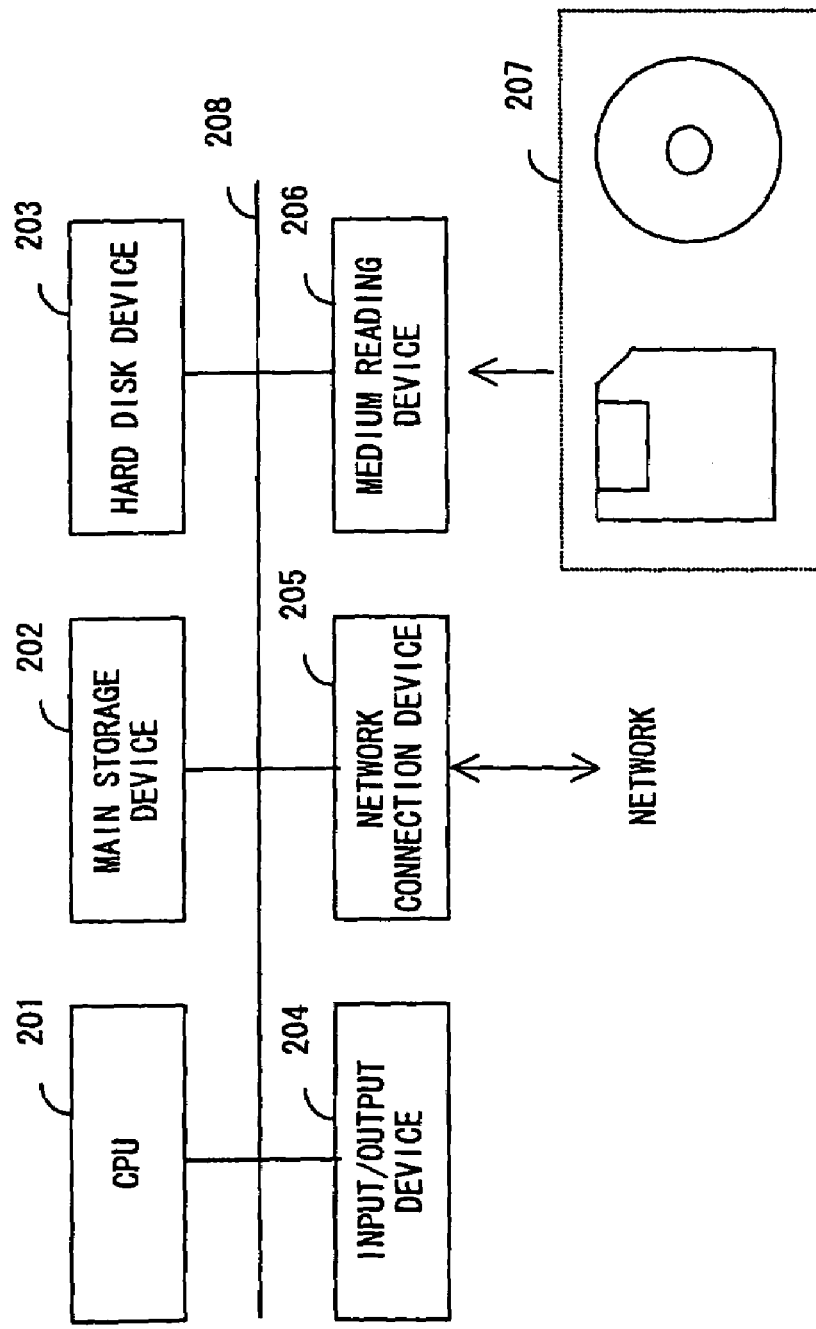
FIG. 47 shows the environment of the information process system according to the present system.

FIG. 47 shows the environment of each of the information processing systems of the CAD system, the cooperative system, etc. according to the above mentioned embodiments.

As shown in FIG. 47, the information processing system comprises a CPU 201, a main storage device 202, a hard disk device 203, an input/output device 204 provided with a display, a keyboard, a mouse, etc., a network connection device 205 such as a modem, a LAN adapter, etc., a portable storage medium 207 such as a CD, a DVD, an optical disk, a floppy disk, etc., and a medium reading device 206 for reading the stored contents. A bus 208 interconnects these units.

In the information processing system shown in FIG. 47, the medium reading device 206 reads the program and data stored in the portable storage medium 207. The read program and data are loaded onto or stored in the main storage device 202 or the hard disk device 203. Each of the processes according to the present embodiments can be realized as the operation of software by the CPU 201 loading onto the main storage device 202 and executing the program and data.

In the information processing system, application software can be switched using the portable storage medium 207. Therefore, when the present invention is used in a computer, not limited to a CAD system or a CAD cooperative system, it can be realized as a computer-readable storage medium used to direct the computer to perform the functions according to the above mentioned embodiments of the present invention.

Figure 48:
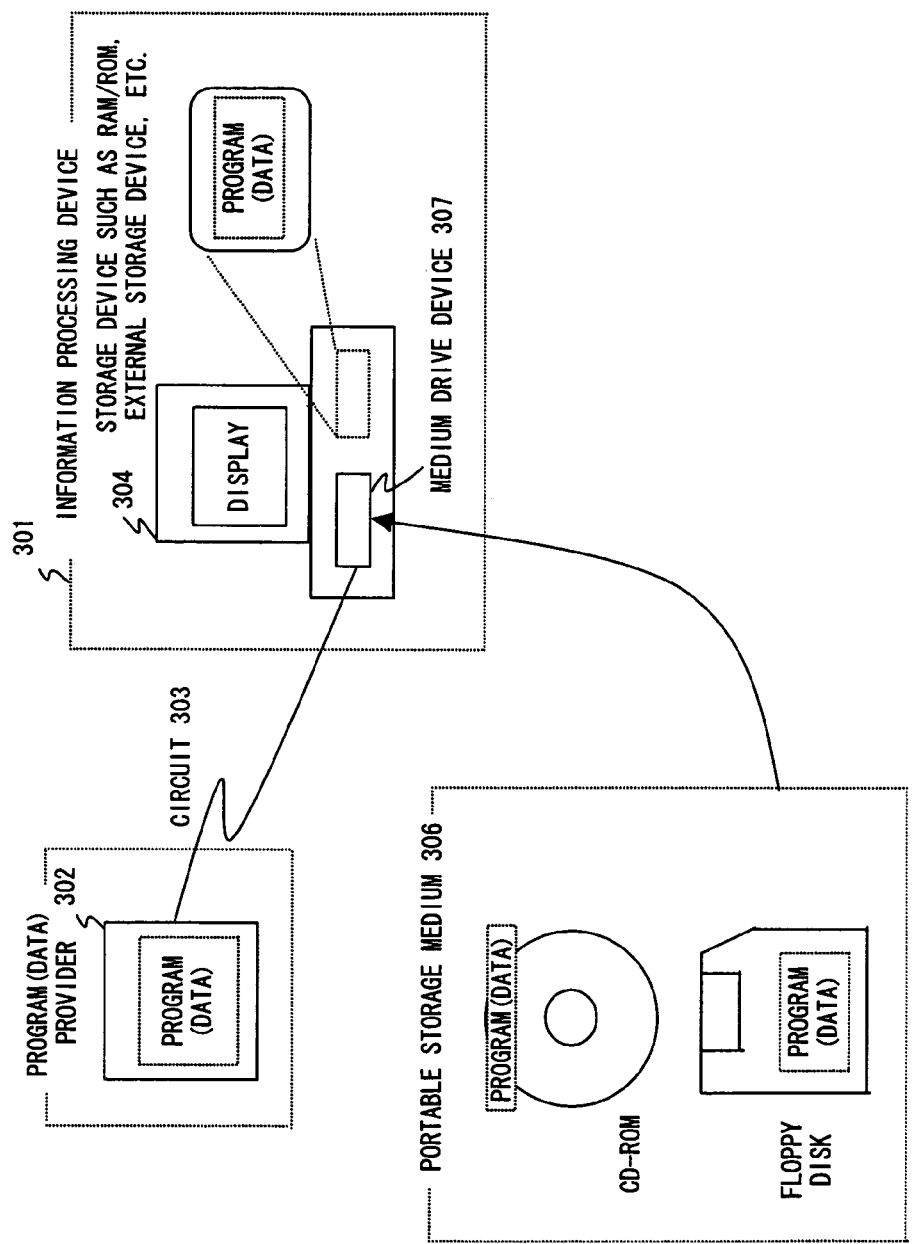
FIG. 48 shows an example of a storage medium.

In this case, the storage medium can be, as shown in FIG. 48, CD-ROM, a portable storage medium 306 removable from a medium drive device 307 such as a floppy disk (or a MO, a DVD, a removable magnetic disk, etc.), etc., a storage device (database, etc.) 302 in the information processing device (server, etc.) held by an external information provider transmitted through a network circuit 303, memory (RAM or external storage device) 305 in a body 304 or an information processing device 301, etc. A program stored in the portable storage medium 306 and the storage device (database, etc.) 302 is loaded onto the memory (RAM or an external storage device, etc.) 305 in the body 304, and is executed to realize each function of the above mentioned embodiments of the present invention.

As described above in detail, according to the present invention, a three-dimensional model can be automatically assembled according to the information for management of the hierarchical structure in a two-dimensional design plane/three-dimensional design space.

An editing operation can be performed by moving, copying, deleting, etc. parts over plural views as interlocking operations between two-dimensional design planes or between a two-dimensional design plane and a three-dimensional design space. Furthermore, the correspondence can be managed in parts structure units between two-dimensional design plane data and three-dimensional design space data.

In addition, when there are parts and units represented as scattered on a plurality of design planes and design spaces, a user can be notified of the influence of a change in a placement position of a part, etc. on one work plane on other related two-dimensional design planed and three-dimensional design spaces.

Furthermore, an editing process can be interactively performed which checking the consistency. In addition, the operation performed on a graphic element represented on a design plane/design space can be automatically reflected on another design plane/design space. The three-dimensional consistency such as the parts position can be checked on a two-dimensional design plane.

Furthermore, an editing operation of an optional model at any hierarchical level, optional reference information (placement information, etc.), and a shape on any work plane or space can be performed without switching a model, a work plane, or a work space to be processed.

What is claimed is:

1. A CAD system which processes a two-dimensional design plane/three-dimensional design space configured by referring to another two-dimensional design plane/three-dimensional design space, comprising:
   an intra-model correspondence management unit managing correspondence between a two-dimensional design plane and a three-dimensional design space across a first plurality of views for a target; and
   an inter-model reference management unit managing a reference between models configured by at least one of a two-dimensional design plane and a three-dimensional design space across a second plurality of views for the target.

2. The CAD system according to claim 1, wherein said correspondence is a spatial attribute of each two-dimensional design plane in a model.

3. The CAD system according to claim 1, further comprising:
   an automatic assembly unit generating three-dimensional reference between a three-dimensional design space of a first model and a three-dimensional design space of a second model according to two-dimensional reference of a plurality of two-dimensional design planes belonging to the first model to a two-dimensional design plane belonging to the second model, correspondence in the first model, and correspondence in the second model.

4. The CAD system according to claim 3, wherein said automatic assembly unit automatically assembles a three-dimensional design space belonging to the first model using two-dimensional reference of a plurality of two-dimensional design planes belonging to the first model, and the correspondence in the first model.

5. The CAD system according to claim 4, wherein said automatic assembly unit, sequentially from a model in a lowest hierarchical level in reference, determines a placement vector in a referenced-from three-dimensional design space from correspondence in a referenced-from model determines a reference vector in a three-dimensional design space of the referenced-to model from correspondence in a referenced-to model, generates a conversion matrix of the placement vector and the reference vector, and assembles a three-dimensional design space of the referenced-from model based on the conversion matrix.

6. The CAD system according to claim 1, wherein when one of the two-dimensional reference and the three-dimensional reference is performed between the models, said inter-model reference management unit performs other two-dimensional reference and three-dimensional reference between the models corresponding to a prior referencing operation.

7. The CAD system according to claim 6, wherein said inter-model reference management unit automatically performs the other two-dimensional reference and three-dimensional reference between the models corresponding to the prior referencing operation.

8. The CAD system according to claim 6, wherein said inter-model reference management unit performs the other two-dimensional reference and three-dimensional reference between the models interactively with a designer corresponding to the prior referencing operation.

9. The CAD system according to claim 6, wherein said inter-model reference management unit notifies a designer of consistency corresponding to the prior referencing operation.

10. The CAD system according to claim 1, further comprising
    a new reference setting unit setting consistent reference, when new reference is set between a first design plane/space which is one of a two-dimensional design plane or a three-dimensional design space belonging to a third model and a second design plane/space which is one of a two-dimensional design plane or a three-dimensional design space belonging to a fourth model, between a two-dimensional design plane and a three-dimensional design space other than the first design plane/space belonging to the third model and a two-dimensional design plane and a three-dimensional design space other than the second design plane/space belonging to the fourth model based on the new reference, the correspondence in the third model, and the correspondence in the fourth model.

11. The CAD system according to claim 1, wherein a plurality of two-dimensional design planes/three-dimensional design spaces belonging to the model are specified to be edited based on the correspondence in the model.

12. The CAD system according to claim 1, wherein when an element specified in a two-dimensional design plane or a three-dimensional design space belonging to a fifth model is moved to a newly generated sixth model, said inter-model reference management unit sets inter-model reference between the fifth model and the sixth model.

13. The CAD system according to claim 12, wherein when said sixth model is generated, said intra-model correspondence management unit sets intra-model correspondence of the sixth model.

14. The system according to claim 12, wherein when said sixth model is generated, a designer is instructed to maintain spatial consistency of each of the two-dimensional design planes and the three-dimensional design spaces belonging to the sixth model.

15. A cooperative system which maintains cooperation of graphics data between a two-dimensional CAD and a three-dimensional CAD, comprising:
    an intra-model correspondence management unit managing correspondence between a two-dimensional design plane by a two-dimensional CAD and a three-dimensional design space by a three-dimensional CAD across a first plurality of views for a target; and
    an inter-model reference management unit managing a reference between models configured by at least one of a two-dimensional design plane and a three-dimensional design space across a second plurality of views for the target.

16. The cooperative system according to claim 15, further comprising
    a three-dimensional reference generation unit generating three-dimensional reference between a three-dimensional design space of the first model and a three-dimensional design space of the second model according to two-dimensional reference of a plurality of two-dimensional design planes belonging to a first model to a two-dimensional design plane belonging to a second model, correspondence in the first model, and correspondence in the second model.

17. The cooperative system according to claim 16, wherein said automatic assembly unit automatically assembles a three-dimensional design space belonging to the same model using two-dimensional reference of a plurality of two-dimensional design planes belonging to the same model, and the correspondence in the model.

18. A CAD system which processes a two-dimensional design plane/three-dimensional design space configured by referring to another two-dimensional design plane/three-dimensional design space, comprising:
   intra-model correspondence management means for managing correspondence between a two-dimensional design plane and a three-dimensional design space across a first plurality of views for target; and
   inter-model reference management means for managing a reference between models configured by at least one of a two-dimensional design plane and a three-dimensional design space across a second plurality of views for the target.

19. A cooperative system which maintains cooperation of graphics data between a two-dimensional CAD and a three-dimensional CAD, comprising:
   intra-model correspondence management means for managing correspondence between a two-dimensional design plane by a two-dimensional CAD and a three-dimensional design space by a three-dimensional CAD across a first plurality of views for a target; and
   inter-model reference management means for managing a reference between models configured by at least one of a two-dimensional design plane and a three-dimensional design space across a second plurality of views for the target.

20. A method of managing CAD data for processing a two-dimensional design plane/three-dimensional design space configured by referring to another two-dimensional design plane/three-dimensional design space comprising:
   managing correspondence between a two-dimensional design plane and a three-dimensional design space across a first plurality of views for a target; and
   managing a reference between models configured by a two-dimensional design plane and a three-dimensional design space across a second plurality of views for the target.

21. The method according to claim 20, wherein said correspondence is a spatial attribute of each two-dimensional design plane in a model.

22. The method according to claim 20, wherein three-dimensional reference is set between a three-dimensional design space of a first model and a three-dimensional design space of a second model according to two-dimensional reference of a plurality of two-dimensional design planes belonging to the first model to a two-dimensional design plane belonging to the second model, correspondence in the first model, and correspondence in the second model.

23. A computer-readable storage medium storing a program used to direct a computer to perform processing of a two-dimensional design plane/three-dimensional design space configured by referring to another two-dimensional design plane/three-dimensional design space:
   managing correspondence between a two-dimensional design plane and a three-dimensional design space across a first Plurality of views for a target; and
   managing a reference between models configured by a two-dimensional design plane and a three-dimensional design space across a second plurality of views for the target.

24. The medium storing a program used to direct a computer to perform according to claim 23:
   setting three-dimensional reference between a three-dimensional design space of a first model and a three-dimensional design space of a second model according to two-dimensional reference of a plurality of two-dimensional design planes belonging to the first model to a two-dimensional design plane belonging to the second model, correspondence in the first model, and correspondence in the second model; and
   automatically assembling a three-dimensional design space belonging to the first model using the three-dimensional reference.

25. A method of managing CAD data, comprising:
   generating a three-dimensional reference and a three-dimensional model in a three-dimensional plane from a two-dimensional reference and spatial attribute information in a two-dimensional plane for a target object;
   setting a reference between the two-dimensional reference and the three-dimensional reference of the target object and collectively displaying the set reference; and
   sequentially referencing the two-dimensional reference and the spatial attribute information to generate the three-dimensional model in the three-dimensional plane.

* * * * *

UNITED STATES PATENT AND TRADEMARK OFFICE
CERTIFICATE OF CORRECTION

PATENT NO. : 6,944,513 B1
DATED : September 13, 2005
INVENTOR(S) : Tomomitsu et al.

It is certified that error appears in the above-identified patent and that said Letters Patent is hereby corrected as shown below:

Column 29,
Line 16, after "views for" insert -- a --.

Column 30,
Line 16, "Plurality" should be -- plurality --.

Signed and Sealed this

Second Day of May, 2006

JON W. DUDAS
*Director of the United States Patent and Trademark Office*